US006582578B1

(12) United States Patent
Dordi et al.

(10) Patent No.: US 6,582,578 B1
(45) Date of Patent: Jun. 24, 2003

(54) METHOD AND ASSOCIATED APPARATUS FOR TILTING A SUBSTRATE UPON ENTRY FOR METAL DEPOSITION

(75) Inventors: Yezdi N. Dordi, Palo Alto, CA (US); Joseph J. Stevens, San Jose, CA (US); Michael N. Sugarman, San Francisco, CA (US)

(73) Assignee: Applied Materials, Inc., Santa Clara, CA (US)

( * ) Notice: Subject to any disclaimer, the term of this patent is extended or adjusted under 35 U.S.C. 154(b) by 74 days.

(21) Appl. No.: 09/678,947

(22) Filed: Oct. 3, 2000

Related U.S. Application Data

(63) Continuation-in-part of application No. 09/289,074, filed on Apr. 8, 1999, now Pat. No. 6,258,220.
(60) Provisional application No. 60/216,896, filed on Jul. 7, 2000.

(51) Int. Cl.[7] ............................. C25D 5/00; C25D 5/02; C25D 17/00; B05D 1/02
(52) U.S. Cl. ........................ 205/80; 205/134; 205/669; 204/224 R; 204/225; 204/212; 427/430.1
(58) Field of Search ................................ 205/134, 669, 205/80; 204/224 R, 225, 212; 427/430.1

(56) References Cited

U.S. PATENT DOCUMENTS

| | | | |
|---|---|---|---|
| 3,627,661 A | 12/1971 | Gordon et al. | 204/181 |
| 3,649,509 A | 3/1972 | Morawetz et al. | 204/238 |
| 3,727,620 A | 4/1973 | Orr | 134/95 |
| 3,770,598 A | 11/1973 | Creutz | 204/52 R |
| 4,027,686 A | 6/1977 | Shortes et al. | 134/33 |

(List continued on next page.)

FOREIGN PATENT DOCUMENTS

| | | | | |
|---|---|---|---|---|
| JP | 53-086580 | 7/1976 | ......... | H01L/21/302 |
| JP | 58182823 | 10/1983 | ......... | H01L/21/288 |
| JP | 63118093 | 5/1988 | ............ | C25D/5/18 |
| JP | 04131395 | 5/1992 | ............ | C25D/5/34 |
| JP | 04280993 | 10/1992 | ............ | C25D/5/18 |
| JP | 6017291 | 1/1994 | ............ | C25D/7/12 |
| JP | 7-14811 | 1/1995 | ......... | H01L/21/304 |
| JP | 10-177988 | 6/1998 | ......... | H01L/21/306 |
| JP | 11-162905 | 6/1999 | ......... | H01L/21/341 |
| JP | 11-186210 | 7/1999 | ......... | H01L/21/651 |
| WO | WO 97/12079 | 4/1997 | ............ | C25D/5/02 |
| WO | WO 99/25902 | 5/1999 | ........... | C25B/13/00 |
| WO | WO 99/25903 | 5/1999 | ............ | C25D/5/00 |
| WO | WO 99/25904 | 5/1999 | ............ | C25D/5/02 |
| WO | WO 99/25905 | 5/1999 | ............ | C25D/5/02 |
| WO | WO 99/26275 | 5/1999 | | |

OTHER PUBLICATIONS

USSN 09/569,833 (Dordi, et al.), filed May 11, 2000.
Australian Patent Office Written Opinion from SG 9906158–2, Dated Mar. 5, 2002.
Graham, Kenneth A., *Electroplating Engineering Handbook*, $2^{nd}$ Edition. (Copy not available to Applicant at this time). No Date.

(List continued on next page.)

*Primary Examiner*—Donald R. Valentine
(74) *Attorney, Agent, or Firm*—Moser, Patterson & Sheridan

(57) ABSTRACT

An electro-chemical plating system is described. A method is performed by the electro-chemical plating system in which a seed layer formed on a substrate is immersed into an electrolyte solution. In one aspect, a substrate is immersed in the electrochemical plating system by tilting the substrate as it enters the electrolyte solution to limit the trapping or formation of air bubbles in the electrolyte solution between the substrate and the substrate holder. In another aspect, an apparatus is provided for electroplating that comprises a cell, a substrate holder, and an actuator. The actuator can displace the substrate holder assembly in the x and z directions and also tilt the substrate. In another aspect, a method is provided of driving a meniscus formed by electrolyte solution across a surface of a substrate. The method comprises enhancing the interaction between the electrolyte solution meniscus and the surface as the substrate is immersed into the electrolyte solution.

28 Claims, 31 Drawing Sheets

U.S. PATENT DOCUMENTS

| | | | |
|---|---|---|---|
| 4,065,374 A | 12/1977 | Asami et al. | 204/228 |
| 4,092,176 A | 5/1978 | Kozai et al. | 134/186 |
| 4,110,176 A | 8/1978 | Creutz et al. | 204/52 R |
| 4,113,492 A | 9/1978 | Sato et al. | 96/67 |
| 4,120,759 A | 10/1978 | Asami et al. | 204/14 R |
| 4,120,771 A * | 10/1978 | Dewallens | 204/225 |
| 4,222,834 A * | 9/1980 | Bacon et al. | 204/224 R |
| 4,315,059 A | 2/1982 | Raistrick et al. | 429/112 |
| 4,326,940 A | 4/1982 | Eckles et al. | 204/232 |
| 4,336,114 A | 6/1982 | Mayer et al. | 204/52 R |
| 4,375,396 A * | 3/1983 | Beggs et al. | 205/669 |
| 4,376,685 A | 3/1983 | Watson | 204/52 R |
| 4,396,467 A | 8/1983 | Anthony | 204/15 |
| 4,405,416 A | 9/1983 | Raistrick et al. | 204/68 |
| 4,428,815 A | 1/1984 | Powell et al. | 204/297 |
| 4,435,266 A | 3/1984 | Johnston | 204/276 |
| 4,489,740 A | 12/1984 | Rattan et al. | 134/140 |
| 4,496,436 A | 1/1985 | Inoue | 204/23 |
| 4,510,176 A | 4/1985 | Cuthbert et al. | 427/82 |
| 4,518,678 A | 5/1985 | Allen | 430/311 |
| 4,519,846 A | 5/1985 | Aigo | 134/15 |
| 4,693,805 A | 9/1987 | Quazi | 204/192.22 |
| 4,732,785 A | 3/1988 | Brewer | 427/240 |
| 4,789,445 A | 12/1988 | Goffman et al. | 204/114 |
| 5,039,381 A | 8/1991 | Mullarkey | 204/47.5 |
| 5,055,425 A | 10/1991 | Leibovitz et al. | 437/195 |
| 5,092,975 A | 3/1992 | Yamamura, et al. | 204/198 |
| 5,155,336 A | 10/1992 | Gronet et al. | 219/411 |
| 5,162,260 A | 11/1992 | Leibovitz et al. | 437/195 |
| 5,222,310 A | 6/1993 | Thompson et al. | 34/202 |
| 5,224,504 A | 7/1993 | Thompson et al. | 134/155 |
| 5,230,743 A | 7/1993 | Thompson et al. | 134/32 |
| 5,252,807 A | 10/1993 | Chizinsky | 219/390 |
| 5,256,274 A | 10/1993 | Poris | 205/123 |
| 5,259,407 A | 11/1993 | Tuchida et al. | 134/151 |
| 5,290,361 A | 3/1994 | Hayashida et al. | 134/2 |
| 5,316,974 A | 5/1994 | Crank | 437/190 |
| 5,328,589 A | 7/1994 | Martin | 205/296 |
| 5,349,978 A | 9/1994 | Sago et al. | 134/153 |
| 5,368,711 A | 11/1994 | Poris | 204/193 |
| 5,377,708 A | 1/1995 | Berman et al. | 134/105 |
| 5,384,640 A | 1/1995 | Wong | 356/437 |
| 5,415,890 A | 5/1995 | Kloiber et al. | 427/242 |
| 5,429,733 A | 7/1995 | Ishida | 204/224 R |
| 5,447,615 A | 9/1995 | Ishida | 204/224 R |
| 5,516,412 A | 5/1996 | Andricacos et al. | 204/224 R |
| 5,608,943 A | 3/1997 | Konishi et al. | 15/302 |
| 5,625,170 A | 4/1997 | Poris | 177/50 |
| 5,651,865 A | 7/1997 | Sellers | 204/192.13 |
| 5,660,706 A * | 8/1997 | Zhao et al. | 205/123 |
| 5,670,034 A | 9/1997 | Lowery | 205/143 |
| 5,705,223 A | 1/1998 | Bunkofske | 427/240 |
| 5,718,813 A | 2/1998 | Drummond et al. | 204/192.12 |
| 5,723,028 A | 3/1998 | Poris | 204/231 |
| 5,885,469 A | 3/1999 | Kholodenko et al. | 216/11 |
| 6,071,388 A | 6/2000 | Uzoh | 204/297 R |
| 6,093,291 A | 7/2000 | Izumi et al. | 204/224 R |
| 6,106,690 A * | 8/2000 | Reynolds | 205/669 |
| 6,133,061 A | 10/2000 | Sonoda | 482/69 |
| 6,139,712 A | 10/2000 | Patton et al. | 205/143 |
| 6,156,167 A | 12/2000 | Patton et al. | 204/270 |
| 6,162,344 A | 12/2000 | Reid et al. | 205/157 |
| 6,197,181 B1 | 3/2001 | Chen | 205/123 |
| 6,203,684 B1 | 3/2001 | Taylor et al. | 205/103 |
| 6,210,555 B1 | 4/2001 | Taylor et al. | 205/103 |
| 6,224,737 B1 | 5/2001 | Tsai et al. | 205/123 |
| 6,251,236 B1 | 6/2001 | Stevens | 204/224 R |
| 6,258,220 B1 | 7/2001 | Dordi et al. | 204/198 |
| 6,277,263 B1 | 8/2001 | Chen | 205/182 |
| 6,290,833 B1 | 9/2001 | Chen | 205/182 |
| 6,303,014 B1 | 10/2001 | Taylor et al. | 205/103 |
| 6,319,384 B1 | 11/2001 | Taylor et al. | 205/103 |
| 6,343,793 B1 | 2/2002 | Patton et al. | 277/361 |
| 6,374,837 B2 | 4/2002 | Scranton et al. | 134/161 |
| 6,395,101 B1 | 5/2002 | Scranton et al. | 134/32 |
| 6,432,821 B1 | 8/2002 | Dubin et al. | 438/678 |
| 6,436,249 B1 | 8/2002 | Patton et al. | 204/212 |
| 6,440,291 B1 | 8/2002 | Henri et al. | 205/205 |

OTHER PUBLICATIONS

International Preliminary Examination Report, from PCT/US99/28159, dated Mar. 27, 2001.

PCT International Search Report dated Feb. 7, 2000.

Kenneth E. Pitney, "NEY Contact Manual," Electrical Contacts for Low Energy Uses, 1973. (No Month).

Verteq Online©, "Products Overview," 1996–1998, 5 pages. (No Date).

Lucio Colombo, "Wafer Back Surface Film Removal," Central R&D, SGS–Thompson, Microelectronics, Agrate, Italy, 6 pages. (No Date).

Semitool©, Inc., "Metallization & Interconnect," 1998, 4 pages. (No Date).

Laurell Technologies Corporation, "Two control configurations available–see WS 400 or WS–400Lite." Oct. 29, 1998, 6 pages.

Peter Singer, "Tantalum, Copper and Damascene: The Future of Interconnects," Semiconductor International, Jun., 1998, Pages cover, 91–92,94,96 & 98.

Peter Singer, "Wafer Processing," Semiconductor International, Jun., 1998, p. 70.

* cited by examiner

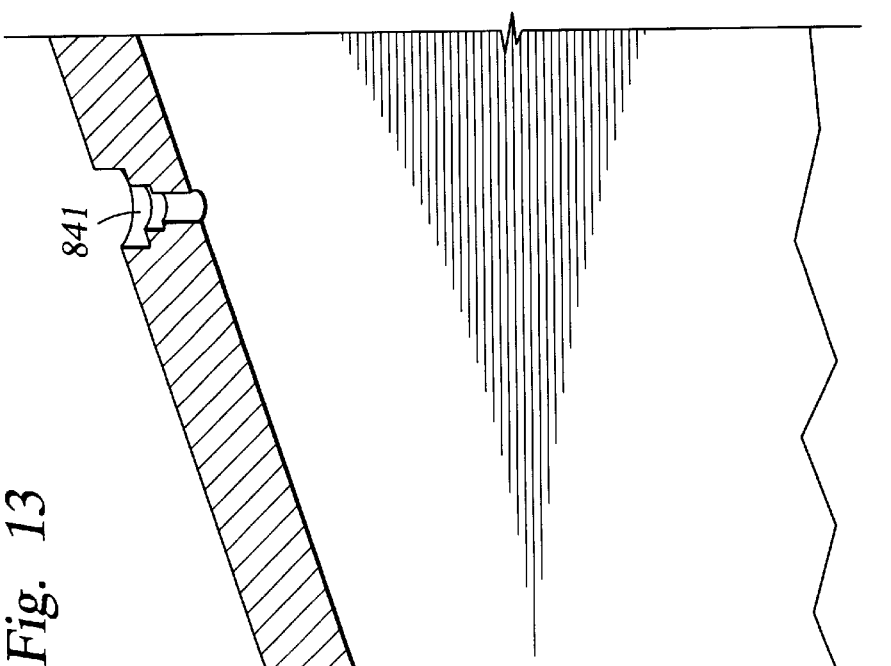
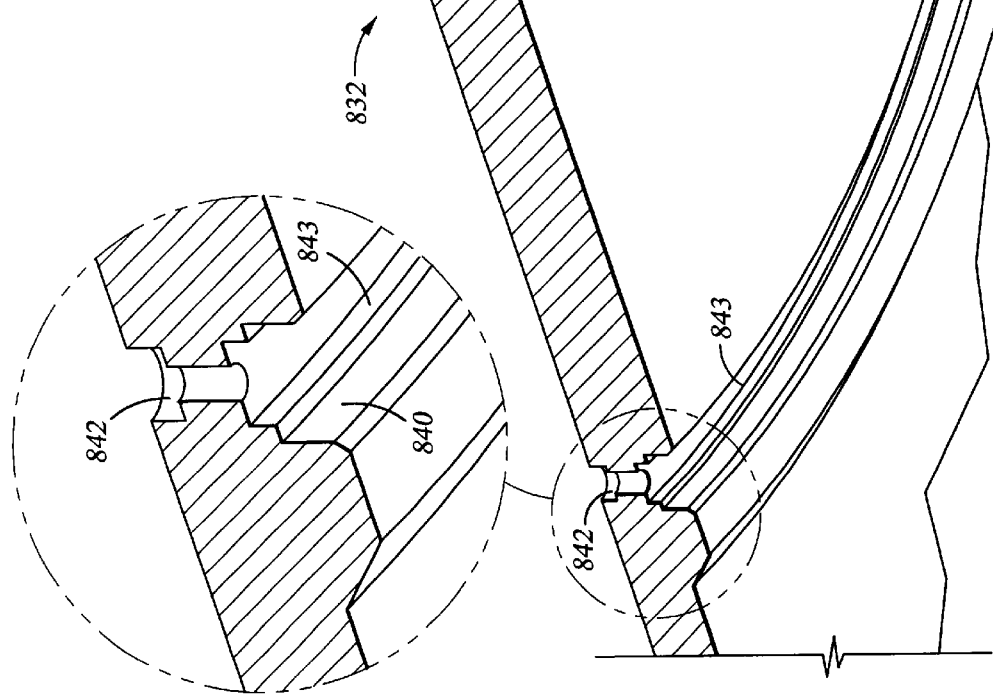
Fig. 13

METHOD AND ASSOCIATED APPARATUS FOR TILTING A SUBSTRATE UPON ENTRY FOR METAL DEPOSITION

CROSS REFERENCE TO RELATED APPLICATIONS

This disclosure is claiming priority to commonly assigned U.S. provisional patent application, Ser. No. 60/216,896, entitled "METHOD AND APPARATUS FOR TILTING A SUBSTRATE UPON ENTRY", filed on Jul. 7, 2000, which is incorporated herein by reference.

This disclosure is a continuation-in-part of prior filed U.S. patent application Ser. No. 09/289,074, filed Apr. 8, 1999, now U.S. Pat. No. 6,258,220 and entitled "ELECTRO-CHEMACAL DEPOSITION SYSTEM", incorporated herein by reference in its entirety.

BACKGROUND OF THE INVENTION

1. Field of the Invention

The present invention generally relates to deposition of a metal layer onto a substrate. More particularly, the present invention relates to a substrate holder system for use in an electrochemical plating (ECP) system to deposit a metal film on a substrate.

2. Background of the Related Art

Electroplating is used for the fabrication of lines on circuit boards as well as to fill features, such as vias, trenches, and electric contact elements, for example, in semiconductor devices. A typical feature-fill process including electroplating comprises depositing a barrier layer over the feature surfaces by a process such as physical vapor deposition (PVD) or chemical vapor deposition (CVD), then depositing a conductive metal seed layer such as copper on the barrier layer by a process such as PVD or CVD, and then electroplating a conductive metal film over the seed layer to fill the feature and form a blanket layer on the field to form the desired conductive structure. The deposited metal film is then planarized by a process such as chemical mechanical polishing (CMP) to define a conductive interconnect feature. An electric contact ring is commonly positioned in contact with the seed layer on the substrate during electroplating to supply electricity to the seed layer.

A number of obstacles impair reliable electroplating onto substrates having micron-sized, high aspect ratio features. One of these obstacles relates to a substrates, held by a substrate holder assembly, being immersed in a level attitude into electrolyte solution. The substrate holder assembly typically includes an electric contact ring, or a support ring, that extends around the periphery of the substrate. The electric contact ring or a support ring typically physically supports the substrate during electroplating. Portions of the substrate holder assembly, such as electric contact rings or support rings, together with the substrate define a downwardly-facing concave surface. As the substrate holder assembly is immersed with the substrate, the concave surface defined by the substrate and substrate holder assembly can trap air that form air pockets within the electrolyte solution.

The air bubbles or the air bridges that are trapped in the electrolyte solution by the concave surface defined by the substrate holder assembly and substrate can contact the surface of the substrate during plating. The electrolyte solution does not physically contact those portions of the seed layer on the substrate that the air bubbles or air bridges contact. Metal film, therefore, cannot be deposited on those portions of the seed layer that the air bubbles or air pockets cover. As such, the existence of air bubbles or air bridges adjacent the seed layer during metal film deposition can affect the uniformity of the depth of the deposited metal film across the seed layer. Limiting the amount of air bubbles or air bridges that contact the seed layer during processing and providing a uniform electric current density across the seed layer on the substrate during plating.

The existence of air bubbles within the features during deposition of the metal film can also limit the filling of the features on the substrate, and thereby lead to the creation of voids, or spaces, within features formed within the deposited metal film. The existence of voids in the features leads to unreliable, unpredictable, and unuseable electronic devices in the electronic circuit containing the feature.

Therefore, there remains a need for an electrochemical plating (ECP) system that limits the formation of air bubbles between the substrate and/or the substrate holder assembly during the immersion of the substrate into electrolyte solution.

SUMMARY OF THE INVENTION

The present invention generally provides an ECP system. More specifically, a method is performed by the electrochemical plating system in which a seed layer formed on a substrate is immersed into an electrolyte solution. In one aspect, a substrate is immersed in the electrochemical plating system by tilting the substrate as it enters the electrolyte solution to limit the trapping or formation of air bubbles in the electrolyte solution between the substrate and the substrate holder assembly. In another aspect, an apparatus is provided for electroplating that comprises a cell and a substrate holder system. The substrate holder system can displace the substrate holder assembly in the x and z directions and also tilt the substrate. In another aspect, a method is provided of driving a meniscus formed by electrolyte solution across a surface of a substrate. The method comprises enhancing the interaction between the electrolyte solution meniscus and the surface as the substrate is immersed into the electrolyte solution.

BRIEF DESCRIPTION OF THE DRAWINGS

So that the manner in which the above recited features, advantages and objects of the present invention are attained can be understood in detail, a more particular description of the invention, briefly summarized above, may be had by reference to the embodiments thereof which are illustrated in the appended drawings.

FIG. 13 is a partial cross sectional view of a substrate holder plate;

FIG. 28, comprising

The terms "below", "above", "bottom", "top", "up", "down", "upper", and "lower" and other positional terms used herein are shown with respect to the embodiments in the figures and may be varied depending on the relative orientation of the processing apparatus.

DETAILED DESCRIPTION OF THE PREFERRED EMBODIMENT

This disclosure describes the structure and operation of an electrochemical plating (ECP) system. A substrate holder system of the ECP system is also detailed. Operation of the substrate holder system provides for tilting of the substrate upon immersion of the substrate into the electrolyte solution.

1. ECP System

Figure 1:
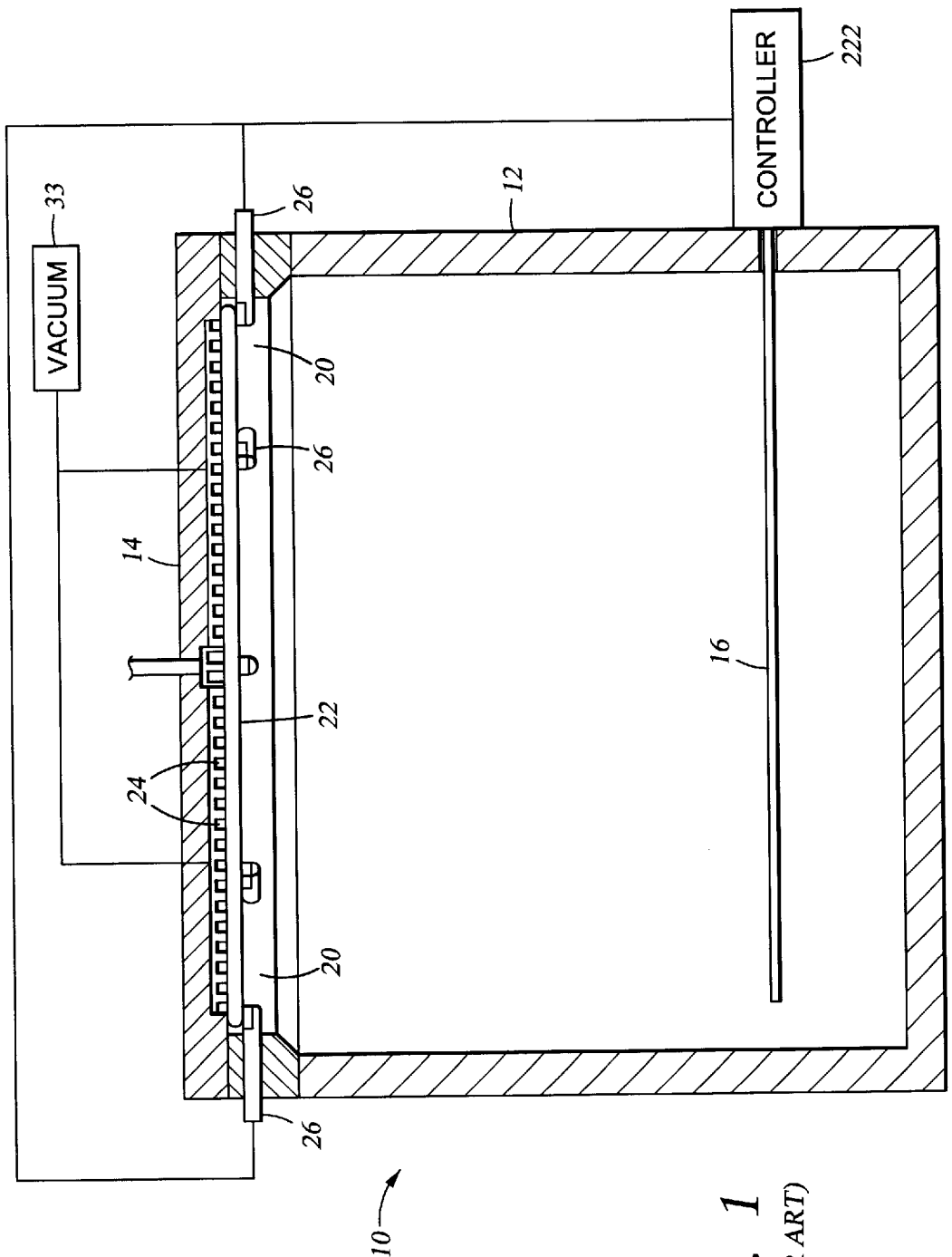
FIG. 1 is a cross sectional view of a simplified typical fountain plater.

FIG. 1 is a cross sectional view of one embodiment of fountain plater 10 involved in electroplating. Generally, the fountain plater 10 includes an electrolyte cell 12, an electric contact ring 20, a controller 23, a substrate holder system 14, and an anode 16. The electrolyte cell 12 has a top opening through which the substrate holder system 14 can immerse the substrate into, or remove the substrate from, the electrolyte solution contained in the electrolyte cell. The anode 16 is immersed in electrolyte solution contained in the electrolyte cell 12. A plurality of grooves 24 are formed in the lower surface of the substrate holder system 14. A vacuum pump 33 is coupled to the substrate holder system 14 and communicates with the grooves 24 to create a vacuum condition that is capable of securing the backside of the substrate 22 to the substrate holder system 14 during processing. The electric contact ring 20 comprises a plurality of metallic or semi-metallic contact pins 26 distributed about the peripheral portion of the substrate 22 to define a central substrate plating surface. The tips of each one of the plurality of contact pins 26 contact the seed layer on the substrate 22. A controller 23 controls the electricity supplied to the pins 26 and the anode 16 to providing an electric bias between the seed layer on the substrate 22 and the anode. The substrate 22 is positioned near the top of, and within, the cylindrical electrolyte cell 12 and electrolyte solution flow impinges perpendicularly on the substrate plating surface during operation of the cell 10.

Figure 2:
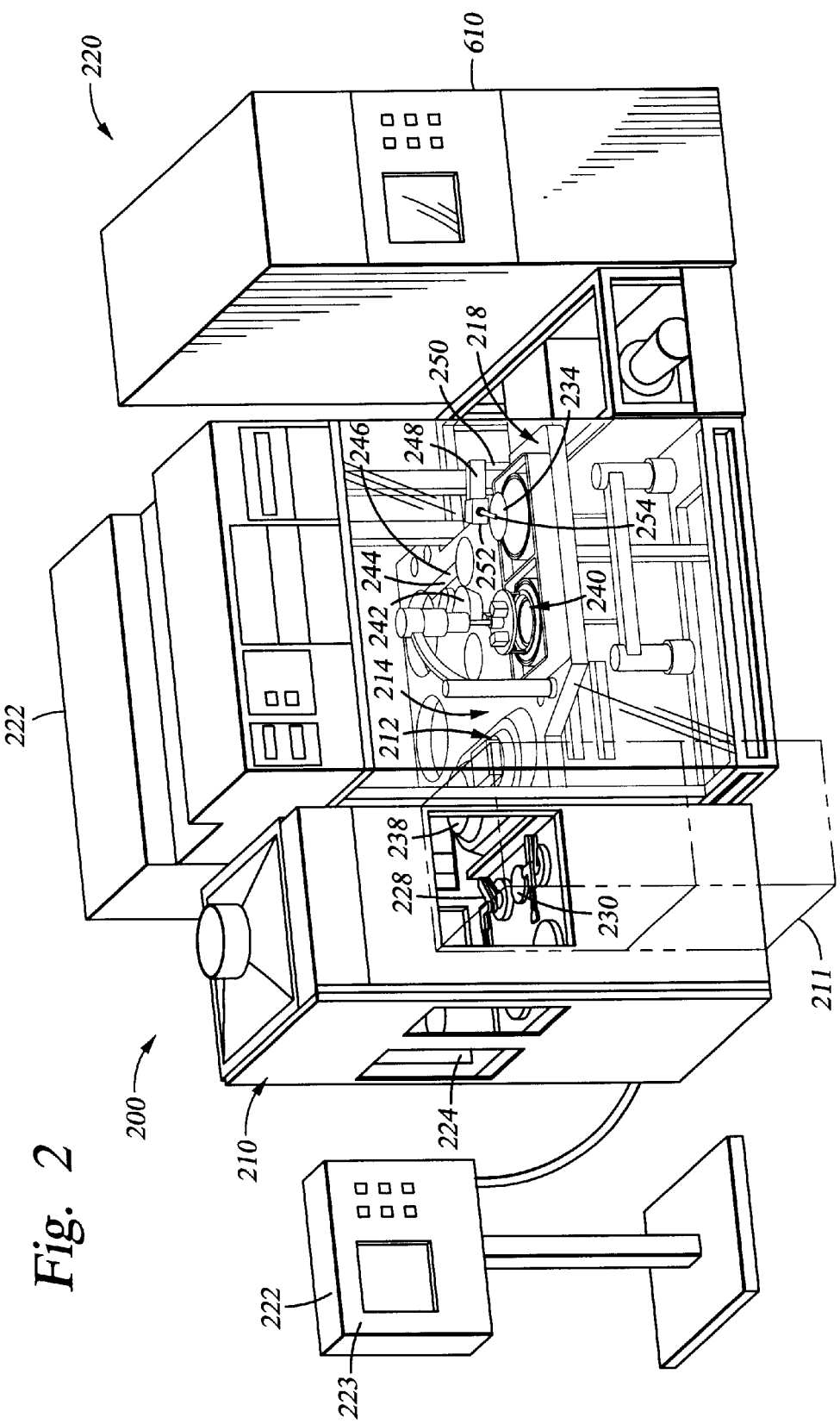
FIG. 2 is a perspective view of one embodiment of an electro-chemical plating (ECP) system.
Figure 3:
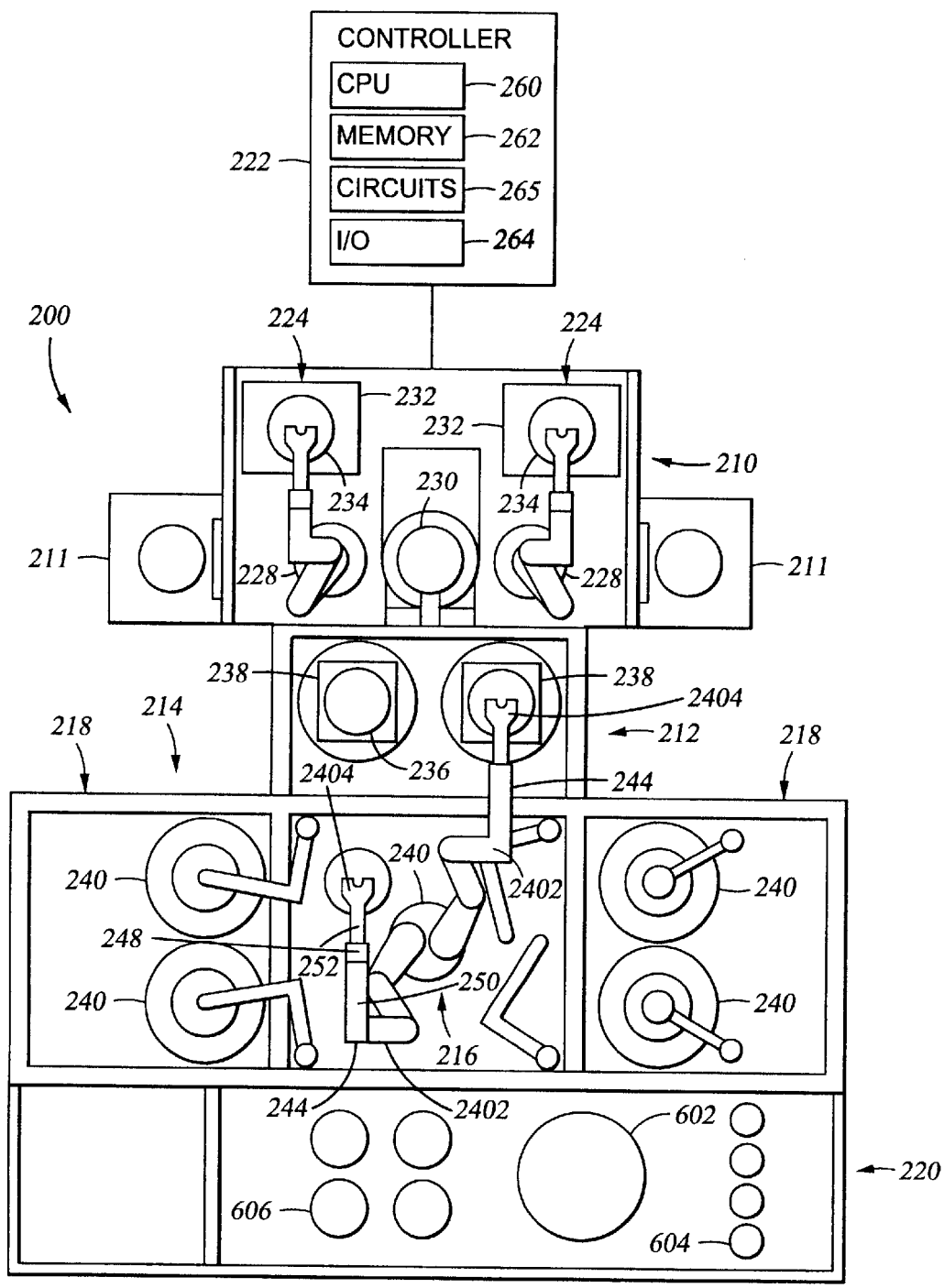
FIG. 3 is a top schematic view of the ECP system of FIG. 2.

FIG. 2 is a perspective view of one embodiment of an ECP system 200. FIG. 3 is a top plan view of the ECP system 200 of FIG. 2. Referring to both FIGS. 2 and 3 together, the ECP system 200 generally comprises a loading station 210, a rapid thermal anneal (RTA) chamber 211, a spin-rinse-dry (SRD) station 212, a mainframe 214, and an electrolyte solution system 220. Preferably, the ECP system 200 is enclosed in a clean environment using panels such as PLEXIGLAS® (a registered trademark of the Rohm and Haas Company, West Philadelphia, Pa.) panels. The mainframe 214 generally comprises a mainframe transfer station 216 and a plurality of processing stations 218. Each processing station 218 includes one or more process cells 240. An electrolyte solution system 220 is positioned adjacent the ECP system 200 and connected to the process cells 240 individually to circulate electrolyte solution used for the electroplating process. The ECP system 200 also includes a controller 222 that typically comprises a programmable microprocessor.

The loading station 210 preferably includes one or more substrate cassette receiving areas 224, one or more loading station transfer robots 228 and at least one substrate orientor 230. The number of substrate cassette receiving areas, loading station transfer robots 228 and substrate orientors included in the loading station 210 can be configured according to the desired throughput of the system. As shown for one embodiment in FIGS. 2 and 3, the loading station 210 includes two substrate cassette receiving areas 224, two loading station transfer robots 228 and one substrate orientor 230. A substrate cassette 232 containing substrates 234 is loaded onto the substrate cassette receiving area 224 to introduce substrates 234 into the ECP system. The loading station transfer robot 228 transfers substrates 234 between the substrate cassette 232 and the substrate orientor 230. The loading station transfer robot 228 comprises a typical transfer robot commonly known in the art. The substrate orientor 230 positions each substrate 234 in a desired orientation to ensure that the substrate is properly processed. The loading station transfer robot 228 also transfers substrates 234 between the loading station 210 and the SRD station 212 and between the loading station 210 and the RTA chamber 211.

Figure 4:
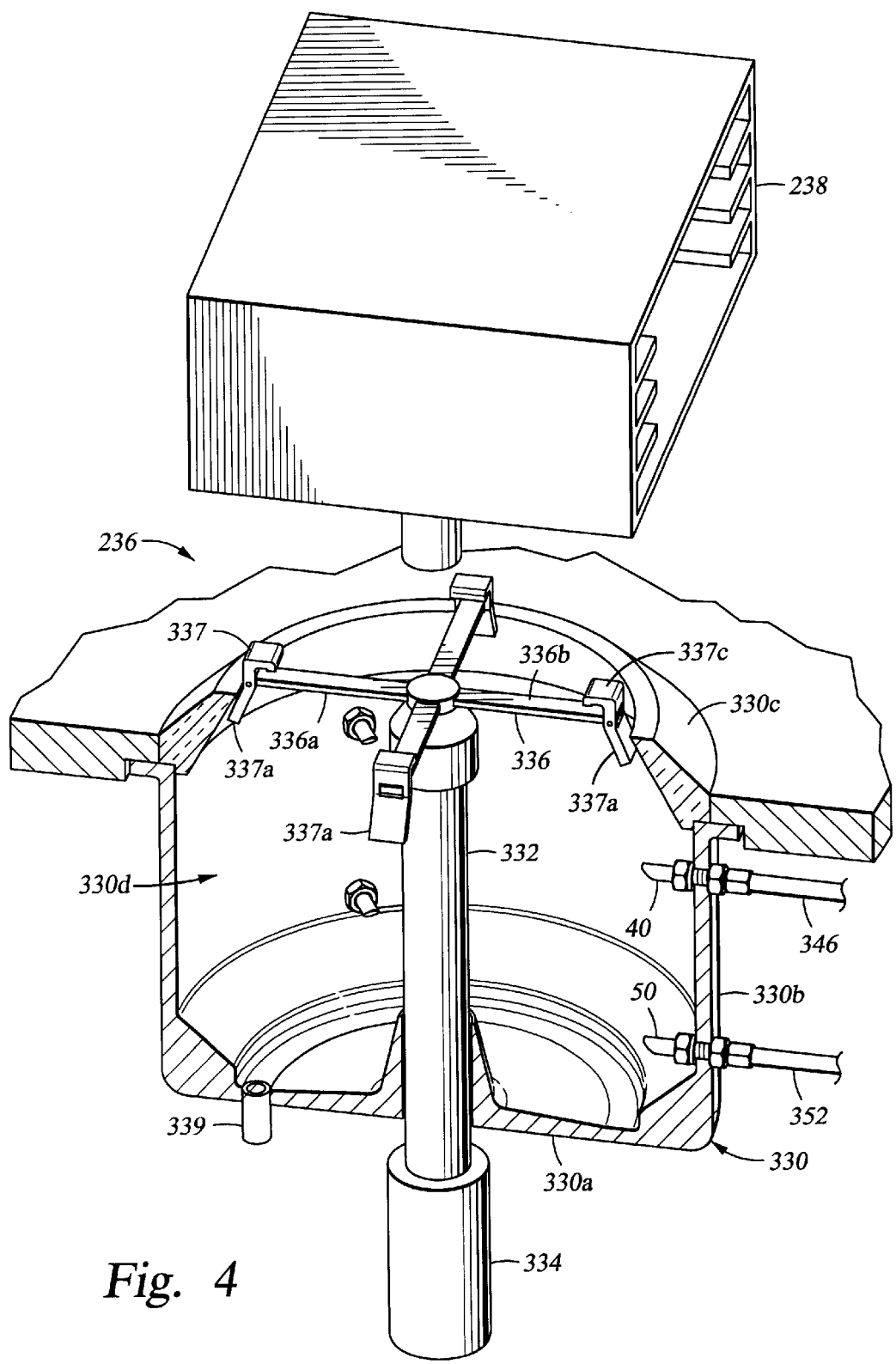
FIG. 4 is a schematic perspective view of one embodiment of spin-rinse-dry (SRD) module, incorporating rinsing and dissolving fluid inlets.
Figure 5:
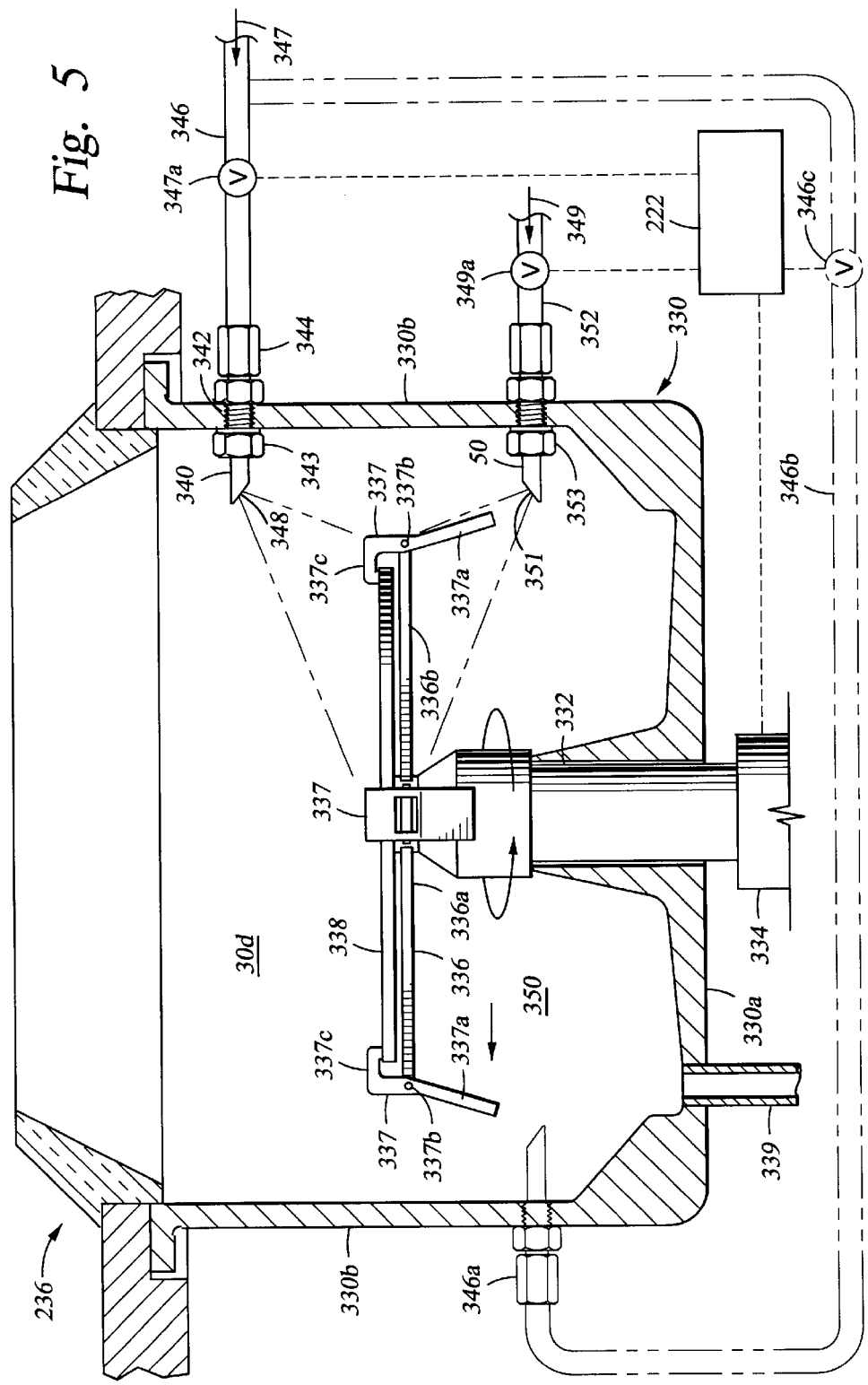
FIG. 5 is a side cross sectional view of the spin-rinse-dry (SRD) module of FIG. 4 and shows a substrate in a processing position.

FIG. 4 is a schematic perspective view of one embodiment of a spin-rinse-dry (SRD) module 236, incorporating rinsing and dissolving fluid inlets. FIG. 5 is a side cross sectional view of the SRD module of FIG. 4 and shows a substrate in a processing position vertically disposed between fluid inlets. Preferably, the SRD station 212 includes one or more SRD modules 236 and one or more substrate pass-through cassettes 238. Preferably, the SRD station 212 includes two SRD modules 236 corresponding to the number of loading station transfer robots 228, and a substrate pass-through cassette 238 is positioned above each SRD module 236. The substrate pass-through cassette 238 facilitates substrate transfer between the loading station 210 and the mainframe 214. The substrate pass-through cassette 238 provides access to and from both the loading station transfer robot 228 and a robot in the mainframe transfer station 216.

Referring to FIGS. 4 and 5, the SRD module 236 comprises a bottom 330a, a 30 sidewall 330b, and an upper shield 330c. The bottom 330a, the sidewall 330b, and the upper shield 330c collectively define a SRD module bowl 330d, where the shield attaches to the sidewall and assists in retaining the fluids within the SRD module 236. Alternatively, a removable cover could also be used. A pedestal 336, located in the SRD module 236, includes a pedestal support 332 and a pedestal actuator 334. The pedestal 336 supports the substrate 338 (shown in FIG. 5) on the pedestal upper surface during processing. The pedestal actuator 334 rotates the pedestal to spin the substrate and raises and lowers the pedestal as described below. The substrate may be held in place on the pedestal by a plurality of clamps 337. The clamps pivot with centrifugal force and engage the substrate preferably in the edge exclusion zone of the substrate. In one embodiment, the clamps engage the substrate only when the substrate lifts off the pedestal during the processing. Vacuum passages or other holding elements may also be used. The pedestal has a plurality of pedestal arms 336a and 336b, so that the fluid 10 through the second nozzle may impact as much surface area on the lower surface of the substrate as is practical. An outlet 339 allows fluid to be removed from the SRD module 236.

A first conduit 346, through which the first fluid flows, is connected to a valve 347a. The conduit may be hose, pipe, tube, or other fluid containing conduits. The valve 347a controls the flow of the first fluid. The valve 347a may be selected from a variety of valves including a needle, globe, butterfly, or other valve types and may include a valve actuator, such as a solenoid. The valve 347a is controlled with a controller 222. The conduit 346 connects to a first fluid inlet 340 that is located above the substrate and includes a mounting portion 342 to attach to the SRD module 236 and a connecting portion 344 to attach to the conduit 346. The first fluid inlet is shown with a single first nozzle 348 to deliver a first fluid under pressure onto the substrate upper surface. However, multiple nozzles could be used and multiple fluid inlets could be positioned about the inner perimeter of the SRD module. Preferably, nozzles placed above the substrate should be outside the diameter of the substrate to lessen the risk of the nozzles dripping on the substrate. The first fluid inlet could be mounted in a variety of locations, including through a cover positioned above the substrate. Additionally, the nozzle may articulate to a variety of positions using an articulating member 343, such as a ball and socket joint.

Similar to the first conduit and related elements described above, a second conduit 352 is connected to a control valve 349a and a second fluid inlet 350 with a second nozzle 351. The second fluid inlet 350 is shown below the substrate and angled upward to direct a second fluid under the substrate through the second nozzle 351. Similar to the first fluid inlet, the second fluid inlet may include a plurality of nozzles, a plurality of fluid inlets and mounting locations, and a plurality of orientations including using the articulating member 353. Each fluid inlet could be extended into the SRD module 236 at a variety of positions. For instance, if the flow is desired to be a certain angle that is directed back toward the SRD module periphery along the edge of the substrate, the nozzles could be extended radially inward and the discharge from the nozzles be directed back toward the SRD module periphery.

The controller 222 could individually control the two fluids and their respective flow rates, pressure, and timing, and any associated valving, as well as the spin cycle(s). The controller could be remotely located, for instance, in a control panel or control room and the plumbing controlled with remote actuators. An alternative embodiment, shown in dashed lines, provides an auxiliary fluid inlet 346a connected to the first conduit 346 with a conduit 346b and having a control valve 346c. The alternate embodiment may be used to flow a rinsing fluid on the backside of the substrate after the dissolving fluid is applied without having to reorient the substrate or switch the flow through the second fluid inlet to a rinsing fluid.

The controller 222 controls electric voltage or current supplied to the anode 16 and the seed layer of the substrate 22. The controller 222, whose components are shown in FIG. 3, comprises central processing unit (CPU) 260, memory 262, circuit portion 265, input output interface (I/O) 264, and bus, not shown. The controller 222 may be a general-purpose computer, a microprocessor, a microcontroller, or any other known suitable type of computer or controller. The CPU 260 performs the processing and arithmetic operations for the controller 222, and controls the operation of the electricity applied to the anode 16, the seed layer 15 on the substrate 22, and the operation of the substrate holder system 14.

The memory 262 includes random access memory (RAM) and read only memory (ROM) that together store the computer programs, operands, operators, dimensional values, system processing temperatures and configurations, and other parameters that control the electroplating operation. The bus provides for digital information transmissions between CPU 260, circuit portion 265, memory 262, and I/O 264. The bus also connects I/O 264 to the portions of the ECP system 200 that either receive digital information from, or transmit digital information to, controller 222.

I/O 264 provides an interface to control the transmissions of digital information between each of the components in controller 222. I/O 264 also provides an interface between the components of the controller 222 and different portions of the ECP system 200. Circuit portion 265 comprises all of the other user interface devices such as display and keyboard, system devices, and other accessories associated with the controller 222. While one embodiment of digital controller 222 is described herein, other digital controllers as well as analog controllers could function well in this application.

In one embodiment, the substrate is mounted with the deposition surface of the disposed face up in the SRD module bowl. The first fluid inlet generally flows a rinsing fluid, typically de-ionized water or alcohol. Consequently, the backside of the substrate is mounted facing down. The fluid flowing through the second fluid inlet is usually an etching fluid, such as an acid, including hydrochloric acid, sulfuric acid, phosphoric acid, hydrofluoric acid, or other dissolving liquids or fluids, depending on the material to be dissolved. Alternatively, the first fluid and the second fluid are both rinsing fluids, such as de-ionized water or alcohol, when the desired process is to rinse the processed substrate.

In operation, the pedestal is in a raised position, shown in FIG. 4, and a robot, not shown, places the substrate, front side up, onto the pedestal 336. The pedestal lowers the substrate to a processing position where the substrate is vertically disposed between the first and the second fluid inlets. Generally, the pedestal actuator rotates the pedestal between about 0 to about 2500 rpm for a 200 mm substrate. The rotation causes the lower end 337a of the clamps to rotate outward about pivot 337b, toward the periphery of the SRD module sidewall, due to centrifugal force. The clamp rotation forces the upper end 337c of the clamp inward and downward to center and hold the substrate 338 in position on the pedestal 336, preferably along the substrate edge. The clamps may rotate into position without touching the substrate and hold the substrate in position on the pedestal only if the substrate significantly lifts off the pedestal during processing. With the pedestal rotating the substrate, a rinsing fluid is delivered onto the substrate front side through the first fluid inlet 340. The second fluid, such as an acid, is delivered to the backside surface through the second fluid inlet to remove any unwanted deposits. The dissolving fluid chemically reacts with the deposited material, dissolves, and then flushes the material away from the substrate backside and other areas where any unwanted deposits are located. In one embodiment, the rinsing fluid is adjusted to flow at a greater rate than the dissolving fluid to help protect the front side of the substrate from the dissolving fluid. The first and second fluid inlets are located for optimal performance depending on the size of the substrate 22, the respective flow rates, spray patterns, and amount and type of deposits to be removed, among other factors. In some instances, the rinsing fluid could be routed to the second fluid inlet after a dissolving fluid has dissolved the unwanted deposits to rinse the backside of the substrate. In other instances, an auxiliary fluid inlet connected to flow rinsing fluid on the backside of the substrate could be used to rinse any dissolving fluid residue from the backside. After rinsing the front side and/or backside of the substrate, the fluid(s) flow is stopped and the pedestal continues to rotate, spinning the substrate, and thereby effectively drying the surface.

The fluid(s) are generally delivered in a spray pattern, which may be varied depending on the particular nozzle spray pattern desired and may include a fan, jet, conical, and other patterns. One spray pattern for the first and second fluids through the respective fluid inlets, when the first fluid is a rinsing fluid, is fan pattern with a pressure of about 10 to about 15 pounds per square inch (psi) and a flow rate of about 1 to about 3 gallons per minute (gpm) for a 200 mm substrate.

The ECP system 200 could also be used to remove the unwanted deposits along the edge of the substrate to create an edge exclusion zone. By adjustment of the orientation and placement of the nozzles, the flow rates of the fluids, the rotational speed of the substrate, the chemical composition of the fluids, and the unwanted deposits can be removed from the edge and/or edge exclusion zone of the substrate as well. Thus, substantially preventing dissolution of the deposited material on the front side surface may not necessarily include the edge or edge exclusion zone of the substrate. Limiting dissolution of the deposited material on the front side surface is intended to include at least preventing the dissolution so that the front side with the deposited material is not impaired beyond a commercial value.

One method of accomplishing the edge exclusion zone dissolution process is to rotate the disk at a slower speed, such as about 100 to about 1000 rpm, while etching the dissolving fluid on the backside of the substrate. The centrifugal force moves the dissolving fluid to the edge of the substrate and forms a layer of fluid around the edge due to surface tension of the fluid, so that the dissolving fluid overlaps from the backside to the front side in the edge area of the substrate. The rotational speed of the substrate and the flow rate of the dissolving fluid may be used to determine the extent of the overlap onto the front side. For instance, a decrease in rotational speed or an increase in flow results in a less overlap of fluid to the opposing side, e.g., the front side. Additionally, the flow rate and flow angle of the rinsing fluid delivered to the front side can be adjusted to offset the layer of dissolving fluid onto the edge and/or frontside of the substrate. In some instances, the dissolving fluid may be used initially without the rinsing fluid to obtain the edge and/or edge exclusion zone removal, followed by the rinsing/dissolving process by the SRD module 236.

The SRD module 236 is connected between the loading station 210 and the mainframe 214. The mainframe 214 generally comprises a mainframe transfer station 216 and a plurality of processing stations 218. Referring to FIGS. 2 and 3, the mainframe 214, as shown, includes two processing stations 218, each processing station 218 having two process cells 240. The mainframe transfer station 216 includes a mainframe transfer robot 242. Preferably, the mainframe transfer robot 242 comprises a plurality of individual robot arms 244 that provides independent access of substrates in the processing stations 218 and the SRD stations 212. As shown in FIG. 3, the mainframe transfer robot 242 comprises two robot arms 244, corresponding to the number of process cells 240 per processing station 218. Each robot arm 244 includes a robot blade 246 for holding a substrate during a substrate transfer. Preferably, each robot arm 244 is operable independently of the other arm to facilitate independent transfers of substrates in the system. Alternatively, the robot arms 244 operate in a coordinated fashion such that one robot extends as the other robot arm retracts.

Preferably, the mainframe transfer station 216 includes a flipper robot 248 that facilitates transfer of a substrate from a face-up position on the robot blade 246 of the mainframe transfer robot 242 to a face down position for a process cell 240 that requires face-down processing of substrates. The flipper robot 248 includes a main body 250 and a flipper robot arm 252. The main body 250 provides both vertical and rotational movements with respect to a vertical axis of the main body 250. The flipper robot arm 252 provides rotational movement along a horizontal plane along the flipper robot arm 252. Preferably, a vacuum suction gripper 254, disposed at the distal end of the flipper robot arm 252, holds the substrate as the substrate is flipped and transferred by the flipper robot 248. The flipper robot 248 positions a substrate 234 into the process cell 240 for face-down processing. The details of the electroplating process cell will be discussed below.

Figure 24:
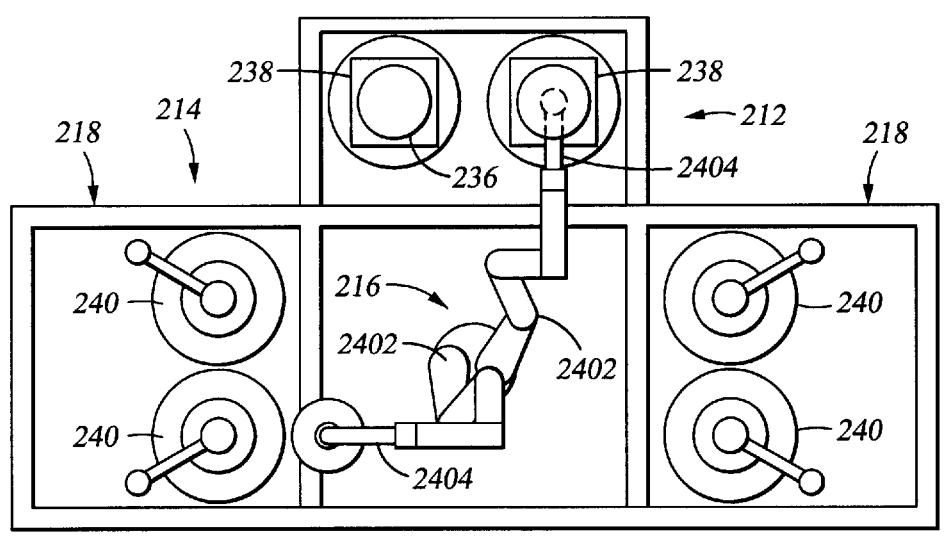
FIG. 24 is a top schematic view of a mainframe transfer robot having a flipper robot incorporated therein.

FIG. 24 is a top schematic view of a mainframe transfer robot having a flipper robot incorporated therein. The mainframe transfer robot 242 as shown in FIG. 24 serves to transfer substrates between different stations attached the mainframe station, including the processing stations and the SRD stations. The mainframe transfer robot 242 includes a plurality of robot arms 2402 (two shown), and a flipper type robot blade 2404 is attached as an end effector for each of the robot arms 2402. Flipper robots are generally known in the art and can be attached as end effectors for substrate handling robots, such as model RR701, available from Rorze Automation, Inc., located in Milpitas, Calif. The main transfer robot 242 having a flipper robot as the end effector is capable of transferring substrates between different stations attached to the mainframe as well as flipping the substrate being transferred to the desired surface orientation, i.e., substrate processing surface being face-down for the electroplating process. Preferably, the mainframe transfer robot 242 provides independent robot motion along the X-Y-Z axes by the robot arm 2402 and independent substrate flipping rotation by the flipper type robot blade 2404. By incorporating the flipper type robot blade 2404 as the end effector of the mainframe transfer robot, the substrate transfer process is simplified because the step of passing a substrate from a mainframe transfer robot 242 to a flipper robot is eliminated.

Figure 6:
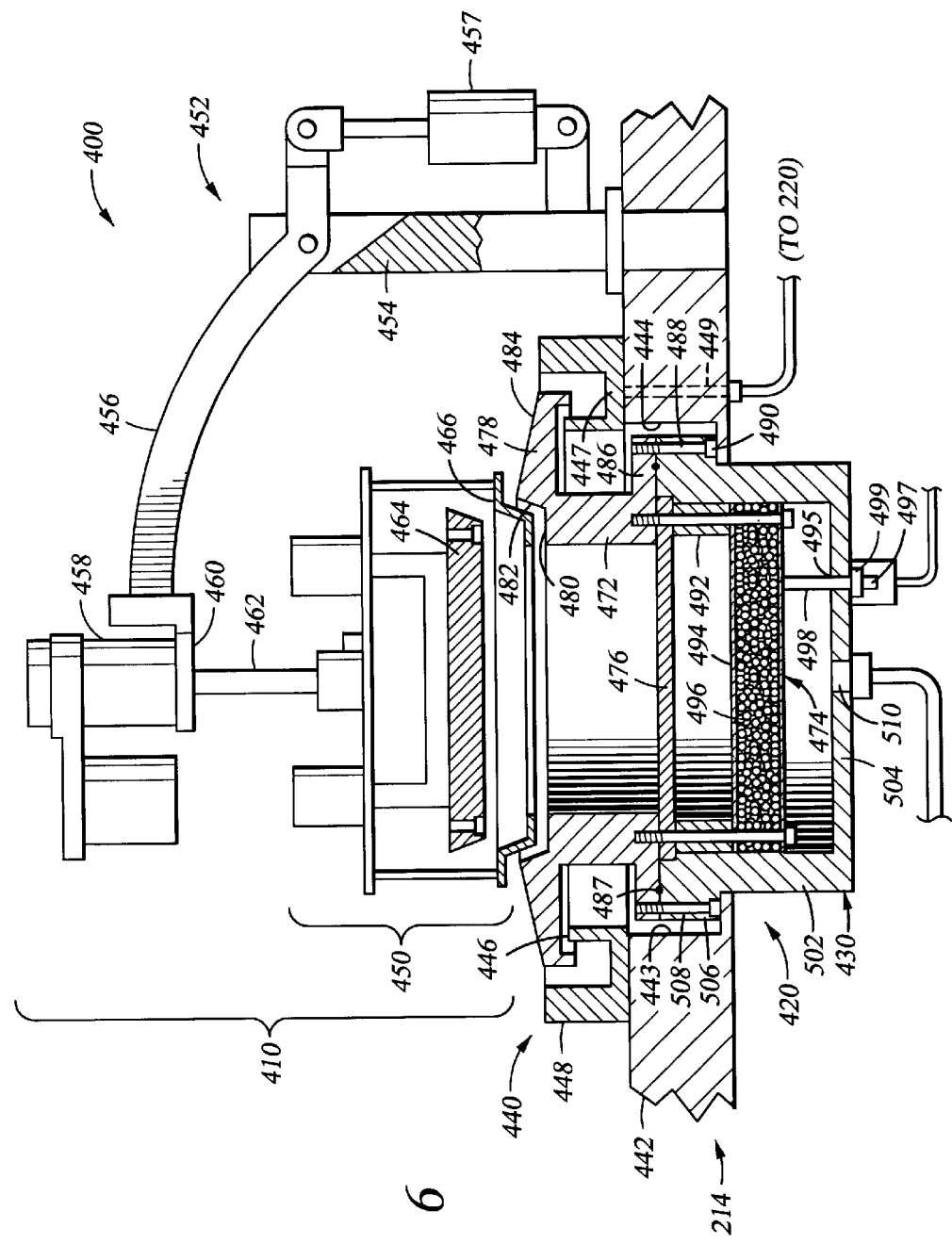
FIG. 6 is a cross sectional view of an electroplating process cell having a substrate holder system.

FIG. 6 is a cross sectional view of an electroplating process cell 400. The electroplating process cell 400 as shown in FIG. 6 is one embodiment of the electroplating process cell 240 as shown in FIGS. 2 and 3. The process cell 400 generally comprises a head assembly 410, a process cell 420 and an electrolyte solution collector 440. Preferably, the electrolyte solution collector 440 is secured onto the body 442 of the mainframe 214 over an opening 443 that defines the location for placement of the process cell 420. The electrolyte solution collector 440 includes an inner wall 446, an outer wall 448 and a bottom 447 connecting the walls. An electrolyte solution outlet 449 is disposed through the bottom 447 of the electrolyte solution collector 440 and connected to the electrolyte solution system 220 shown in FIG. 2 through tubes, hoses, pipes or other fluid transfer connectors.

The head assembly 410 is mounted onto a head assembly frame 452. The head assembly frame 452 includes a mounting post 454 and a cantilever arm 456. The mounting post 454 is mounted onto the body 442 of the mainframe 214, and the cantilever arm 456 extends laterally from an upper portion of the mounting post 454. Preferably, the mounting post 454 provides rotational movement with respect to a vertical axis along the mounting post to allow rotation of the head assembly 410 about the mounting post 454. The head assembly 410 is attached to a mounting plate 460 disposed at the distal end of the cantilever arm 456. The lower end of the cantilever arm 456 is connected to a cantilever arm actuator 457, such as a pneumatic cylinder, mounted on the mounting post 454. The cantilever arm actuator 457 provides pivotal movement of the cantilever arm 456 with respect to the joint between the cantilever arm 456 and the mounting post 454. When the cantilever arm actuator 457 is retracted, the cantilever arm 456 moves the head assembly 410 away from the process cell 420 to provide the spacing required to remove and/or replace the process cell 420 from the electroplating process cell 400. When the cantilever arm actuator 457 is extended, the cantilever arm 456 moves the head assembly 410 toward the process cell 420 to position the substrate in the head assembly 410 in a processing position.

The head assembly 410 generally comprises a substrate holder assembly 450 and a substrate assembly actuator 458. The substrate assembly actuator 458 is mounted onto the mounting plate 460 and includes a head assembly shaft 462 extending downwardly through the mounting plate 460. The lower end of the head assembly shaft 462 is connected to the substrate holder assembly 450 to position the substrate holder assembly 450 in a processing position and in a substrate loading position.

Figure 7:
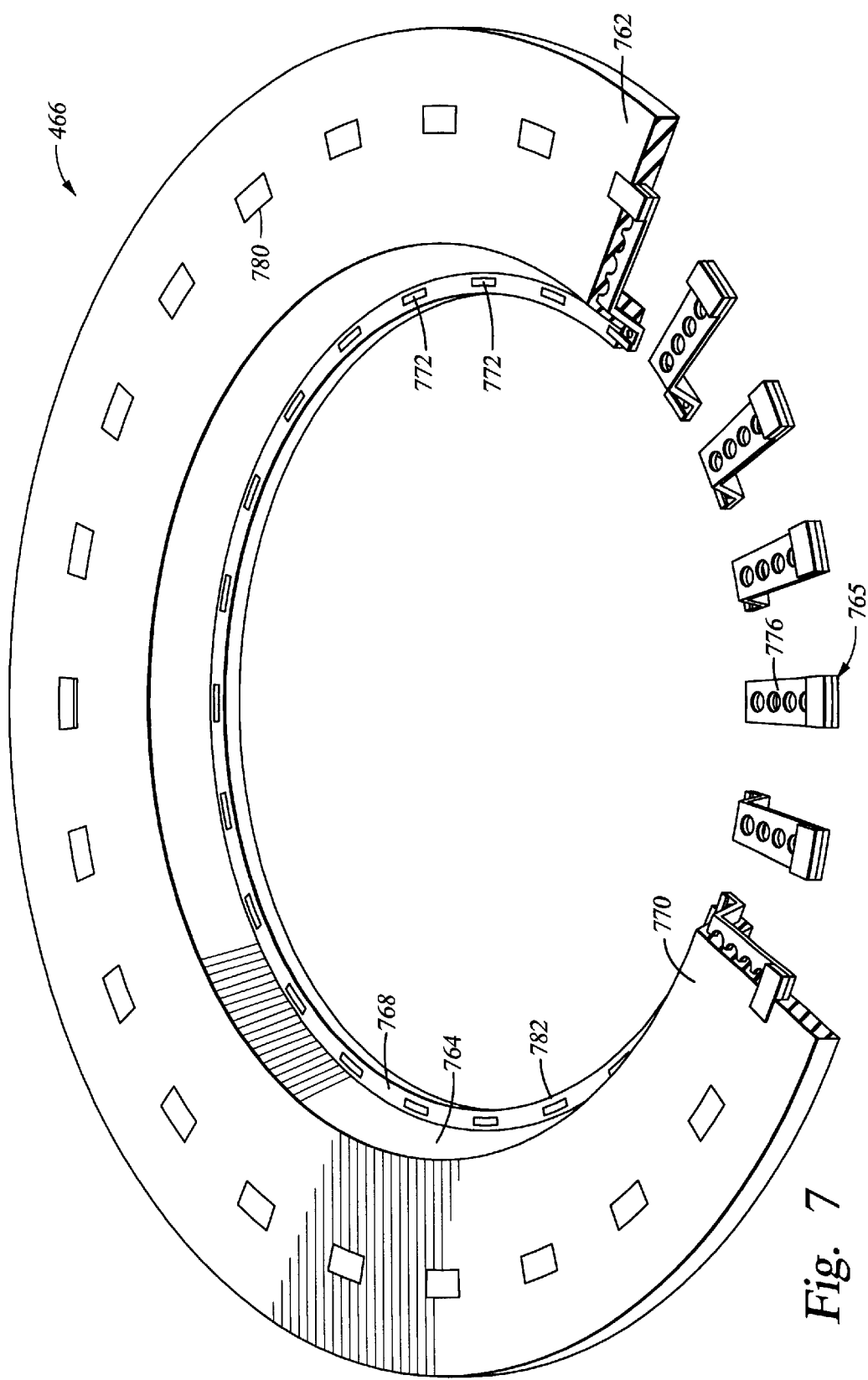
FIG. 7 is a partial cross sectional perspective view of an embodiment of electric contact element.

The substrate holder assembly 450 generally comprises a substrate holder element 464 and an electric contact element 466. FIG. 7 is a cross sectional view of one embodiment of an electric contact element 466. In general, the contact ring 466 comprises an annular body having a plurality of conducting members disposed thereon. The annular body is constructed of an insulating material to electrically isolate the plurality of conducting members. Together the body and conducting members form a diametrically interior substrate seating surface which, during processing, supports a substrate and provides a current thereto.

Referring now to FIG. 7 in detail, the contact ring 466 generally comprises a plurality of conducting members 765 at least partially disposed within an annular insulative body 770. The insulative body 770 is shown having a flange 762 and a downward sloping shoulder portion 764 leading to a substrate seating surface 768. The substrate seating surface 768 is located below the flange 762 such that the flange 762 and the substrate seating surface 768 lie in offset and substantially parallel planes. Thus, the flange 762 may be understood to define a first plane while the substrate seating surface 768 defines a second plane parallel to the first plane wherein the shoulder 764 is disposed between the two planes. However, contact ring design shown in FIG. 7 is intended to be merely illustrative. In another embodiment, the shoulder portion 764 may be of a steeper angle including a substantially vertical angle so as to be substantially normal to both the flange 762 and the substrate seating surface 768. Alternatively, the contact ring 466 may be substantially planar thereby eliminating the shoulder portion 764. However, for reasons described below, one embodiment comprises the shoulder portion 764 shown in FIG. 6 or some variation thereof.

The conducting members 765 are defined by a plurality of outer electric contact pads 780 annularly disposed on the flange 762, a plurality of inner electric contact pads 772 disposed on a portion of the substrate seating surface 768. A plurality of embedded conducting connectors 776 link the pads 772, 780 to one another. The conducting members 765 are isolated from one another by the insulative body 770 that may be made of a plastic such as polyvinylidenefluoride (PVDF), perfluoroalkoxy resin (PFA), TEFLON® (a registered trademark of the E. I. duPont de Nemoirs and Company of Wilmington, Del.), and TEFZEL® (a registered trademark of the E. I. duPont de Nemoirs and Company of Wilmington, Del.), or any other insulating material such as Alumina ($Al_2O_3$) or other ceramics. The outer contact pads 780 are coupled to a power supply, not shown, to deliver current and voltage to the inner electric contact pads 772 via the conducting connectors 776 during processing. In turn, the inner electric contact pads 772 supply the current and voltage to a substrate by maintaining contact around a peripheral portion of the substrate. Thus, in operation the conducting members 765 act as discrete current paths electrically connected to a substrate.

Low resistivity, and conversely high conductivity, are directly related to good plating. To ensure low resistivity, the conducting members 765 are preferably made of copper (Cu), platinum (Pt), tantalum (Ta), titanium (Ti), gold (Au), silver (Ag), stainless steel or other conducting materials. Low resistivity and low contact resistance may also be achieved by coating the conducting members 765 with a conducting material. Thus, the conducting members 765 may, for example, be made of copper having a resistivity of approximately $2 \times 10^{-8}$ Ω·m and be coated with platinum having a resistivity of approximately $10.6 \times 10^{-8}$ Ω·m. Coatings such as tantalum nitride (TaN), titanium nitride (TiN), rhodium (Rh), Au, Cu, or Ag on a conductive base materials such as stainless steel, molybdenum (Mo), Cu, and Ti are also possible. Further, since the contact pads 772, 780 are typically separate units bonded to the conducting connectors 776, the contact pads 772, 780 may comprise one material, such as Cu, and the conducting members 765 another, such as stainless steel. Either or both of the pads 772, 780 and conducting connectors 776 may be coated with a conducting material. Additionally, because plating repeatability may be adversely affected by oxidation that acts as an insulator, the inner electric contact pads 772 preferably comprise a material resistant to oxidation such as Pt, Ag, or Au.

Figures 8, 9:
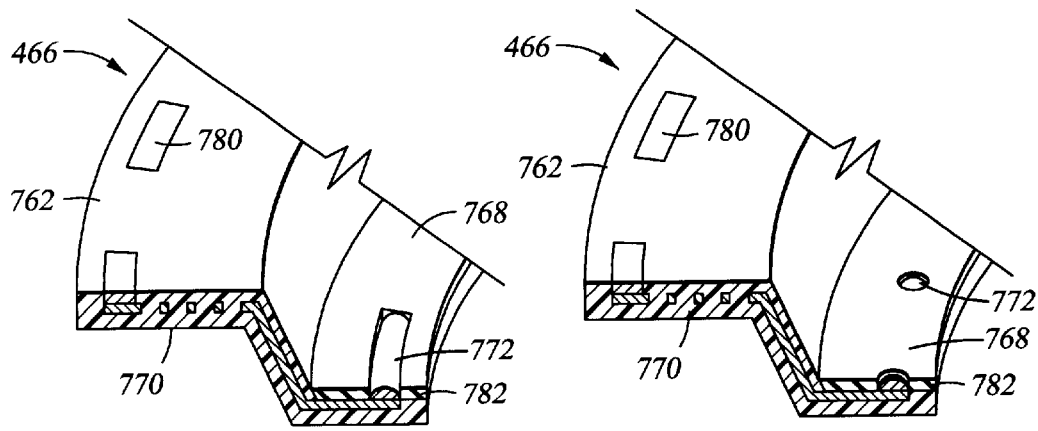
FIG. 8 is a cross sectional perspective view of the electric contact element showing an alternative embodiment of contact pads.
FIG. 9 is a cross sectional perspective view of the electric contact element showing an alternative embodiment of the contact pads and an isolation gasket.

In addition to being a function of the contact material, the total resistance of each circuit is dependent on the geometry, or shape, of the inner contact inner electric contact pads 772 and the force supplied by the contact ring 466. These factors define a constriction resistance, $R_{CR}$, at the interface of the inner electric contact pads 772 and the substrate seating surface 768 due to asperaties between the two surfaces. Generally, as the applied force is increased the apparent area is also increased. The apparent area is inversely related to $R_{CR}$ so that an increase in the apparent area results in a decreased $R_{CR}$. Thus, to minimize overall resistance it is preferable to maximize force. The maximum force applied in operation is limited by the yield strength of a substrate that may be damaged under excessive force and resulting pressure. However, because pressure is related to both force and area, the maximum sustainable force is also dependent on the geometry of the inner electric contact pads 772. Thus, while the contact pads 772 may have a flat upper surface as in FIG. 7, other shapes may be used to advantage. For example, two preferred shapes are shown in FIGS. 8 and 9. FIG. 8 shows a knife-edge contact pad and FIG. 9 shows a hemispherical contact pad. A person skilled in the art will readily recognize other shapes which may be used to advantage. A more complete discussion of the relation between contact geometry, force, and resistance is given in *Ney Contact Manual*, by Kenneth E. Pitney, The J. M. Ney Company, 1973, which is hereby incorporated by reference in its entirety.

The number of conducting connectors 776 may be varied depending on the particular number of contact pads 772 desired, shown in FIG. 7. For a 200 mm substrate, preferably at least twenty-four conducting connectors 776 are spaced equally over 360°. However, as the number of connectors reaches a critical level, the compliance of the substrate relative to the contact ring 466 is adversely affected. Therefore, while more than twenty-four conducting connectors 776 may be used, contact uniformity may eventually diminish depending on the topography of the contact pads 772 and the substrate stiffness. Similarly, while less than twenty-four conducting connectors 776 may be used, current flow is increasingly restricted and localized, leading to poor plating results. Since the dimensions are readily altered to suit a particular application. For example, the number of converters, the spacing between adjacent connectors, and the periphery of the circle that the connectors are mounted on may change between a process cell used for a 200 mm substrate and a process cell used for a 300 mm substrate.

Figure 10:
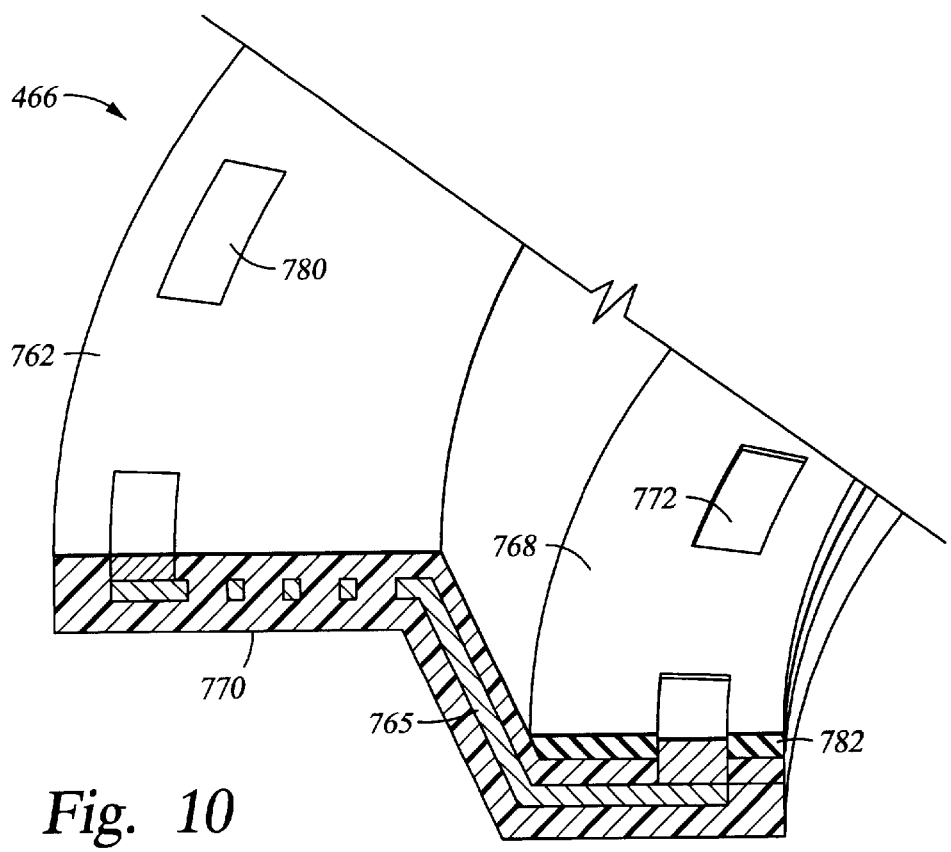
FIG. 10 is a cross sectional perspective view of the electric contact element showing the isolation gasket.

As shown in FIG. 10, the substrate seating surface 768 comprises an isolation gasket 782 disposed on the insulative body 770. The substrate seating surface extends diametrically interior to the inner electric contact pads 772 to define the inner diameter of the contact ring 466. The isolation gasket 782 preferably extends slightly above the inner electric contact pads 772, e.g., a few mils, and preferably comprises an elastomer such as VITON® (a registered trademark of the E. I. duPont de Nemoirs and Company of Wilmington, Del.), TEFLON®, buna rubber, and the like. Where the insulative body 770 also comprises an elastomer the isolation gasket 782 may be of the same material. In the latter embodiment, the isolation gasket 782 and the insulative body 770 may be monolithic, i.e., formed as a single piece. However, the isolation gasket 782 is preferably separate from the insulative body 770 so that it may be easily removed for replacement or cleaning.

While FIG. 10 shows one embodiment of the isolation gasket 782 wherein the isolation gasket is seated entirely on the insulative body 770, FIGS. 8 and 9 show an alternative embodiment. In the latter embodiment, the insulative body 770 is partially machined away to expose the upper surface of the conducting connectors 776 and the isolation gasket 782 is disposed thereon. Thus, the isolation gasket 782 contacts a portion of the conducting connectors 776. This design requires less material to be used for the inner electric contact pads 772 that may be advantageous where material costs are significant such as when the inner electric contact pads 772 comprise gold. Persons skilled in the art will recognize other embodiments.

During processing, the isolation gasket 782 maintains contact with a peripheral portion of the substrate plating surface and is compressed to provide a seal between the remaining electric contact element 466 and the substrate. The seal prevents the electrolyte solution from contacting the edge and backside of the substrate. As noted above, maintaining a clean contact surface is necessary to achieving high plating repeatability. Previous contact ring designs did not provide consistent plating results because contact surface topography varied over time. The contact ring limits, or substantially minimizes, deposits that would otherwise accumulate on the inner electric contact pads 772 and change their characteristics thereby producing highly repeatable, consistent, and uniform plating across the substrate plating surface.

Figure 11:
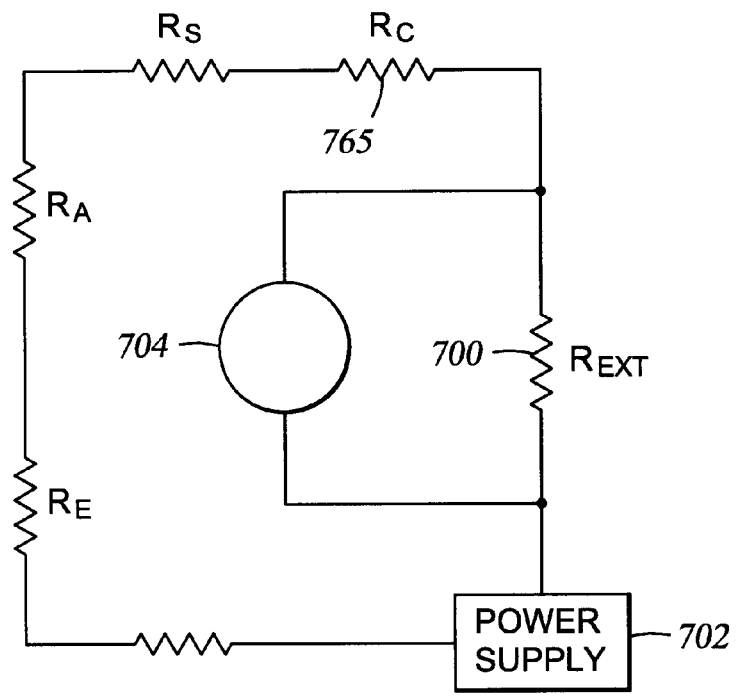
FIG. 11 is a simplified schematic diagram of the electric circuit representing the ECP system through each contact pin.

FIG. 11 is a simplified schematic diagram representing a possible configuration of the electric circuit for the contact ring 466. To provide a uniform current distribution between the conducting members 765, an external resistor 700 is connected in series with each of the conducting members 765. Preferably, the resistance value of the external resistor 700, represented as $R_{EXT}$, is much greater than the resistance of any other component of the circuit. As shown in FIG. 11, the electric circuit through each conducting member 765 is represented by the resistance of each of the components connected in series with the power supply 702. $R_E$ represents the resistance of the electrolyte solution, which is typically dependent on the distance between the anode and the electric contact element and the composition of the electrolyte solution chemistry. Thus, $R_A$ represents the resistance of the electrolyte solution adjacent the substrate plating surface 754. $R_S$ represents the resistance of the substrate plating surface 754, and $R_C$ represents the resistance of the conducting members 765 plus the constriction resistance resulting at the interface between the inner electric contact pads 772 and the substrate plating surface 754. Generally, the resistance value of the external resistor ($R_{EXT}$) is at least as much as $\Sigma R$, where $\Sigma R$ equals the sum of $R_E$, $R_A$, $R_S$ and $R_C$. Preferably, the resistance value of the external resistor ($R_{EXT}$) is much greater than $\Sigma R$ such that $\Sigma R$ is negligible and the resistance of each series circuit approximates $R_{EXT}$.

Typically, one power supply is connected to all of the outer contact pads 780 of the electric contact element 466, resulting in parallel circuits through the inner electric contact pads 772. However, as the inner electric contact pad-to-substrate interface resistance varies with each inner electric contact pad 772, more current will flow, and thus more plating will occur, at the site of lowest resistance. However, by placing an external resistor in series with each conducting member 765, the value or quantity of electric current passed through each conducting member 765 becomes controlled mainly by the value of the external resistor. The variations in the electric properties between each of the inner electric contact pads 772 do not affect the current distribution on the substrate. A uniform current density results across the plating surface that contributes to a uniform plating thickness. The external resistors also provide a uniform current distribution between different substrates of a process-sequence.

Although the contact ring 466 is designed to resist deposit buildup on the inner electric contact pads 772, over multiple substrate plating cycles the substrate-pad interface resistance may increase, eventually reaching an unacceptable value. An electronic sensor/alarm 704 can be connected across the external resistor 700 to monitor the voltage/current across the external resistor to address this problem. If the voltage/current across the external resistor 700 falls outside of a preset operating range that is indicative of a high substrate-pad resistance, the sensor/alarm 704 triggers corrective measures such as shutting down the plating process until the problems are corrected by an operator. Alternatively, a separate power supply can be connected to each conducting member 765 and can be separately controlled and monitored to provide a uniform current distribution across the substrate. A very smart system (VSS) may also be used to modulate the current flow. The VSS typically comprises a processing unit and any combination of devices known in the industry used to supply and/or control current such as variable resistors, separate power supplies, etc. As the physiochemical, and hence electric, properties of the inner electric contact pads 772 change over time, the VSS processes and analyzes data feedback. The data is compared to pre-established setpoints and the VSS then makes appropriate current and voltage alterations to ensure uniform deposition.

Figure 18:
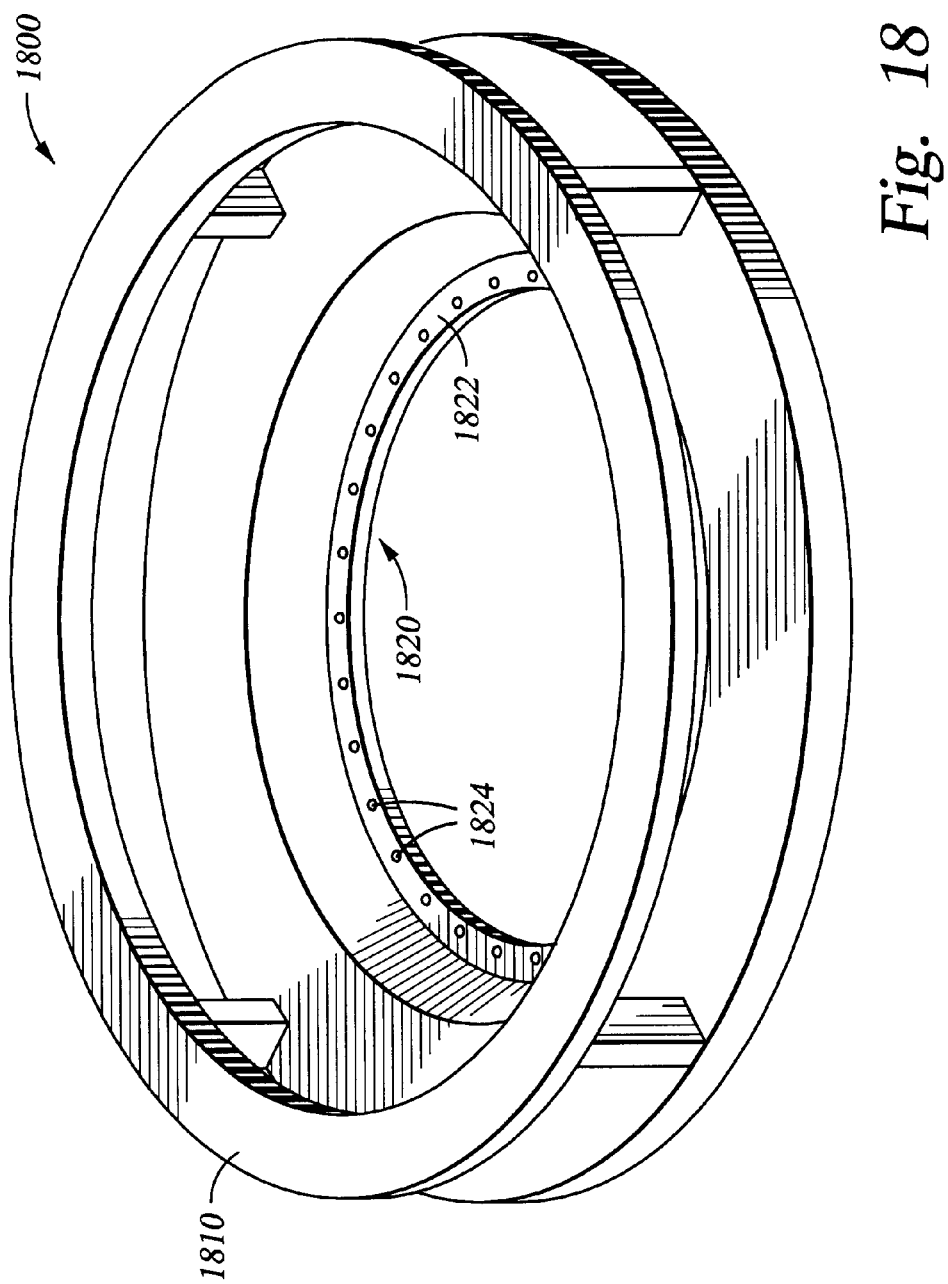
FIG. 18 is a perspective view of an alternative embodiment of an electric contact element.

FIG. 18 is a perspective view of an alternative embodiment of an electric contact element. The electric contact element 1800 as shown in FIG. 18 comprises a conductive metal or a metal alloy, such as stainless steel, copper, silver, gold, platinum, titanium, tantalum, and other conductive materials, or a combination of conductive materials, such as stainless steel coated with platinum. The electric contact element 1800 includes an upper mounting portion 1810 adapted for mounting the electric contact element onto the substrate holder assembly and a lower substrate receiving portion 1820 adapted for receiving a substrate therein. The substrate receiving portion 1820 includes an annular substrate seating surface 1822 having a plurality of contact pads or bumps 1824 disposed thereon and preferably evenly spaced apart. When a substrate is positioned on the substrate seating surface 1822, the contact pads 1824 physically contact a peripheral region of the substrate to provide electric contact to the electroplating seed layer on the substrate deposition surface. Preferably, the contact pads 1824 are coated with a noble metal, such as platinum or gold, that is resistant to oxidation.

The exposed surfaces of the electric contact element, except the surfaces of the contact pads that come in contact with the substrate, are preferably treated to provide hydrophilic surfaces or coated with a material that exhibits hydrophilic properties. Hydrophilic materials and hydrophilic surface treatments are known in the art. One company providing a hydrophilic surface treatment is Millipore Corporation, located in Bedford, Mass. The hydrophilic surface significantly reduces beading of the electrolyte solution on the surfaces of the electric contact element and promotes smooth dripping of the electrolyte solution from the electric contact element after the electric contact element is removed from the electroplating bath or electrolyte solution. By providing hydrophilic surfaces on the electric contact element that facilitate run-off of the electrolyte solution, plating defects caused by residual electrolyte solution on the electric contact element are significantly reduced. The inventors also contemplate application of this hydrophilic treatment or coating in other embodiments of electric contact elements to reduce residual electrolyte solution beading on the electric contact element and the plating defects on a subsequently processed substrate that may result therefrom.

Figure 12:
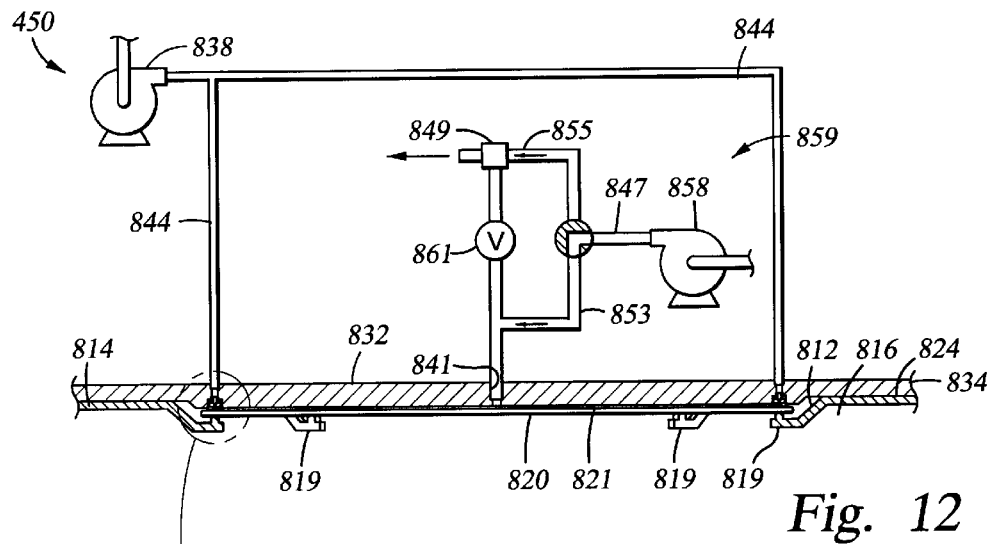
FIG. 12 is a cross sectional view of an embodiment of substrate holder assembly.
Figure 12A:
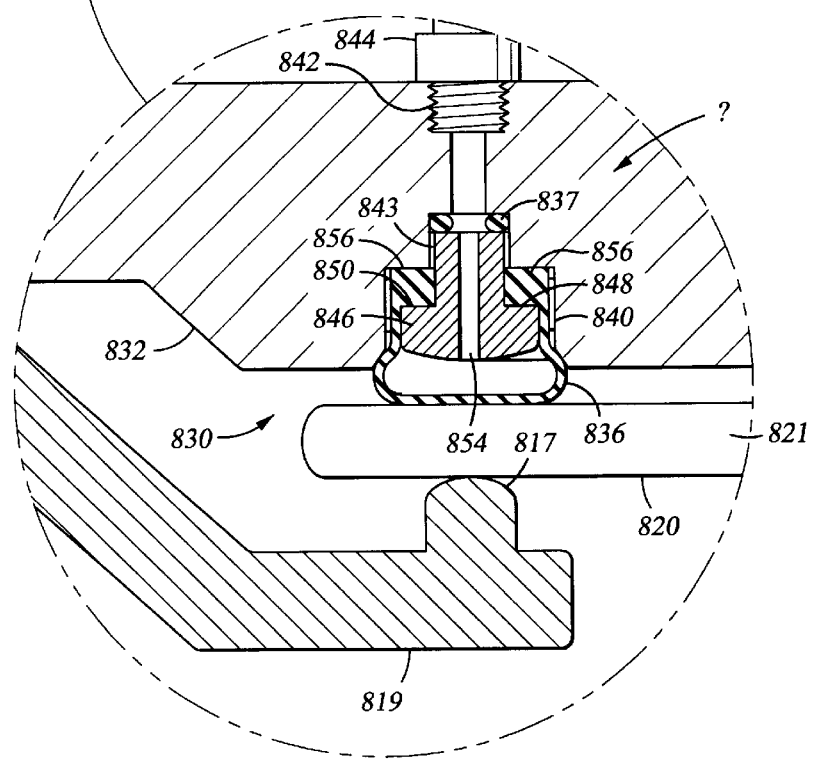
FIG. 12A is an enlarged cross sectional view of the bladder area of FIG. 12.

Referring to FIGS. 12 and 12A, one embodiment of substrate holder element 464 is provided that is preferably positioned above the electric contact element 466 and comprises a bladder assembly 470 that provides pressure to the backside of a substrate and ensures electric contact between the substrate plating surface and the electric contact element 466. The inflatable bladder assembly 470 is disposed on a substrate holder plate 832. A bladder 836 disposed on a lower surface of the substrate holder plate 832 is thus located opposite and adjacent to the contacts on the electric contact element 466 with the substrate 821 interposed therebetween. A fluid source 838 supplies a fluid, i.e., a gas or liquid, to the bladder 836 allowing the bladder 836 to be inflated to varying degrees. While this embodiment of substrate holder is provided in which the substrate is attached to the substrate holder plate 838. It is typical that a thrust plate may be utilized in a substrate holder system so that the thrust plate exerts a biasing force against the backside of the substrate so the seed layer, on the front side, is biased into contact with the electronic contact elements.

Referring now to FIGS. 12, 12A, and 13, the details of one embodiment of the bladder assembly 470 is discussed. The substrate holder plate 832 is shown as substantially disc-shaped having an annular recess 840 formed on a lower surface and a centrally disposed vacuum port 841. One or more inlets 842 are formed in the substrate holder plate 832 and lead into the relatively enlarged annular mounting channel 843 and the annular recess 840. Quick-disconnect hoses 844 couple the fluid source 838 to the inlets 842 to provide a fluid thereto. The vacuum port 841 is preferably attached to a vacuum/pressure pumping system 859 adapted to selectively supply a pressure or create a vacuum at a backside of the substrate 821. The pumping system 859, shown in FIG. 12, comprises a pump 845, a cross-over valve 847, and a vacuum ejector 849, commonly known as a venturi. One vacuum ejector that may be used to advantage is available from SMC Pneumatics, Inc., of Indianapolis, Ind. The pump 845 may be a commercially available compressed gas source and is coupled to one end of a hose 851, the other end of the hose 851 being coupled to the vacuum port 841. The hose 851 is split into a pressure line 853 and a vacuum line 855 having the vacuum ejector 849 disposed therein. Fluid flow is controlled by the cross-over valve 847 that selectively switches communication with the pump 845 between the pressure line 853 and the vacuum line 855. Preferably, the cross-over valve has an OFF setting whereby fluid is restricted from flowing in either direction through hose 851. A shut-off valve 861 disposed in hose 851 prevents fluid from flowing from pressure line 855 upstream through the vacuum ejector 849. The desired direction of fluid flow is indicated by arrows.

Where the fluid source 838 is a gas supply it may be coupled to hose 851 thereby eliminating the need for a separate compressed gas supply, ie., pump 845. Further, a separate gas supply and vacuum pump may supply the backside pressure and vacuum conditions. While it is preferable to allow for both a backside pressure as well as a backside vacuum, a simplified embodiment may comprise a pump capable of supplying only a backside vacuum. However, as will be explained below, deposition uniformity may be improved where a backside pressure is provided during processing. Therefore, an arrangement such as the one described above including a vacuum ejector and a cross-over valve is preferred.

Figure 14:
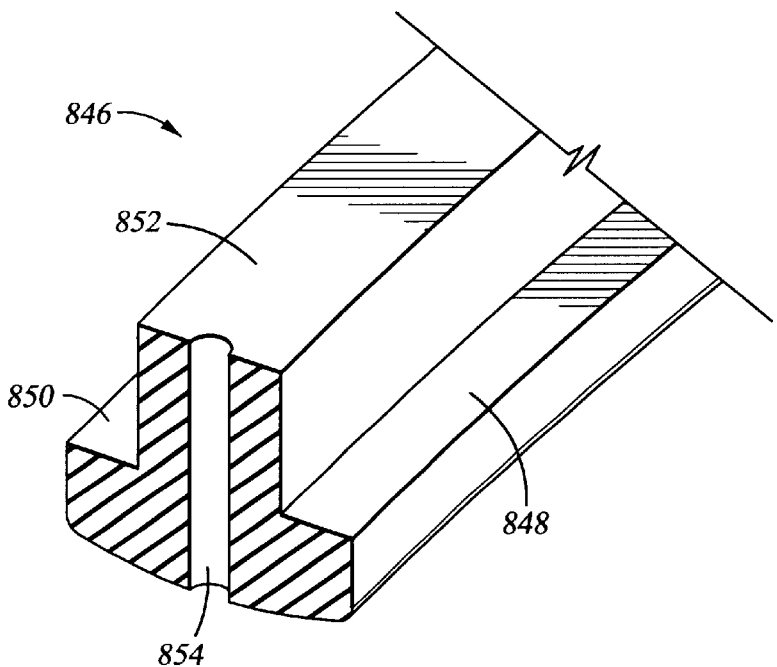
FIG. 14 is a partial cross sectional view of a manifold.

Referring now to FIGS. 12A and 14, a substantially circular ring-shaped manifold 846 is disposed in the annular recess 840. The manifold 846 comprises a mounting rail 852 disposed between an inner shoulder 848 and an outer shoulder 850. The mounting rail 852 is adapted to be at least partially inserted into the annular mounting channel 843. A plurality of fluid outlets 854 formed in the manifold 846 provide communication between the inlets 842 and the bladder 836. Seals 837, such as O-rings, are disposed in the annular manifold channel 843 in alignment with the inlet 842 and outlet 854 and secured by the substrate holder plate 832 to ensure an airtight seal. Conventional fasteners, not shown, such as screws may be used to secure the manifold 846 to the substrate holder plate 832 via cooperating threaded bores, not shown, formed in the manifold 846 and the substrate holder plate 832.

Figure 15:
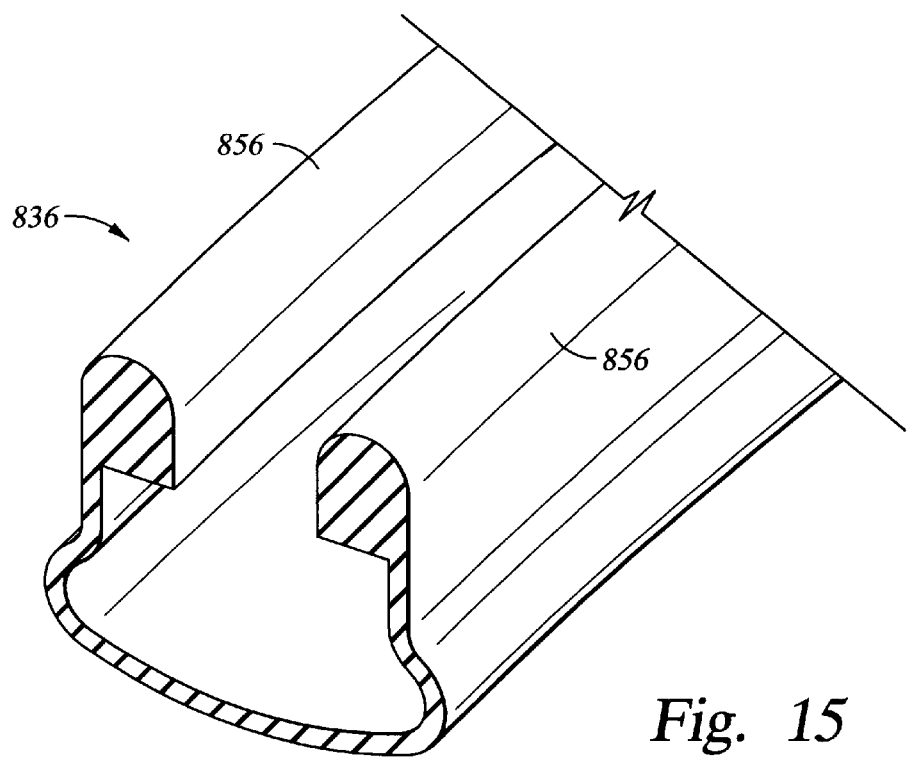
FIG. 15 is a partial cross sectional view of a bladder.

Referring now to FIG. 15, the bladder 836 is shown, in section, as an elongated substantially semi-tubular piece of material having annular lip seals 856, or nodules, at each edge. In FIG. 12A, the lip seals 856 are shown disposed on the inner shoulder 848 and the outer shoulder 850. A portion of the bladder 836 is compressed against the walls of the annular recess 840 by the manifold 846 which has a width slightly less, e.g. a few millimeters, than the annular recess 840. Thus, the manifold 846, the bladder 836, and the annular recess 840 cooperate to form a fluid-tight seal. To prevent fluid loss, the bladder 836 is preferably comprised of some fluid impervious material such as silicon rubber or any comparable elastomer that is chemically inert with respect to the electrolyte solution and exhibits reliable elasticity. Where needed a compliant covering 857 may be disposed over the bladder 836, as shown in FIG. 15, and secured by means of an adhesive or thermal bonding. The covering 857 preferably comprises an elastomer such as VITON® (a registered trademark of the E. I. duPont de Nemoirs and Company of Wilmington, Del.), buna rubber or the like. The covering may be reinforced by KEVLAR® (a registered trademark of the E. I. duPont de Nemoirs and Company of Wilmington, Del.), for example. In one embodiment, the covering 857 and the bladder 836 comprise the same material. The covering 857 has particular application where the bladder 836 is liable to rupturing. Alternatively, the bladder 836 thickness may simply be increased during its manufacturing to reduce the likelihood of puncture. Preferably, the exposed surface of the bladder 836, if uncovered, and the exposed surface of the covering 857 are coated or treated to provide a hydrophilic surface as discussed above for the surfaces of the electric contact element. The hydrophilic surface promotes dripping and removal of the residual electrolyte solution after the head assembly is lifted above the process cell.

The precise number of inlets 842 and outlets 854 may be varied according to the particular application. For example, while FIG. 12 shows two inlets with corresponding outlets, an alternative embodiment could employ a single fluid inlet that supplies fluid to the bladder 836.

In operation, the substrate 821 is introduced into the container body 802 by securing it to the lower side of the substrate holder plate 832. This is accomplished by engaging the pumping system 159 to evacuate the space between the substrate 821 and the substrate holder plate 832 via port 841 thereby creating a vacuum condition. The bladder 836 is then inflated by supplying a fluid such as air or water from the fluid source 838 to the inlets 842. The fluid is delivered into the bladder 836 via the manifold outlets 854, thereby pressing the substrate 821 uniformly against the contacts of the electric contact element 466. The electroplating process is then carried out. Electrolyte solution is then pumped into the process cell 420 toward the substrate 821 to contact the exposed substrate plating surface 820. The power supply provides a negative bias to the substrate plating surface 820 via the electric contact element 466. As the electrolyte solution is flowed across the substrate plating surface 820, ions in the electrolytic solution are attracted to the surface 820 and deposit on the surface 820 to form the desired film.

Because of its flexibility, the bladder 836 deforms to accommodate the asperaties of the substrate backside and contacts of the electric contact element 466 thereby mitigating misalignment with the conducting electric contact element 466. The compliant bladder 836 prevents the electrolyte solution from contaminating the backside of the substrate 821 by establishing a fluid tight seal at a perimeter portion of a backside of the substrate 821. Once inflated, a uniform pressure is delivered downward toward the electric contact element 466 to achieve substantially equal force at all points where the substrate 821 and electric contact element 466 interface. The force can be varied as a function of the pressure supplied by the fluid source 838. Further, the effectiveness of the bladder assembly 470 is not dependent on the configuration of the electric contact element 466. For example, while FIG. 12 shows a pin configuration having a plurality of discrete contact points, the electric contact element 466 may also be a continuous surface.

Because the force delivered to the substrate 821 by the bladder 836 is variable, adjustments can be made to the current flow supplied by the contact ring 466. As described above, an oxide layer may form on the electric contact element 466 and act to restrict current flow. However, increasing the pressure of the bladder 836 may counteract the current flow restriction due to oxidation. As the pressure is increased, the malleable oxide layer is compromised and superior contact between the electric contact element 466 and the substrate 821 results. The effectiveness of the bladder 836 in this capacity may be further improved by altering the geometry of the electric contact element 466. For example, a knife-edge geometry is likely to penetrate the oxide layer more easily than a dull rounded edge or flat edge.

Additionally, the fluid tight seal provided by the inflated bladder 836 allows the pump 845 to maintain a backside vacuum or pressure either selectively or continuously, before, during, and after processing. Generally, however, the pump 845 is run to maintain a vacuum only during the transfer of substrates to and from the electroplating process cell 400 because it has been found that the bladder 836 is capable of maintaining the backside vacuum condition during processing without continuous pumping. Thus, while inflating the bladder 836, as described above, the backside vacuum condition is simultaneously relieved by disengaging the pumping system 859, e.g., by selecting an OFF position on the cross-over valve 847. Disengaging the pumping system 859 may be abrupt or comprise a gradual process whereby the vacuum condition is ramped down. Ramping allows for a controlled exchange between the inflating bladder 836 and the simultaneously decreasing backside vacuum condition. This exchange may be controlled manually or by computer.

As described above, continuous backside vacuum pumping while the bladder 836 is inflated is not needed and may actually cause the substrate 820 to buckle or warp leading to undesirable deposition results. It may, however, be desirable to provide a backside pressure to the substrate 820 in order to cause a "bowing" effect of the substrate to be processed. Bowing (i.e., curving the surface) the substrate may result in a desired deposition profile across the radius of the substrate. Thus, pumping system 859 is capable of selectively providing a vacuum or pressure condition to the substrate backside. For a 200 mm substrate a backside pressure up to 5 psi is preferable to bow the substrate. Because substrates typically exhibit some measure of pliability, a backside pressure causes the substrate to bow or assume a convex shape relative to the upward flow of the electrolyte solution. The degree of bowing is variable according to the pressure supplied by pumping system 859.

While FIG. 12A shows one embodiment of bladder 836 having a surface area sufficient to cover a relatively small perimeter portion of the substrate backside at a diameter substantially equal to the electric contact element 466, the bladder assembly 470 may be geometrically varied. Thus, the bladder assembly may be constructed using more fluid impervious material to cover an increased surface area of the substrate 821.

Figure 19:
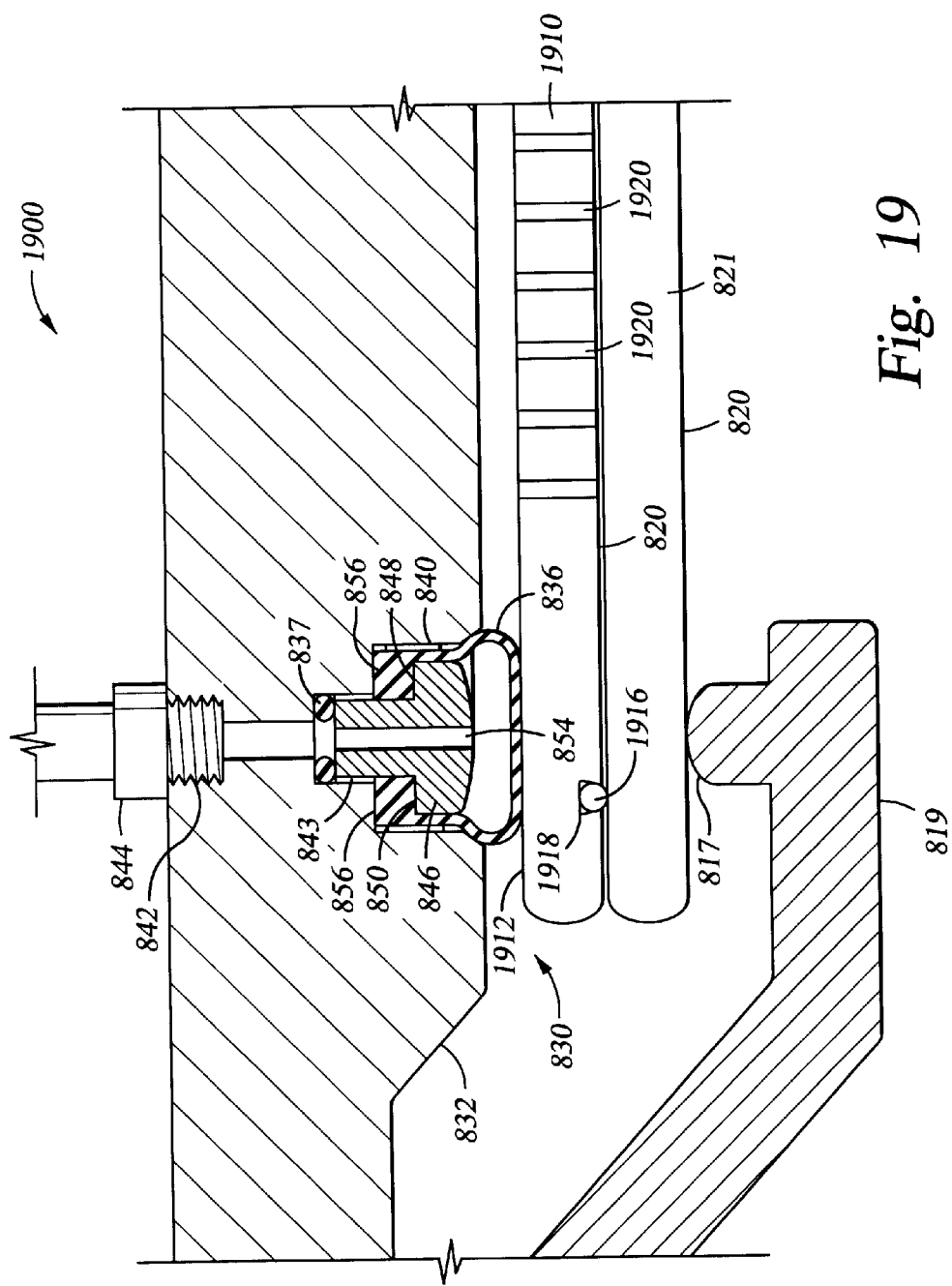
FIG. 19 is a partial cross sectional view of an alternative embodiment of a substrate holder assembly.

FIG. 19 is a partial cross sectional view of an alternative embodiment of a substrate holder assembly. The alternative substrate holder assembly 1900 comprises a bladder assembly 470, as described above, having the inflatable bladder 836 attached to the back surface of an intermediary substrate holder plate 1910. Preferably, a portion of the inflatable bladder 836 is sealingly attached to the back surface 1912 of the intermediary substrate holder plate 1910 using an adhesive or other bonding material. The front surface 1914 of the intermediary substrate holder plate 1910 is adapted to receive a substrate 821 to be processed, and an elastomeric o-ring 1916 is disposed in an annular groove 1918 on the front surface 1914 of the intermediary substrate holder plate 1910 to contact a peripheral portion of the substrate back surface. The elastomeric O-ring 1916 provides a seal between the substrate back surface and the front surface of the intermediary substrate holder plate. Preferably, the intermediary substrate holder plate includes a plurality of bores or holes 1920 extending through the plate that are in fluid communication with the vacuum port 841 to facilitate securing the substrate on the substrate holder using a vacuum force applied to the backside of the substrate. According to this alternative embodiment of the substrate holder assembly, the inflatable bladder does not directly contact a substrate being processed, and thus the risk of cutting or damaging the inflatable bladder during substrate transfers is significantly reduced. The elastomeric O-ring 1916 is preferably coated or treated to provide a hydrophilic surface, as discussed above for the surfaces of the electric contact element, for contacting the substrate, and the elastomeric O-ring 1916 is replaced as needed to ensure proper contact and seal to the substrate.

In one embodiment, the uniformity of the deposited film so the maximum deviation of deposited film thickness is at about 2% of the average film thickness, while standard electroplating processes typically achieves uniformity at best within about 5.5%. However, rotation of the head assembly is not necessary to achieve uniform electroplating deposition in some instances, particularly where the uniformity of electroplating deposition is achieved by adjusting the processing parameters, such as the electrolyte solution chemistry, electrolyte solution flow and other parameters.

Referring back to FIG. 6, a cross sectional view of an electroplating process cell 400, the substrate holder assembly 450 is positioned above the process cell 420. The process cell 420 generally comprises a bowl 430, a container body 472, an anode assembly 474 and a filter 476. Preferably, the anode assembly 474 is disposed below the container body 472 and attached to a lower portion of the container body 472, and the filter 476 is disposed between the anode assembly 474 and the container body 472. The container body 472 is preferably a cylindrical body comprised of an electrically insulative material, such as ceramics, plastics, PLEXIGLAS® (acrylic), lexane, PVC, CPVC, and PVDF. Alternatively, the container body 472 can be made from a metal, such as stainless steel, nickel and titanium, which is coated with an insulating layer, such as TEFLON®, PVDF, plastic, rubber and other combinations of materials that do not dissolve in the electrolyte solution and can be electrically insulated from the electrodes, i.e., the anode and cathode of the ECP system. The container body 472 is preferably sized and adapted to conform to the substrate plating surface and the shape of the substrate being processed through the system, the substrate is typically either circular or rectangular in shape. One preferred embodiment of the container body 472 comprises a cylindrical ceramic tube having an inner diameter that has about the same dimension as or slightly larger than the substrate diameter. The inventors have discovered that the rotational movement typically required in typical ECP system s is not required to achieve uniform plating results when the size of the container body conforms to about the size of the substrate plating surface.

An upper portion of the container body 472 extends radially outwardly to form an annular weir 478. The weir 478 extends over the inner wall 446 of the electrolyte solution collector 440 and allows the electrolyte solution to flow into the electrolyte solution collector 440. The upper surface of the weir 478 preferably matches the lower surface of the electric contact element 466. Preferably, the upper surface of the weir 478 includes an inner annular flat portion 480, a middle inclined portion 482 and an outer declined portion 484. When a substrate is positioned in the processing position, the substrate plating surface is positioned above the cylindrical opening of the container body 472, and a gap for electrolyte solution flow is formed between the lower surface of the electric contact element 466 and the upper surface of the weir 478. The lower surface of the electric contact element 466 is disposed above the inner flat portion 480 and the middle inclined portion of the weir 478. The outer declined portion 484 is sloped downwardly to facilitate flow of the electrolyte solution into the electrolyte solution collector 440.

A lower portion of the container body 472 extends radially outwardly to form a lower annular flange 486 for securing the container body 472 to the bowl 430. The outer dimension, i.e., circumference, of the annular flange 486 is smaller than the dimensions of the opening 444 and the inner circumference of the electrolyte solution collector 440. These relative dimensions allow removal and replacement of the process cell 420 from the electroplating process cell 400. Preferably, a plurality of bolts 488 are fixedly disposed on the annular flange 486 and extend downwardly through matching bolt holes on the bowl 430. A plurality of removable fastener nuts 490 secure the process cell 420 onto the bowl 430. A seal 487, such as an elastomer O-ring, is disposed between container body 472 and the bowl 430 radially inwardly from the bolts 488 to prevent leaks from the process cell 420. The nuts/bolts combination facilitates fast and easy removal and replacement of the components of the process cell 420 during maintenance.

Preferably, the filter 476 is attached to and completely covers the lower opening of the container body 472, and the anode assembly 474 is disposed below the filter 476. A spacer 492 is disposed between the filter 476 and the anode assembly 474. Preferably, the filter 476, the spacer 492, and the anode assembly 474 are fastened to a lower surface of the container body 472 using removable fasteners, such as screws and/or bolts. Alternatively, the filter 476, the spacer 492, and the anode assembly 474 are removably secured to the bowl 430.

The anode assembly 474 preferably comprises a consumable anode that serves as a metal source in the electrolyte solution. Alternatively, the anode assembly 474 comprises a non-consumable anode, and the metal to be electroplated is supplied within the electrolyte solution from the electrolyte solution system 220. As shown in FIG. 6, the anode assembly 474 is a self-enclosed module having a porous anode enclosure 494 preferably made of the same metal as the metal to be electroplated, such as copper. Alternatively, the anode enclosure 494 is made of porous materials, such as ceramics or polymeric membranes. A soluble metal 496, such as high purity copper for electrochemical plating of copper, is disposed within the anode enclosure 494. The soluble metal 496 preferably comprises metal particles, wires or a perforated sheet. The porous anode enclosure 494 also acts as a filter that keeps the particulates generated by the dissolving metal within the anode enclosure 494. As compared to a non-consumable anode, the consumable, i.e., soluble, anode provides gas-generation-free electrolyte solution and minimizes the need to constantly replenish the metal in the electrolyte solution.

An anode electrode contact 498 is inserted through the anode enclosure 494 to provide electric connection to the soluble metal 496 from a power supply. Preferably, the anode electrode contact 498 is made from a conductive material that is insoluble in the electrolyte solution, such as titanium, platinum and platinum-coated stainless steel. The anode electrode contact 498 extends through the bowl 430 and is connected to an electric power supply. Preferably, the anode electric contact 498 includes a threaded portion 497 for a fastener nut 499 to secure the anode electric contact 498 to the bowl 430, and a seal 495, such as a elastomer washer, is disposed between the fastener nut 499 and the bowl 430 to prevent leaks from the process cell 420.

The bowl 430 generally comprises a cylindrical portion 502 and a bottom portion 504. An upper annular flange 506 extends radially outwardly from the top of the cylindrical portion 502. The upper annular flange 506 includes a plurality of holes 508 that matches the number of bolts 488 from the lower annular flange 486 of the container body 472. To secure the upper annular flange 506 of the bowl 430 and the lower annular flange 486 of the container body 472, the bolts 488 are inserted through the holes 508, and the fastener nuts 490 are fastened onto the bolts 488. Preferably, the outer dimension, i.e., circumference, of the upper annular flange 506 is about the same as the outer dimension, i.e., circumference, of the lower annular flange 486. Preferably, the lower surface of the upper annular flange 506 of the bowl 430 rests on a support flange of the mainframe 214 when the process cell 420 is positioned on the mainframe 214.

The inner circumference of the cylindrical portion 502 accommodates the anode assembly 474 and the filter 476. Preferably, the outer dimensions of the filter 476 and the anode assembly 474 are slightly smaller than the inner dimension of the cylindrical portion 502 to force a substantial portion of the electrolyte solution to flow through the anode assembly 474 first before flowing through the filter 476. The bottom portion 504 of the bowl 430 includes an electrolyte solution inlet 510 that connects to an electrolyte solution supply line from the electrolyte solution system 220. Preferably, the anode assembly 474 is disposed about a middle portion of the cylindrical portion 502 of the bowl 430 to provide a gap for electrolyte solution flow between the anode assembly 474 and the electrolyte solution inlet 510 on the bottom portion 504.

The electrolyte solution inlet 510 and the electrolyte solution supply line are preferably connected by a releasable connector that facilitates easy removal and replacement of the process cell 420. When the process cell 420 needs maintenance, the electrolyte solution is drained from the process cell 420, and the electrolyte solution flow in the electrolyte solution supply line is discontinued and drained. The connector for the electrolyte solution supply line is released from the electrolyte solution inlet 510, and the electric connection to the anode assembly 474 is also disconnected. The head assembly 410 is raised or rotated to provide clearance for removal of the process cell 420. The process cell 420 is then removed from the mainframe 214, and a new or reconditioned is replaced into the mainframe 214.

Alternatively, the bowl 430 can be secured onto the support flange of the mainframe 214, and the container body 472 along with the anode and the filter are removed for maintenance. In this case, the nuts securing the anode assembly 474 and the container body 472 to the bowl 430 are removed to facilitate removal of the anode assembly 474 and the container body 472. New or reconditioned anode assembly 474 and container body 472 are then replaced into the mainframe 214 and secured to the bowl 430.

Figure 20:
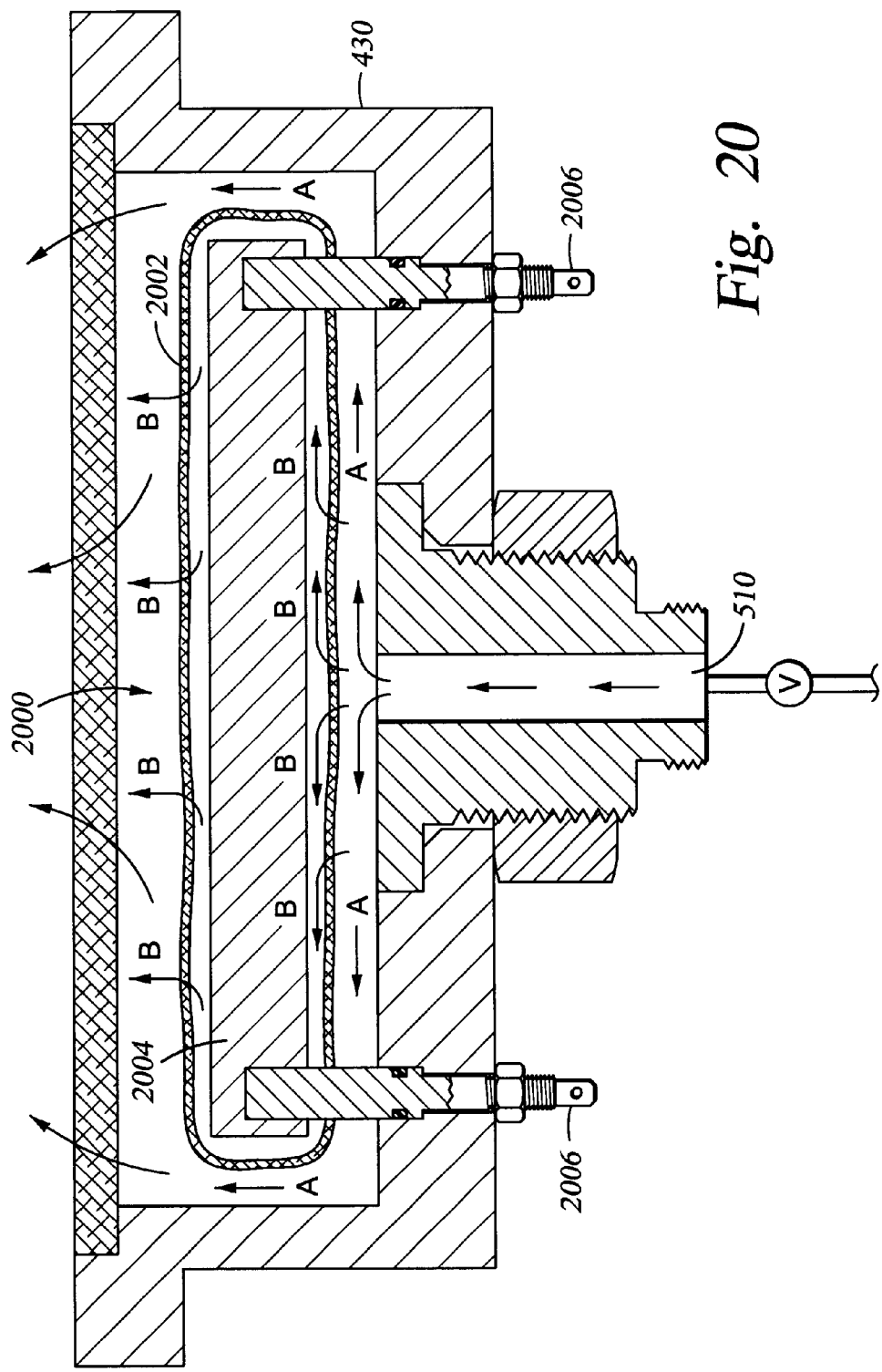
FIG. 20 is a cross sectional view of an embodiment of an encapsulated anode.

FIG. 20 is a cross sectional view of one embodiment of an encapsulated anode. The encapsulated anode 2000 includes a permeable anode enclosure that filters or traps "anode sludge" or particulates generated as the metal is dissolved from the anode plate 2004. As shown in FIG. 20, the consumable anode plate 2004 comprises a solid piece of copper enclosed in a hydrophilic anode encapsulation membrane 2002. Preferably, the copper is a high purity, oxygen free copper. The anode plate 2004 is secured and supported by a plurality of electric contacts or feed-throughs 2006 that extend through the bottom of the bowl 430. The electric contacts or feed-throughs 2006 extend through the anode encapsulation membrane 2002 into the bottom surface of the anode plate 2004. The flow of the electrolyte solution is indicated by the arrows A from the electrolyte solution inlet 510 disposed at the the bottom of the bowl 430 through the gap between the anode and the bowl sidewall. The electrolyte solution also flows through the anode encapsulation membrane 2002 by permeation into and out of the gap between the anode encapsulation membrane and the anode plate, as indicated by the arrows B. Preferably, the anode encapsulation membrane 2002 comprises a hydrophilic porous membrane, such as a modified polyvinyllidene fluoride membrane, having porosity between about 60% and 80%, more preferably about 70%, and pore sizes between about 0.025 μm and about 1 μm, more preferably between about 0.1 μm and about 0.2 μm. One example of a hydrophilic porous membrane is the Durapore Hydrophilic Membrane, available from Millipore Corporation, located in Bedford, Mass. As the electrolyte solution flows through the encapsulation membrane, anode sludge and particulates generated by the dissolving anode are filtered or trapped by the encapsulation membrane. Thus, the encapsulation membranes improve the purity of the electrolyte solution during the electroplating process, and defect formations on the substrate during the electroplating process caused by anode sludge and contaminant particulates are significantly reduced.

Figure 21:
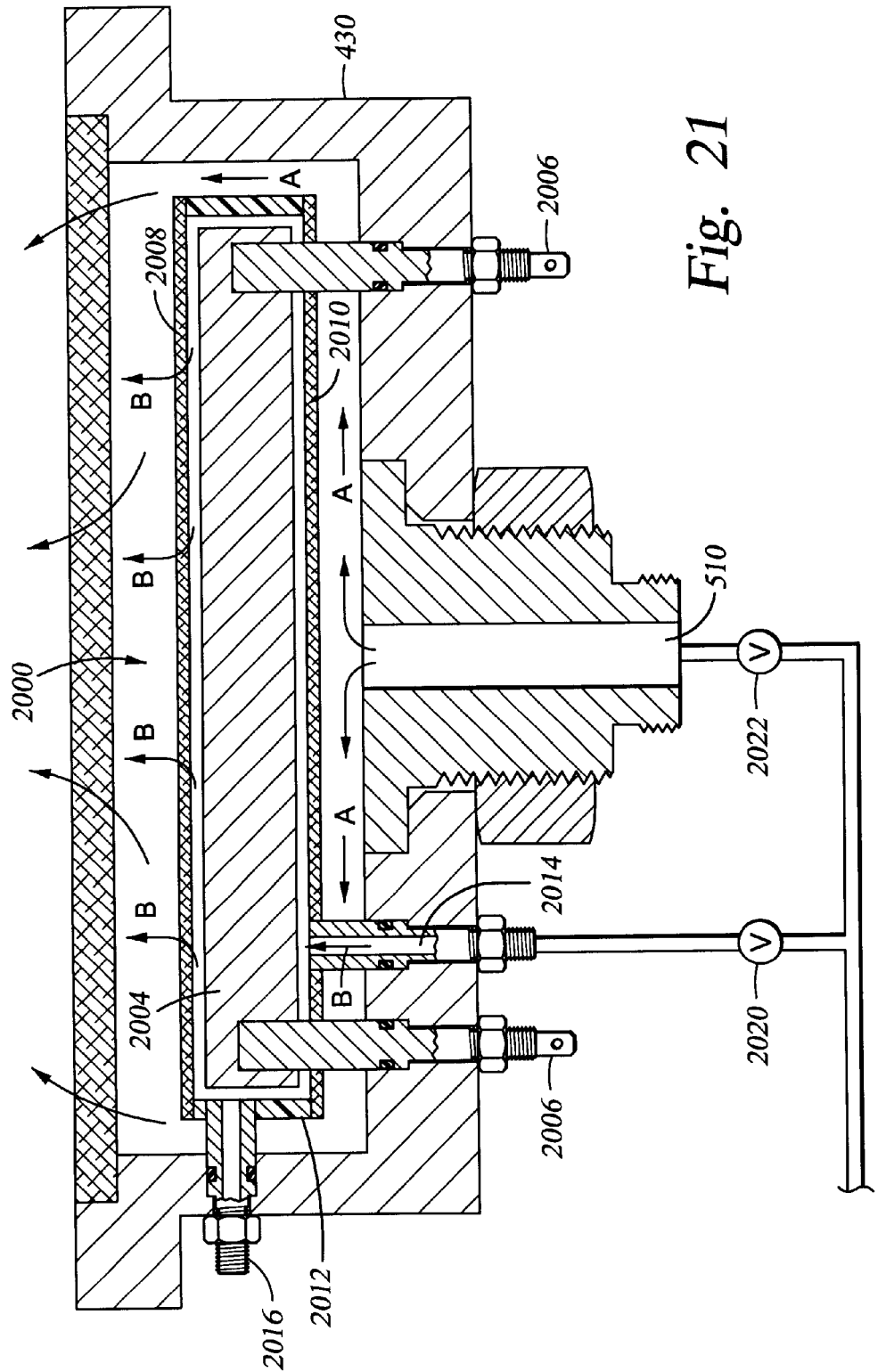
FIG. 21 is a cross sectional view of another embodiment of an encapsulated anode.

FIG. 21 is a cross sectional view of another embodiment of an encapsulated anode. The anode plate 2004 is secured and supported on the electric feed-throughs 2006. A top encapsulation membrane 2008 and a bottom encapsulation membrane 2010, disposed respectively above and below the anode plate 2004, are attached to a membrane support ring 2012 that is disposed around the anode plate 2004. The top and bottom encapsulation membranes 2008, 2010 comprise a material from the list above for encapsulation membrane of the encapsulated anode. The membrane support ring 2012 preferably comprises a relatively rigid material as compared to the encapsulation membrane, such as plastic or other polymers. A bypass fluid inlet 2014 is disposed through the bottom of the bowl 430 and through the bottom encapsulation membrane 2010 to introduce electrolyte solution into the gap between the encapsulation membranes and the anode plate. A bypass outlet 2016 is connected to the membrane support ring 2012 and extends through the bowl 430 to facilitate flow of excess electrolyte solution with the anode sludge or generated particulates out of the encapsulated anode into a waste drain, not shown.

Preferably, the flow of the electrolyte solution within the bypass fluid inlet 2014 and the main electrolyte solution inlet 510 are individually controlled by flow control valves 2020, 2022, respectively placed along the fluid lines connected to the inlets, and the fluid pressure in the bypass fluid inlet 2014 is preferably maintained at a higher pressure than the pressure in the main electrolyte solution inlet 510. The flow of the electrolyte solution inside the bowl 430 from the main electrolyte solution inlet 510 is indicated by arrows A, and the flow of the electrolyte solution inside the encapsulated anode 2000 is indicated by the arrows B. A portion of the electrolyte solution introduced into the encapsulated anode flows out of the encapsulated anode through the bypass outlet 2016. By providing a dedicated bypass electrolyte solution supply into the encapsulated anode, the anode sludge or particulates generated from the dissolving consumable anode is continually removed from the anode, thereby improving the purity of the electrolyte solution during the electroplating process.

Figure 22:
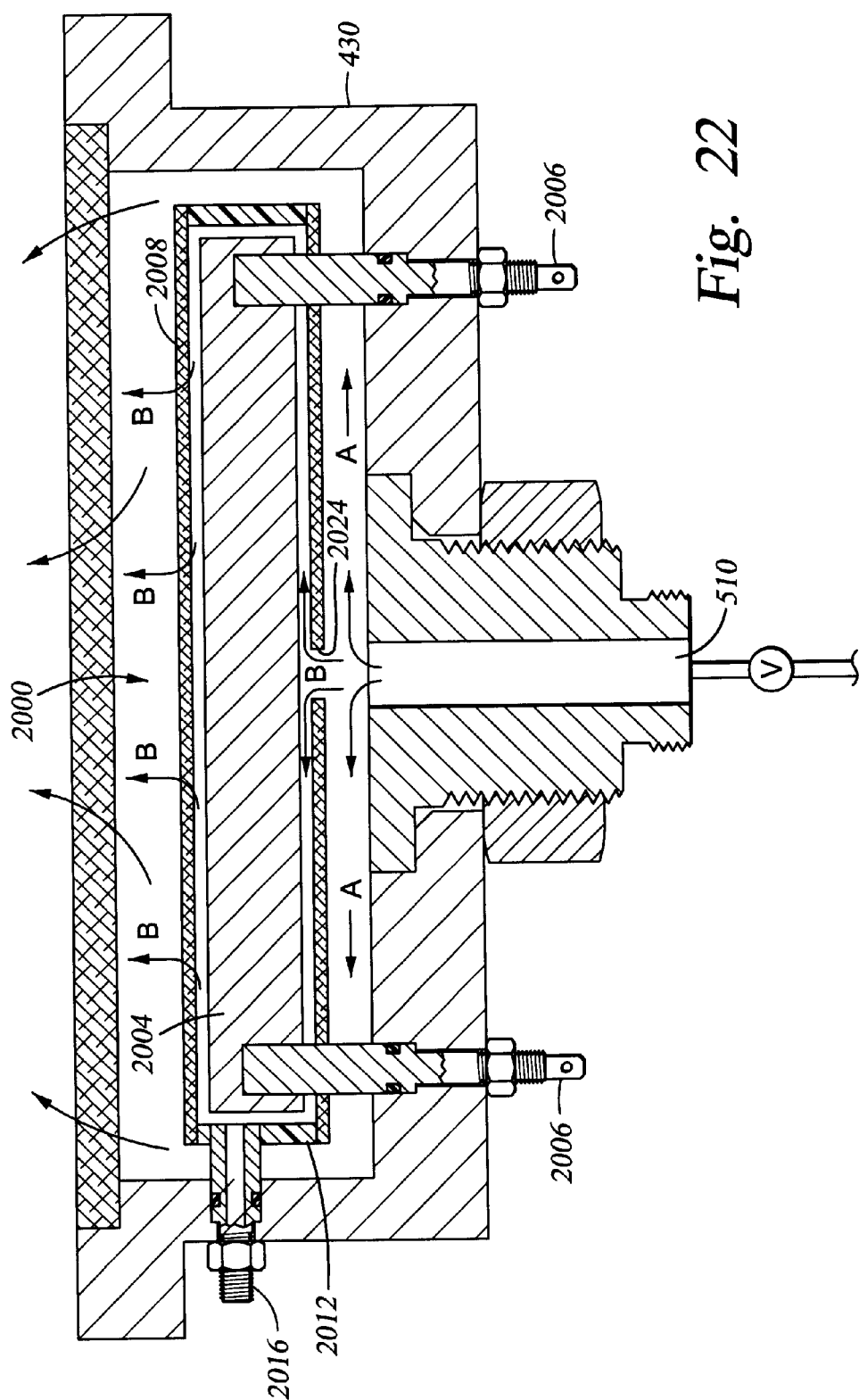
FIG. 22 is a cross sectional view of another embodiment of an encapsulated anode.

FIG. 22 is a cross sectional view of a yet another embodiment of an encapsulated anode. This embodiment of an encapsulated anode 2000 includes an anode plate 2004, a plurality of electric feed-throughs 2006, a top encapsulation membrane 2008, a bottom encapsulation membrane 2010, and a membrane support ring 2012. The anode plate 2004 is secured and supported on a plurality of electric feed-throughs 2006. The top and bottom encapsulation membrane 2008, 2010 are attached to a membrane support ring 2012. A bypass outlet 2016 is connected to the membrane support ring 2012, and extends through the bowl 430. This embodiment of an encapsulated anode preferably comprises materials as described for the first encapsulated anode. The bottom encapsulation membrane 2010 includes one or more openings 2024 disposed substantially above the main electrolyte solution inlet 510. The opening 2024 is adapted to receive flow of electrolyte solution from the main electrolyte solution inlet 510 and is preferably about the same size as the internal circumference of the main electrolyte solution inlet 510. The flow of the electrolyte solution from the main electrolyte solution inlet 510 is indicated by the arrows A and the flow of the electrolyte solution within the encapsulated anode is indicated by the arrows B. A portion of the electrolyte solution flows out of the encapsulated anode through the bypass outlet 2016, carrying a portion of the anode sludge and particulates generated from anode dissolution.

Figure 23:
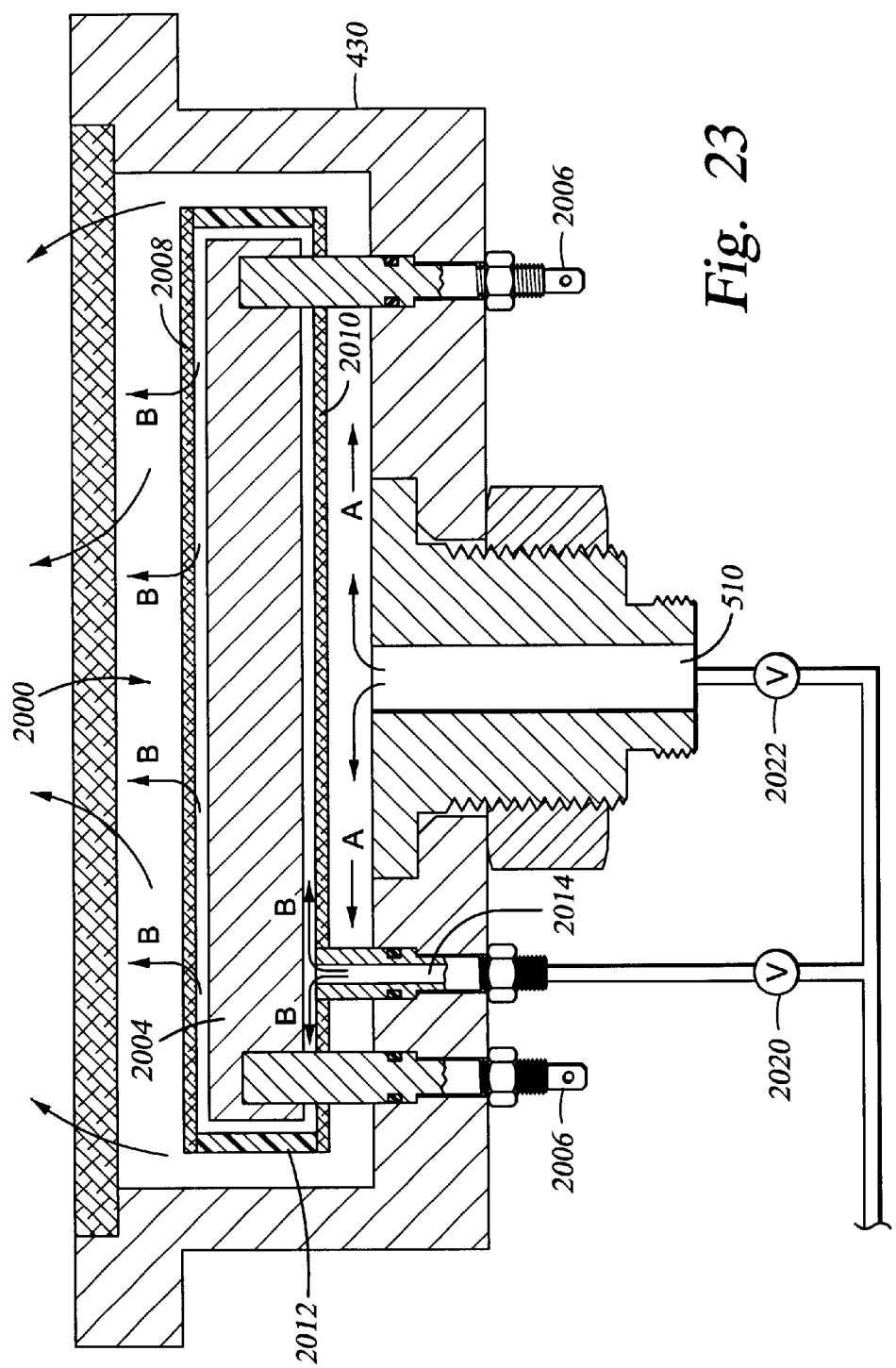
FIG. 23 is a cross sectional view of yet another embodiment of an encapsulated anode.

FIG. 23 is a cross sectional view of yet another embodiment of an encapsulated anode. This embodiment of an encapsulated anode 2000 includes an anode plate 2002, a plurality of electric feed-throughs 2006, a top encapsulation membrane 2008, a bottom encapsulation membrane 2010, and a membrane support ring 2012. The anode plate 2004 is secured and supported on a plurality of electric feed-throughs 2006. The top and a bottom encapsulation membrane 2008, 2010 are attached to a membrane support ring 2012. A bypass fluid inlet 2014 is disposed through the bottom of the bowl 430 and through the bottom encapsulation membrane 2010 to introduce electrolyte solution into the gap between the encapsulation membranes and the anode plate. This embodiment of an encapsulated anode preferably comprises materials as described for the encapsulated anode. Preferably, the flow of the electrolyte solution through the bypass fluid inlet 2014 and the main electrolyte solution inlet 510 are individually controlled by control valves 2020, 2022, respectively. The flow of the electrolyte solution from the main electrolyte solution inlet 510 is indicated by the arrows A while the flow of the electrolyte solution through the encapsulated anode is indicated by arrows B. For this embodiment, the anode sludge and particulates generated by the dissolving anode plate are filtered and trapped by the encapsulation membranes as the electrolyte solution passes through the membrane.

Figure 16:
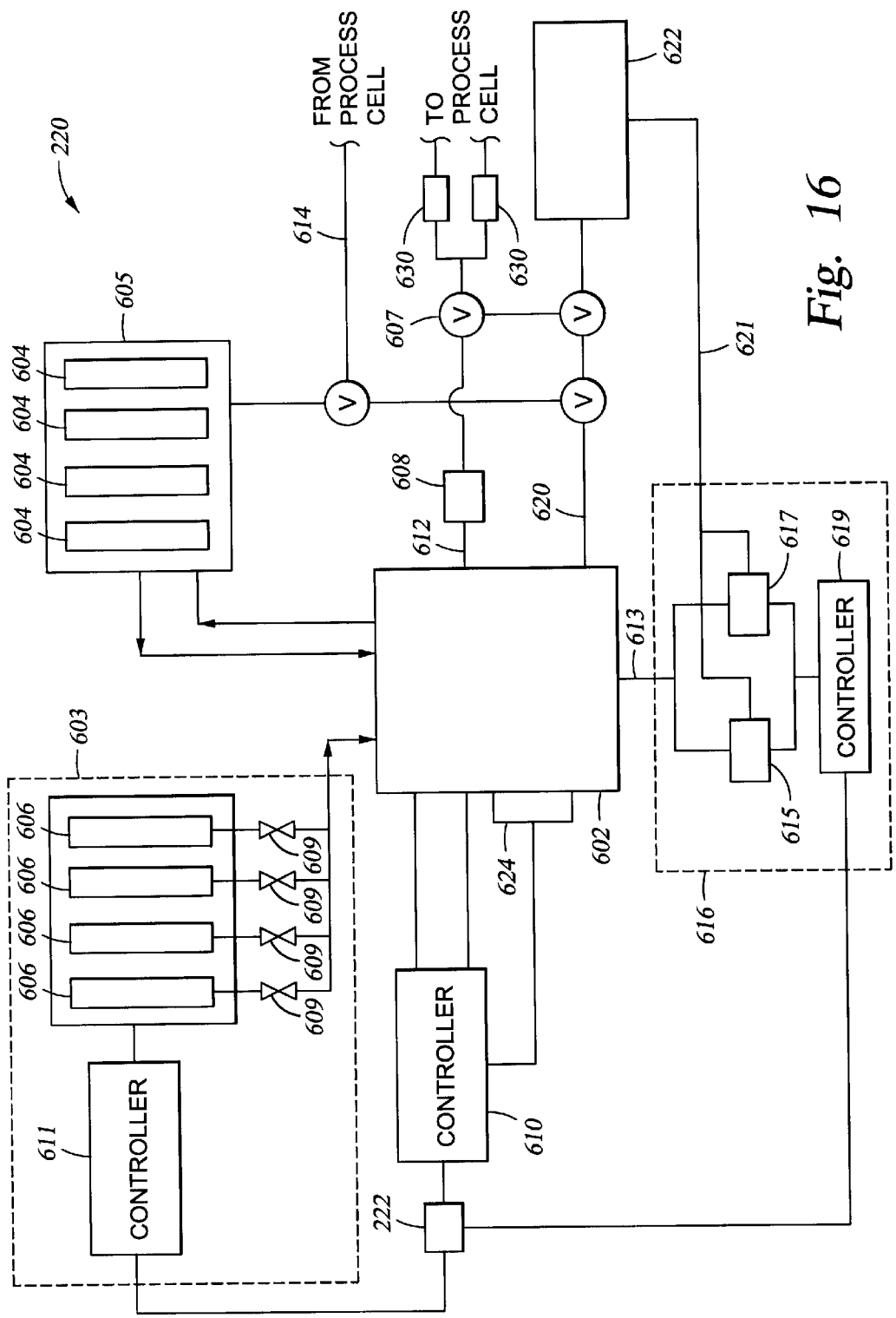
FIG. 16 is a schematic diagram of one embodiment of electrolyte solution system.

FIG. 16 is a schematic diagram of an electrolyte solution system 220. The electrolyte solution system 220 provides the electrolyte solution to the electroplating process cells for the electroplating process. The electrolyte solution system 220 generally comprises a main electrolyte solution tank 602, a dosing module 603, a filtration module 605, a chemical analyzer module 616, and an electrolyte solution waste disposal system 622 connected to the analyzing module 616 by an electrolyte solution waste drain 620. One or more controllers control the composition of the electrolyte solution in the main tank 602 and the operation of the electrolyte solution system 220. Preferably, the controllers are independently operable but integrated with the controller 222 of the ECP system 200.

The main electrolyte solution tank 602 provides a reservoir for electrolyte solution and includes an electrolyte solution supply line 612 that is connected to each of the electroplating process cells through one or more fluid pumps 608 and valves 607. A heat exchanger 624 or a heater/chiller disposed in thermal connection with the main tank 602 controls the temperature of the electrolyte solution stored in the main tank 602. The heat exchanger 624 is connected to and operated by the controller 610.

The dosing module 603 is connected to the main tank 602 by a supply line and includes a plurality of source tanks 606, or feed bottles, a plurality of valves 609, and a controller 611. The source tanks 606 contain the chemicals needed for composing the electrolyte solution and typically include a de-ionized water source tank and copper sulfate ($CuSO_4$) source tank for composing the electrolyte solution. Other source tanks 606 may contain hydrogen sulfate ($H_2SO_4$), hydrogen chloride (HCl) and various additives such as glycol. Each source tank is preferably color coded and fitted with a unique mating outlet connector adapted to connect to a matching inlet connector in the dosing module. By color coding the source tanks and fitting the source tanks with unique connectors, errors caused by human operators when exchanging or replacing the source tanks are significantly reduced.

The de-ionized water source tank preferably also provides de-ionized water to the system for cleaning the system during maintenance. The valves 609 associated with each source tank 606 regulate the flow of chemicals to the main tank 602 and may be any of numerous commercially available valves such as butterfly valves, throttle valves and the like. Activation of the valves 609 is accomplished by the controller 611 which is preferably connected to the controller 222 to receive signals therefrom.

The electrolyte solution filtration module 605 includes a plurality of filter tanks 604. An electrolyte solution return line 614 is connected between each of the process cells and one or more filter tanks 604. The filter tanks 604 remove the undesired contents in the used electrolyte solution before returning the electrolyte solution to the main tank 602 for re-use. The main tank 602 is also connected to the filter tanks 604 to facilitate re-circulation and filtration of the electrolyte solution in the main tank 602. By re-circulating the electrolyte solution from the main tank 602 through the filter tanks 604, the undesired contents in the electrolyte solution are continuously removed by the filter tanks 604 to maintain a consistent level of purity. Additionally, re-circulating the electrolyte solution between the main tank 602 and the filtration module 605 allows the various chemicals in the electrolyte solution to be thoroughly mixed.

The electrolyte solution system 220 also includes a chemical analyzer module 616 that provides real-time chemical analysis of the chemical composition of the electrolyte solution. The analyzer module 616 is fluidly coupled to the main tank 602 by a sample line 613 and to the waste disposal system 622 by an outlet line 621. The analyzer module 616 generally comprises at least one analyzer and a controller to operate the analyzer. The number of analyzers required for a particular processing tool depends on the composition of the electrolyte solution. For example, while a first analyzer may be used to monitor the concentrations of organic substances, a second analyzer is needed for inorganic chemicals. In the specific embodiment shown in FIG. 16 the chemical analyzer module 616 comprises an auto titration analyzer 615 and a cyclic voltametric stripper (CVS) 617. Both analyzers are commercially available from various suppliers. An auto titration analyzer that may be used to advantage is available from Parker Systems and a cyclic voltametric stripper is available from ECI. The auto titration analyzer 615 determines the concentrations of inorganic substances such as copper chloride and acid. The CVS 617 determines the concentrations of organic substances such as the various additives which may be used in the electrolyte solution and by-products resulting from the processing which are returned to the main tank 602 from the process cells.

The analyzer module shown FIG. 16 is merely illustrative. In another embodiment each analyzer may be coupled to the main electrolyte solution tank by a separate supply line and be operated by separate controllers. Persons skilled in the art will recognize other embodiments.

In operation, a sample of electrolyte solution is flowed to the analyzer module 616 via the sample line 613. Although the sample may be taken periodically, preferably a continuous flow of electrolyte solution is maintained to the analyzer module 616. A portion of the sample is delivered to the auto titration analyzer 615 and a portion is delivered to the CVS 617 for the appropriate analysis. The controller 619 initiates command signals to operate the analyzers 615, 617 in order to generate data. The information from the chemical analyzers 615, 617 is then communicated to the controller 222. The controller 222 processes the information and transmits signals which include user-defined chemical dosage parameters to the dosing controller 611. The received information is used to provide real-time adjustments to the source chemical replenishment rates by operating one or more of the valves 609 thereby maintaining a desired, and preferably constant, chemical composition of the electrolyte solution throughout the electroplating process. The waste electrolyte solution from the analyzer module is then flowed to the waste disposal system 622 via the outlet line 621.

Although one embodiment utilizes real-time monitoring and adjustments of the electrolyte solution, various alternatives may be employed. For example, the dosing module 603 may be controlled manually by an operator observing the output values provided by the chemical analyzer module 616. Preferably, the system software allows for both an automatic real-time adjustment mode as well as an operator (manual) mode. Further, although multiple controllers are shown in FIG. 16, a single controller may be used to operate various components of the system such as the chemical analyzer module 616, the dosing module 603, and the heat exchanger 624. Other embodiments will be apparent to those skilled in the art.

The electrolyte solution system 220 also includes an electrolyte solution waste drain 620 connected to an electrolyte solution waste disposal system 622 for safe disposal of used electrolyte solutions, chemicals and other fluids used in the ECP system. Preferably, the electroplating cells include a direct line connection to the electrolyte solution waste drain 620 or the electrolyte solution waste disposal system 622 to drain the electroplating cells without returning the electrolyte solution through the electrolyte solution system 220. The electrolyte solution system 220 preferably also includes a bleed off connection to bleed off excess electrolyte solution to the electrolyte solution waste drain 620.

Preferably, the electrolyte solution system 220 also includes one or more degasser modules 630 adapted to remove undesirable gases from the electrolyte solution. The degasser module generally comprises a membrane that separates gases from the fluid passing through the degasser module and a vacuum system for removing the released gases. The degasser modules 630 are preferably placed in line on the electrolyte solution supply line 612 adjacent to the process cells 240. The degasser modules 630 are preferably positioned as close as possible to the process cells 240 so that most of the gases from the electrolyte solution system are removed by the degasser modules before the electrolyte solution enters the process cells. Preferably, each degasser module 630 includes two outlets to supply degassed electrolyte solution to the two process cells 240 of each processing station 218. Alternatively, a degasser module 630 is provided for each process cell. The degasser modules can be placed at many other alternative positions. For example, the degasser module can be placed at other positions in the electrolyte solution system, such as along with the filter section or in a closed-loop system with the main tank or with the process cell. As another example, one degasser module is placed in line with the electrolyte solution supply line 612 to provide degassed electrolyte solution to all of the process cells 240 of the electro-chemical plating system. Additionally, a separate degasser module is positioned in-line or in a closed-loop with the de-ionized water supply line and is dedicated for removing oxygen from the de-ionized water source. Because de-ionized water is used to rinse the processed substrates, free oxygen gases are preferable removed from the de-ionized water before reaching the SRD modules so that the electroplated copper is less likely to become oxidized by the rinsing process. Degasser modules are well known in the art and commercial embodiments are generally available and adaptable for use in a variety of applications. A commercially available degasser module is available from Millipore Corporation, located in Bedford, Mass.

Figure 26A:
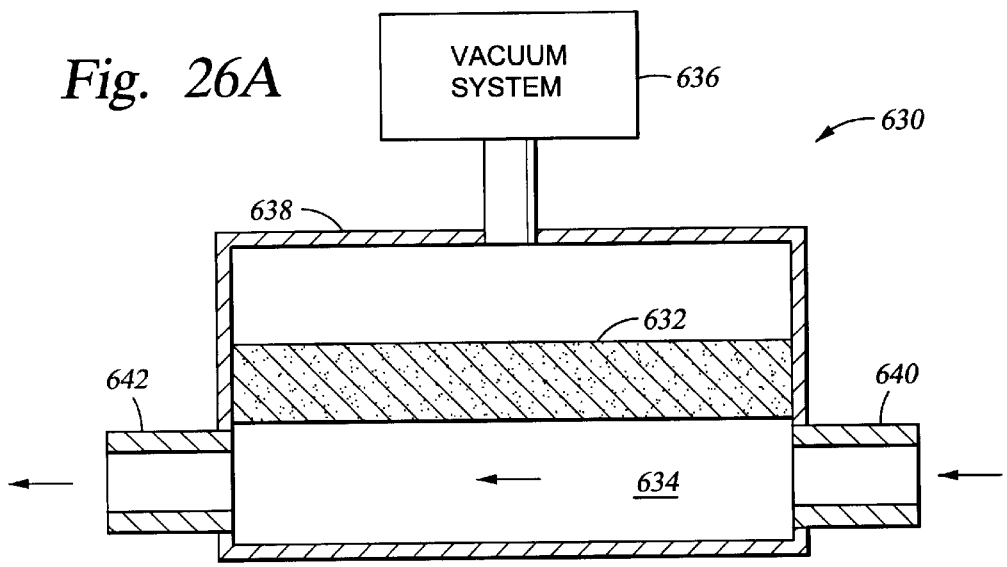
FIGS. 26a and 26b are cross sectional views of embodiments of a degasser module.
Figure 26B:
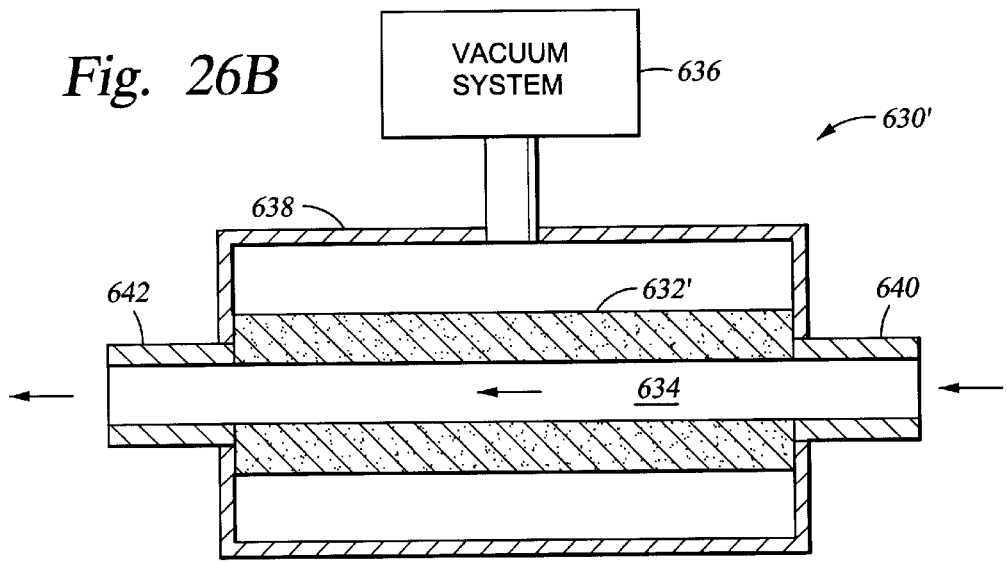

One embodiment of the degasser module 630, as shown in FIG. 26a, includes a hydrophobic membrane 632 having a fluid, i.e., electrolyte solution, passage 634 on one side of the membrane 632 and a vacuum system 636 disposed on the opposite side of the membrane. The enclosure 638 of the degasser module includes an inlet 640 and one or more outlets 642. As the electrolyte solution passes through the degasser module 630, the gases and other micro-bubbles in the electrolyte solution are separated from the electrolyte solution through the hydrophobic membrane and removed by the vacuum system. Another embodiment of the degasser module 630', as shown in FIG. 26b, includes a tube of hydrophobic membrane 632' and a vacuum system 636 disposed around the tube of hydrophobic membrane 632'. The electrolyte solution is introduced inside the tube of hydrophobic membrane, and as the electrolyte solution passes through the fluid passage 634 in the tube, gases and other micro-bubbles in the electrolyte solution are separated from the electrolyte solution through the tube of hydrophobic membrane 632' and removed by the vacuum system 636 surrounding the tube. More complex designs of degasser modules are contemplated, including designs having serpentine paths of the electrolyte solution across the membrane and other multi-sectioned designs of degasser modules.

Although not shown in FIG. 16, the electrolyte solution system 220 may include a number of other components. For example, the electrolyte solution system 220 preferably also includes one or more additional tanks for storage of chemicals for a substrate cleaning system, such as the SRD station. Double-contained piping for hazardous material connections may also be employed to provide safe transport of the chemicals throughout the system. Optionally, the electrolyte solution system 220 includes connections to additional or external electrolyte solution processing system to provide additional electrolyte solution supplies to the ECP system.

Figure 17:
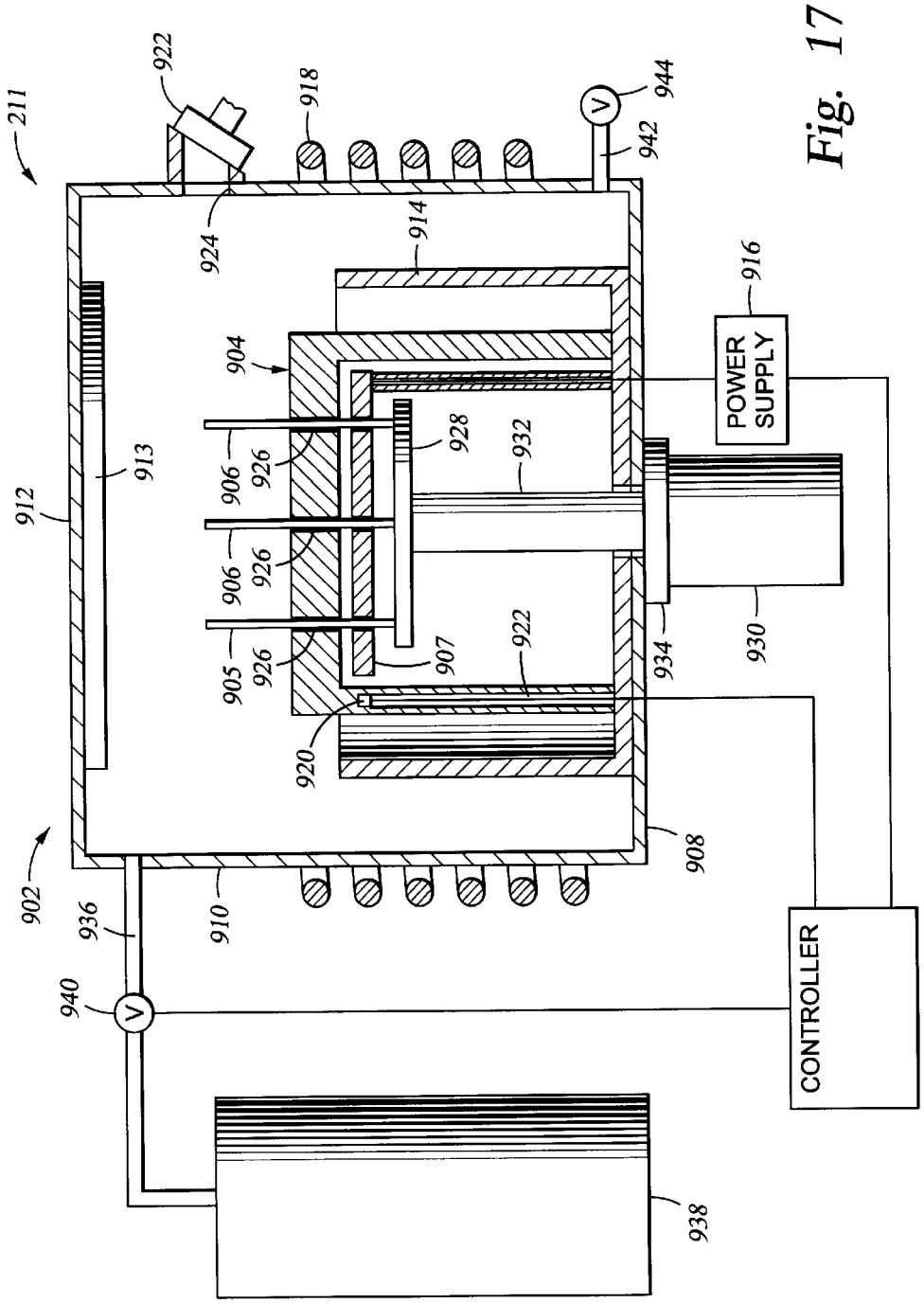
FIG. 17 is a cross sectional view of a rapid thermal anneal (RTA) chamber.

FIG. 17 is a cross sectional view of the RTA chamber. The RTA chamber 211 is preferably connected to the loading station 210, and substrates are transferred into and out of the RTA chamber 211 by the loading station transfer robot 228. The ECP system, as shown in FIGS. 2 and 3, preferably comprises two RTA chambers 211 disposed on opposing sides of the loading station 210, corresponding to the symmetric design of the loading station 210. RTA process chambers are generally well known in the art, and RTA chambers are typically utilized in substrate processing systems to enhance the properties of the deposited materials. The ECP system 200 contemplates utilizing a variety of RTA chamber designs, including hot plate designs and heat lamp designs, to enhance the electroplating results. One particular suitable RTA chamber is the WxZ chamber available from Applied materials, Inc., located in Santa Clara, Calif. Although a hot plate RTA chamber is described, other RTA chambers could be used as well.

The RTA chamber 211 generally comprises an enclosure 902, a heater plate 904, a heater 907 and a plurality of substrate holder pins 906. The enclosure 902 includes a base 908, a sidewall 910 and a top 912. Preferably, a cold plate 913 is disposed below the top 912 of the enclosure. Alternatively, the cold plate is integrally formed as part of the top 912 of the enclosure. Preferably, a reflector insulator dish 914 is disposed inside the enclosure 902 on the base 908. The reflector insulator dish 914 is typically made from a material such as quartz, alumina, or other material that can withstand high temperatures, i.e., greater than about 500° C., and act as a thermal insulator between the heater 907 and the enclosure 902. The dish 914 may also be coated with a reflective material, such as gold, to direct heat back to the heater plate 906.

The heater plate 904 preferably has a large mass compared to the substrate being processed in the system and is preferably fabricated from a material such as silicon carbide, quartz, or other materials that do not react with any ambient gases in the RTA chamber 211 or with the substrate material. The heater 907 typically comprises a resistive heating element or a conductive/radiant heat source and is disposed between the heated plate 906 and the reflector insulator dish 914. The heater 907 is connected to a power source 916 which supplies the energy needed to heat the heater 907. Preferably, a thermocouple 920 is disposed in a conduit 922, disposed through the base 908 and dish 914, and extends into the heater plate 904. The thermocouple 920 is connected to the controller 222 and supplies temperature measurements to the controller. The controller then increases or decreases the heat supplied by the heater 907 according to the temperature measurements and the desired anneal temperature.

The enclosure 902 preferably includes a cooling member 918 disposed outside of the enclosure 902 in thermal contact with the sidewall 910 to cool the enclosure 902. Alternatively, one or more cooling channels, not shown, are formed within the sidewall 910 to control the temperature of the enclosure 902. The cold plate 913 disposed on the inside surface of the top 912 cools a substrate that is positioned in close proximity to the cold plate 913.

The RTA chamber 211 includes a slit valve 922 disposed on the sidewall 910 of the enclosure 902 for facilitating transfers of substrates into and out of the RTA chamber. The slit valve 922 selectively seals an opening 924 on the sidewall 910 of the enclosure that communicates with the loading station 210. The loading station transfer robot 228, see FIG. 2, transfers substrates into and out of the RTA chamber through the opening 924.

The substrate holder pins 906 preferably comprise distally tapered members constructed from quartz, aluminum oxide, silicon carbide, or other high temperature resistant materials. Each substrate holder pin 906 is disposed within a tubular conduit 926, preferably made of a heat and oxidation resistant material, that extends through the heater plate 904. The substrate holder pins 906 are connected to a lift plate 928 for moving the substrate holder pins 906 in a uniform manner. The lift plate 928 is attached to an to an actuator 930, such as a stepper motor, through a lift shaft 932 that moves the lift plate 928 to facilitate positioning of a substrate at various vertical positions within the RTA chamber. The lift shaft 932 extends through the base 908 of the enclosure 902 and is sealed by a sealing flange 934 disposed around the shaft.

To transfer a substrate into the RTA chamber 211, the slit valve 922 is opened, and the loading station transfer robot 228 extends its robot blade having a substrate positioned thereon through the opening 924 into the RTA chamber. The robot blade of the loading station transfer robot 228 positions the substrate in the RTA chamber above the heater plate 904, and the substrate holder pins 906 are extended upwards to lift the substrate above the robot blade. The robot blade then retracts out of the RTA chamber, and the slit valve 922 closes the opening. The substrate holder pins 906 are then retracted to lower the substrate to a desired distance from the heater plate 904. Optionally, the substrate holder pins 906 may retract fully to place the substrate in direct contact with the heater plate.

Preferably, a gas inlet 936 is disposed through the sidewall 910 of the enclosure 902 to allow selected gas flow into the RTA chamber 211 during the anneal treatment process. The gas inlet 936 is connected to a gas source 938 through a valve 940 for controlling the flow of the gas into the RTA chamber 211. A gas outlet 942 is preferably disposed at a lower portion of the sidewall 910 of the enclosure 902 to exhaust the gases in the RTA chamber and is preferably connected to a relief/check valve 944 to prevent backstreaming of atmosphere from outside of the chamber. Optionally, the gas outlet 942 is connected to a vacuum pump, not shown, to exhaust the RTA chamber to a desired vacuum level during an anneal treatment.

A substrate is annealed in the RTA chamber 211 after the substrate has been electroplated in the electroplating cell and cleaned in the SRD station. Preferably, the RTA chamber 211 is maintained at about atmospheric pressure, and the oxygen content inside the RTA chamber 211 is controlled to less than about 100 ppm during the anneal treatment process. Preferably, the ambient environment inside the RTA chamber 211 comprises nitrogen ($N_2$) or a combination of nitrogen ($N_2$) and less than about 4% hydrogen ($H_2$), and the ambient gas flow into the RTA chamber 211 is maintained at greater than 20 liters/min to control the oxygen content to less than 100 ppm. The electroplated substrate is preferably annealed at a temperature between about 200° C. and about 450° C. for between about 30 seconds and 30 minutes, and more preferably, between about 250° C. and about 400° C. for between about 1 minute and 5 minutes. RTA processing typically requires a temperature increase of at least 50° C. per second. To provide the required rate of temperature increase for the substrate during the anneal treatment, the heater plate is preferably maintained at between about 350° C. and about 450° C., and the substrate is preferably positioned at between about 0 mm, i.e., contacting the heater plate, and about 20 mm from the heater plate for the duration of the anneal treatment process. Preferably, a controller 222 controls the operation of the RTA chamber 211, including maintaining the desired ambient environment in the RTA chamber and the temperature of the heater plate.

After the anneal treatment process is completed, the substrate holder pins 906 lift the substrate to a position for transfer out of the RTA chamber 211. The slit valve 922 opens, and the robot blade of the loading station transfer robot 228 is extended into the RTA chamber and positioned below the substrate. The substrate holder pins 906 retract to lower the substrate onto the robot blade, and the robot blade then retracts out of the RTA chamber. The loading station transfer robot 228 then transfers the processed substrate into the cassette 232 for removal out of the electroplating processing system, as shown in the embodiment of FIGS. 2 and 3.

Referring back to FIG. 2, the ECP system 200 includes a controller 222 that controls the functions of each component of the platform. Preferably, the controller 222 is mounted above the mainframe 214 and comprises a programmable microprocessor. The programmable microprocessor is typically programmed using a software designed specifically for controlling all components of the ECP system 200. The controller 222 also provides electrical power to the components of the system and includes a control panel 223 that allows an operator to monitor and operate the ECP system 200. The control panel 223, as shown in FIG. 2, is a stand-alone module that is connected to the controller 222 through a cable and provides easy access to an operator. Generally, the controller 222 coordinates the operations of the loading station 210, the RTA chamber 211, the SRD station 212, the mainframe 214 and the processing stations 218. Additionally, the controller 222 coordinates with the controller of the electrolyte solution system 220 to provide the electrolyte solution for the electroplating process.

The following is a description of a typical substrate electroplating process sequence through the ECP system 200 as shown in FIG. 2. A substrate cassette containing a plurality of substrates is loaded into the substrate cassette receiving areas 224 in the loading station 210 of the ECP system 200. A loading station transfer robot 228 picks up a substrate from a substrate slot in the substrate cassette and places the substrate in the substrate orientor 230. The substrate orientor 230 determines and orients the substrate to a desired orientation for processing through the system. The loading station transfer robot 228 then transfers the oriented substrate from the substrate orientor 230 and positions the substrate in one of the substrate slots in the substrate pass-through cassette 238 in the SRD station 212. The mainframe transfer robot 242 picks up the substrate from the substrate pass-through cassette 238 and positions the substrate for transfer by the flipper robot 248. The flipper robot 248 rotates its robot blade below the substrate and picks up substrate from mainframe transfer robot blade. The vacuum suction gripper on the flipper robot blade secures the substrate on the flipper robot blade, and the flipper robot flips the substrate from a face up position to a face down position. The flipper robot 248 rotates and positions the substrate face down in the substrate holder assembly 450. The substrate is positioned below the substrate holder assembly 450 but above the electric contact element 466. The flipper robot 248 then releases the substrate to position the substrate into the electric contact element 466. The substrate holder element 464 moves toward the substrate and the vacuum chuck secures the substrate on the substrate holder element 464. The bladder assembly 470 on the substrate holder assembly 450 exerts pressure against the substrate backside to ensure electric contact between the substrate plating surface and the electric contact element 466.

The head assembly frame 452 is lowered to a processing position above the process cell 420. At this position the substrate is below the upper plane of the weir 478 and contacts the electrolyte solution contained in the process cell 420. The power supply is activated to supply electric power, i.e., voltage and current, to the cathode and the anode to enable the electroplating process. The electrolyte solution is typically continually pumped into the electrolyte cell during the electroplating process. The electric power supplied to the cathode and the anode and the flow of the electrolyte solution are controlled by the controller 222 to achieve the desired electroplating results. Preferably, the head assembly is rotated as the head assembly is lowered and also during the electroplating process.

After the electroplating process is completed, the head assembly 410 raises the substrate holder assembly 450 and removes the substrate from the electrolyte solution. Preferably, the head assembly is rotated for a duration that enhances removal of residual electrolyte solution from the substrate holder assembly. The vacuum chuck and the bladder assembly of the substrate holder assembly then release the substrate from the substrate holder element 464, and the substrate holder element 464 is raised to allow the flipper robot blade to pick up the processed substrate from the electric contact element. The flipper robot rotates the flipper robot blade above the backside of the processed substrate in the electric contact element and picks up the substrate using the vacuum suction gripper on the flipper robot blade. The flipper robot rotates the flipper robot blade with the substrate out of the substrate holder assembly, flips the substrate from a face-down position to a face-up position, and positions the substrate on the mainframe transfer robot blade. The mainframe transfer robot then transfers and positions the processed substrate above the SRD module 236. The SRD substrate support lifts the substrate, and the mainframe transfer robot blade retracts away from the SRD module 236. The substrate is cleaned in the SRD module using de-ionized water or a combination of de-ionized water and a cleaning fluid as described in detail above. The substrate is then positioned for transfer out of the SRD module. The loading station transfer robot 228 picks up the substrate from the SRD module 236 and transfers the processed substrate into the RTA chamber 211 for an anneal treatment process to enhance the properties of the deposited materials. The annealed substrate is then transferred out of the RTA chamber 211 by the loading station robot 228 and placed back into the substrate cassette for removal from the ECP system. The above-described sequence can be carried out for a plurality of substrates substantially simultaneously in the ECP system 200. The ECP system can be adapted to provide multi-stack substrate processing.

2. Substrate Holder System

A substrate holder system 14 is described that is capable of immersing the substrate into an electrolyte solution in an electrolyte cell. The substrate holder system 14 is capable of tilting a substrate holder assembly containing a substrate relative to the level line of the electrolyte solution, the level line being substantially horizontal. Certain embodiments of substrate holder systems are capable of rotating the substrate during the immersion of the substrate into the electrolyte solution. The titling of the substrate during immersion limits air bubbles or air bridges from forming within the electrolyte solution under the substrate holder and/or the substrate. This section describes the structure and the operation of one embodiment of the substrate holder system.

Figure 25:
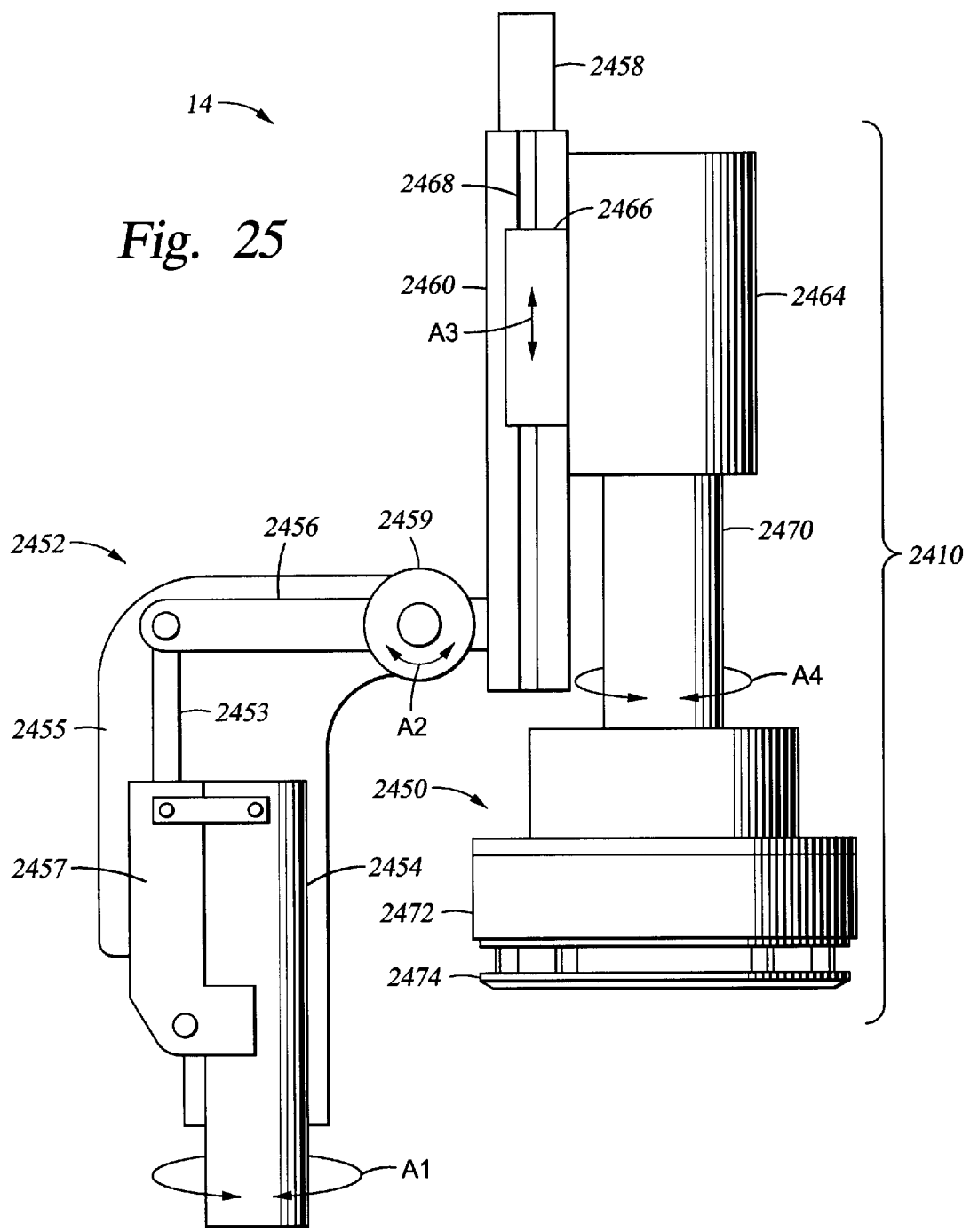
FIG. 25 is an alternative embodiment of the substrate holder system having a rotatable head assembly.

FIG. 6, as described above, provides one embodiment in which a head assembly 410 is capable of translating a substrate holder assembly 450 in the x and z directions. FIG. 25 is a partial cross sectional view of another embodiment of a substrate holder system 14 that is capable of translating a substrate holder assembly 2450 in the horizontal and vertical directions. The embodiment of a substrate holder system 14 shown in FIG. 25 provides for tilting of the substrate holder assembly at an angle $\alpha$ from horizontal in addition to the translation of the substrate holder assembly in a X-direction and the Z-direction. This embodiment provides for rotation of the substrate during immersion of the substrate into the electrolyte solution where the substrate is held by the substrate holder assembly. The substrate holder system 14 includes a rotatable head assembly 2410 and a head assembly frame 2452. The head assembly frame 2452 includes a mounting post 2454, a shaft 2453, a post cover 2455, a cantilever arm 2456, a cantilever arm actuator 2457, and a pivot joint 2459. The mounting post 2454 is mounted onto the body of the mainframe 214, and the post cover 2455 covers a top portion of the mounting post 2454.

Preferably, the mounting post 2454 provides rotational movement, in a direction indicated by arrow A1, of the mounting post to allow for rotation of the head assembly frame 2452 about a substantially vertical axis which extends through the mounting post. Such motion is generally provided to align the head assembly 2410 with the electrolyte cell.

One end of the cantilever arm 2456 is pivotally connected to the shaft 2453 of the cantilever arm actuator 2457. The cantilever arm actuator 2457 is, for example, a pneumatic cylinder, a lead-screw actuator, a servo-motor, or other type actuator. The cantilever arm 2456 is pivotally connected to the mounting slide 2460 at the pivot joint 2459. The cantilever arm actuator 2457 is mounted to the mounting post 2454. The pivot joint 2459 is rotatably mounted to the post cover 2455 so that the cantilever arm 2456 can pivot about the post cover at the pivot joint. Actuation of the cantilever arm actuator 2457 provides pivotal movement, in a direction indicated by arrow A2, of the cantilever arm 2456 about the pivot joint 2459. Alternatively, a rotary motor may be provided as a cantilever arm actuator 2457, wherein output of a rotary motor is connected directly between the post cover 2455 and the pivot joint 2459. The rotary motor output effects rotation of the cantilever arm 2456 and the head assembly 2410 about the pivot joint.

The rotatable head assembly 2410 is attached to a mounting slide 2460 of the head assembly frame 2452, and the mounting slide 2460 is disposed at the distal end of the cantilever arm 2456. Rotation of the rotatable head assembly 2410 about the pivot joint 2459 causes tilting of a substrate held within the substrate holder assembly 2450 of the rotatable head assembly 2410 about the pivot joint 2459 relative to horizontal. When the cantilever arm actuator 2457 is retracted, the cantilever arm 2456 raises the head assembly 2410 away from the process cell 420 as shown in FIG. 6. This tilting of the rotatable head assembly 2410 effects tilting of the substrate relative to horizontal. Such tilting of the substrate is used during removal and/or replacement of the substrate holder assembly from/to the electroplating process cell 240. When the cantilever arm actuator 2457 is extended, the cantilever arm 2456 moves the head assembly 2410 toward the process cell 420 to angle the substrate closer to horizontal. The substrate is preferably in a substantially horizontal position during ECP.

The rotatable head assembly 2410 includes a rotating actuator 2464 slidably connected to the mounting slide 2460. The mounting slide 2460 guides the vertical motion of the rotatable head assembly 2410. A head lift actuator 2458 is disposed on the mounting slide 2460 to provide motive force for vertical displacement of the head assembly 2410. The shaft 2468 of the head lift actuator 2458 is inserted through a lift guide 2466 attached to the body of the rotating actuator 2464. Preferably, the shaft 2468 is a lead-screw type shaft that moves the lift guide, in a direction indicated by arrow A3, between various vertical positions. This lifting of the rotatable head assembly 2410 can be used to remove and/or replace the substrate holder assembly from the electroplating process cell 240. Removing the substrate from the process cell is necessary to position the substrate so that a robot can remove the substrate from the rotatable head assembly 2410.

The rotating actuator 2464 is connected to the substrate holder assembly 2450 through the shaft 2470 and rotates the substrate holder assembly 2450 in a direction indicated by arrow A4. The rotation of the substrate during the electroplating process generally enhances the deposition results. Preferably, the head assembly rotates the substrate about the vertical axis of the substrate between about 0 RPM and about 200 RPM, and more particularly between about 10 and about 40 RPM, during the electroplating process. Rotation of the substrate at a higher angular velocity may result in turbulence within the electrolyte solution. The head assembly can also be rotated as the head assembly is lowered to position the substrate in contact with the electrolyte solution in the process cell as well as when the head assembly is raised to remove the substrate from the electrolyte solution in the process cell. The head assembly is preferably rotated at a high speed, e.g., up to about 2,500 RPM, after the head assembly is lifted from the process cell. Such rotation of the substrate following the removal of the substrate from the electrolyte solution enhances removal of residual electrolyte solution on the substrate by the centrifugal force applied to the liquid on the substrate.

Figure 27:
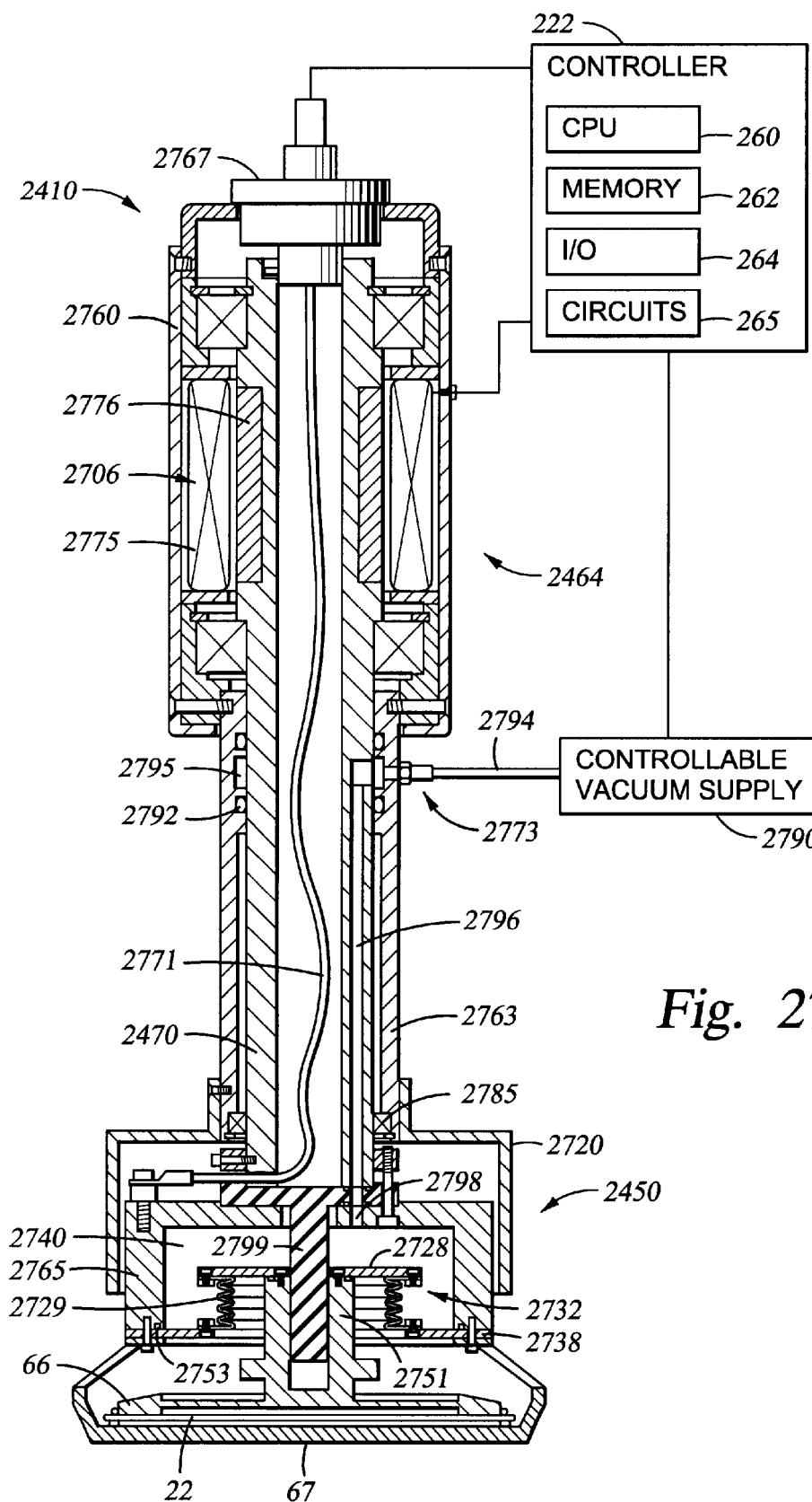
FIG. 27 is a cross sectional view of one embodiment of the rotatable head assembly shown in FIG. 25.

FIG. 27 shows a cross sectional view of one embodiment of rotatable head assembly 2410 that can be contained in the substrate holder system 14 of the embodiment shown in FIG. 25 to provide for the rotation of the substrate. The rotatable head assembly 2410 provides for lowering of the thrust plate 66 to position a substrate in contact with the electric contact element 67. The thrust plate can be raised to provide a space between the thrust plate 66 and the electric contact element 67 to permit removal of the substrate from, or insertion of the substrate into, the rotatable head assembly 2410. The rotatable head assembly 2410 comprises a substrate holder assembly 2450, a rotating actuator 2464, a shaft shield 2763, a shaft 2470, an electric feed through 2767, an electric conductor 2771, and a pneumatic feed through 2773. The rotating actuator 2464 comprises a head rotation housing 2760 and a head rotation motor 2706. The head rotation motor 2706 comprises a coil segment 2775 and a magnetic rotary element 2776. The hollow coil segment 2775 generates a magnetic field rotates the magnetic rotary element 2776 about a vertical axis. The substrate holder assembly 2450 comprises a fluid shield 2720, a contact housing 2765 a thrust plate 66, an electric contact element 67, and a spring assembly 2732.

The contact housing 2765 and the spring assembly 2732 are generally annular, and these two elements interfit, and may provide for a combined rotation that is transferred to the thrust plate 66 and the electric contact element 67. The spring assembly 2732 comprises an upper spring surface 2728, a spring bellow connector 2729, and a lower spring surface 2738. Seal element 2751 seals the fluid passage between the upper spring surface 2728 and the thrust plate 66. Seal element 2753 seals the fluid passage between the lower spring surface 2738 and the contact housing 2765.

Electricity is supplied to the electric contact element 67 that contacts the seed layer on a substrate to provide a desired voltage between the anode 16 and the seed layer on the substrate to effect the electroplating. Electricity is supplied from the controller 222 to the electric contact element 67 via the electric feed through 2767, a conductor 2733, and the contact housing 2765. The electric contact element 67 is in physical, and electrical, contact with the seed layer on the substrate. The shaft 2470, the contact housing 2765, the spring assembly 2732, the thrust plate 66, the electric contact element 67, the rotary mount 2799, and the substrate 22 secured between the thrust plate 66 and the electric contact element 67 all rotate as a unit about a longitudinal axis of the head assembly 2410. The head rotation motor 2706 provides the motive force to rotate the above elements about its vertical axis.

A vacuum is controllably supplied to portions of the rotatable head assembly 2410 by the pneumatic feed through 2773 to control the position of the thrust plate relative to the electric contact element 67. The pneumatic feed through 2773 that supplies the vacuum comprises a controllable vacuum supply 2790, a sleeve member 2792, a fluid conduit 2794, a circumferential groove 2795, a fluid aperture 2796, and a fluid passage 2798. The sleeve member 2792 may be a distinct member, or a portion of the shaft as shown in FIG. 27. The circumferential groove 2795 extends within the sleeve member 2792 about the circumference of the shaft 2470. The pneumatic feed through supplies a vacuum to a pressure reservoir 2740. The pressure reservoir is configured to maintain either positive air pressure or vacuum, depending upon the configuration of the head assembly 2410. The fluid aperture 2796 is in fluid communication with the circumferential groove. The fluid aperture 2796 extends axially through the shaft 2470 from the circumferential groove 2795 to the bottom of the shaft 2470. The fluid passage 2798 extends through the contact housing 2765. The fluid aperture 2796 at the bottom of the shaft is in fluid communication with the fluid passage 2798. The inner surface of the sleeve member 2792 has a small clearance, e.g. about 0.0002 inch, with the outer surface of the shaft 2470 to allow relative rotation between these two members.

A vacuum is applied from the vacuum supply 2790 via the fluid conduit 2794 to the inner surface of the sleeve member 2792 and the circumferential groove 2795. The vacuum is applied from the fluid aperture 2796 to the fluid passsage 2798, and the pressure reservoir 2740. Due to the tight clearance between the sleeve member 2792 and the shaft 2470, a vacuum applied to the inner surface of the sleeve member 2792 passes via the circumferential groove 2795 to the fluid aperture 2796. The tight clearance limits air entering between the sleeve member 2792 and the outer surface of the shaft 2470. Therefore, the vacuum applied from the controllable vacuum supply 2790 extends to the pressure reservoir. A vacuum within the shaft 2470 passes through the fluid passage 2798 to a pressure reservoir 2740 formed between the spring assembly 2732 and the contact housing 2765. The vacuum applied by the controllable vacuum supply 2790 thereby controls the vacuum in the pressure reservoir 2740.

The spring bellow connector 2729 combines aspects of a spring and a bellows. The spring bias connector 2729 is attached between the thrust plate 66 and the contact housing 2765. The spring bellows connector 2729 limits fluid flow between the thrust plate 66 and the electric contact element 67. The spring bellows connector 2729 additionally exerts a spring force when axially displaced, either compressed or extended, from its relaxed shape. The bias of the spring bellow connector 2729 is used to position the thrust plate 66 relative to the electric contact element 67. Any suitable type of bellows or baffle member that has a spring constant may be used as spring bellow connector 2729. Alternatively, separate spring and bellows members may be used as the spring bellow connector 2729. The upper spring surface 2728 is annular shaped and is sealably connected to the thrust plate 66. The lower spring surface 2738 is sealably connected to the contact housing 2765. A pressure reservoir 2740 is defined in the annulus between the contact housing 2765 and the spring assembly 2732. In one embodiment, the thrust plate is normally pressed against the backside of the substrate by the spring tension exerted by the spring bellow connector 2729. Application of the vacuum within the pressure chamber 2740 raises spring bellows connector 2729, and thereby also raises the thrust plate 66.

The thrust plate 66 is displaced to a raised position when a robot, not shown, is loading or unloading a substrate 22 onto the electric contact element 67. Following insertion by the robot, the substrate 22 rests upon the contact element such that the periphery of the plating surface of the substrate 22 rests upon the contact element. The thrust plate 66 is then lowered firmly against the upper surface of the substrate 22 to ensure a snug contact between the plating surface of the substrate 22 and the electric contact element 67. Electricity can be applied from the controller 222 to the seed layer on the substrate 22.

The substrate holder assembly 2450 is configured to hold a substrate 22 in a secured position such that the substrate can be moved between the exchange, dry, and process positions. The thrust plate 66 can also be biased downwardly to secure a substrate 22 against the electric contact element 67. The thrust plate 66 can be biased upward to provide a space between the thrust plate 66 and the electric contact element 67 through which a substrate can be inserted by a robot device. In the embodiment shown in FIG. 27, upward bias to the thrust plate is provided by a vacuum created within pressure reservoir 2740 by the controllable vacuum supply 2790. The vacuum in the pressure reservoir 2740 causes the upper spring surface 2728, the remainder of the spring assembly 2732, and the attached thrust plate 66 to be displaced upwardly.

Reducing the vacuum from the controllable vacuum supply 2790 allows the spring bellow connector 2729 to return to its normal tensioned position by which the upper spring surface 2728 biases the attached thrust plate 66 into secure contact with a substrate 22 positioned on the electric contact element 67. This physical biasing of the substrate against the electric contact element 67 is sufficient to enhance the electric contact between the electric contact element 67 and the seed layer on the substrate 22. The electric contact element 67 extends about the periphery of the seed layer on a substrate inserted in the substrate holder assembly, and is electrically biased relative to the anode assembly 474 shown in the embodiment of FIG. 6 to effect metal deposition on the seed layer. The thrust plate 66, the electric contact element 67, the spring bellow connector 2729, and a substrate inserted on the electric contact element all rotate relative to the fluid shield 2720. The fluid shield 2720 remains fixed to the shaft shield 2763 and does not rotate.

The head rotation motor 2706 is mounted within, and at least partially extends through, the inner circumference of the hollow head rotation housing 2760 and is connected to the shaft 2470. The hollow coil segment 2775 is mounted to, and remains substantially stationary relative to, the inside of the hollow head rotation housing 2760. The shaft 2470 includes a magnet portion 2777 that can be rotated about a vertical axis. The magnet portion 2777 is physically disposed within the hollow portion of the hollow coil segment 2775. The hollow coil segment 2775 induces rotation in the magnet portion 2777 and the connected shaft 2470. Bearings 2785 are provided between shaft shield 2763 and the shaft 2470 to limit lateral travel of the shaft 2470 during rotation about a vertical axis. The output of the shaft 2470, at the lower end of the shaft, provides rotary motion to certain portions of the substrate holder assembly 2450 including a thrust plate 66 and a substrate 22 held between the thrust plate and the electric contact element 67, as described below. The head rotation motor 2706 may be of the type that produces output rotation in the range from, for example, 0 RPM to 2500 RPM under the influence of the controller 222.

The fluid shield 2720 is optional, and when used it may be disposed about the periphery of, and preferably spaced from, the substrate holder assembly 2450. The fluid shield contains electrolyte solution or other matter that may be removed from the substrate or substrate holder assembly by centrifugal rotation of the substrate holder assembly 2450 on other adjacent equipment.

3. Fluid Effects of Tilting a Substrate Upon Immersion

One technique that improves the uniformity of plating involves limiting the formation of air bubbles or pockets that may contact the seed layer on the substrate. The present system limits air bubbles or air bridges being trapped between the electrolyte solution and the substrate during the immersion of the substrate into the electrolyte solution. Air bubbles or air bridges in the electrolyte solution may cause pitting, tarnishing, deformations, and non-uniformity of the deposited layer. If present for a sufficient time, an air bubble or air bridge will limit the metal ions in the electrolyte solution from depositing on the substrate, thereby creating a void on the substrate.

One technique that minimizes the chance of air bubbles getting trapped by the substrate and/or the substrate holder assembly is to tilt the substrate/substrate holder assembly from horizontal as the substrate is immersed into the electrolyte solution. A very thin boundary layer of the electrolyte solution will cover the substrate and the seed layer formed thereon. Air bubbles that are proximate the substrate will flow upwardly along the boundary layer as the substrate is tilted at an angle from horizontal and disposed in the solution. The tendency of the air bubbles to flow along the boundary layer without contacting any part of the substrate increases as the angle of tilt increases.

Figure 34:
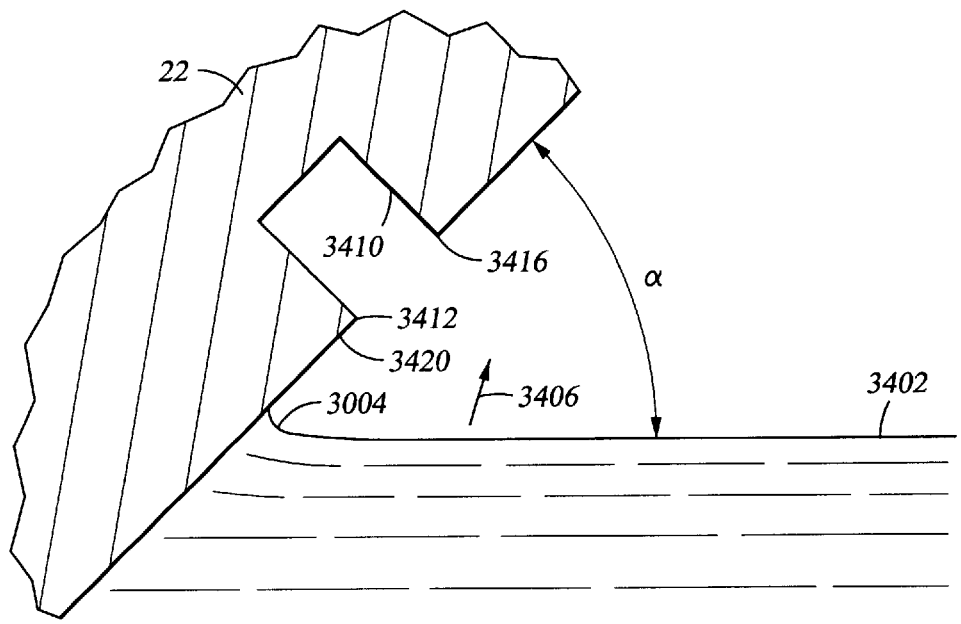
FIG. 34 shows one embodiment of a substrate having a feature being lowered into an electrolyte solution, in which a level of electrolyte solution is below the level of a feature.
Figure 35:
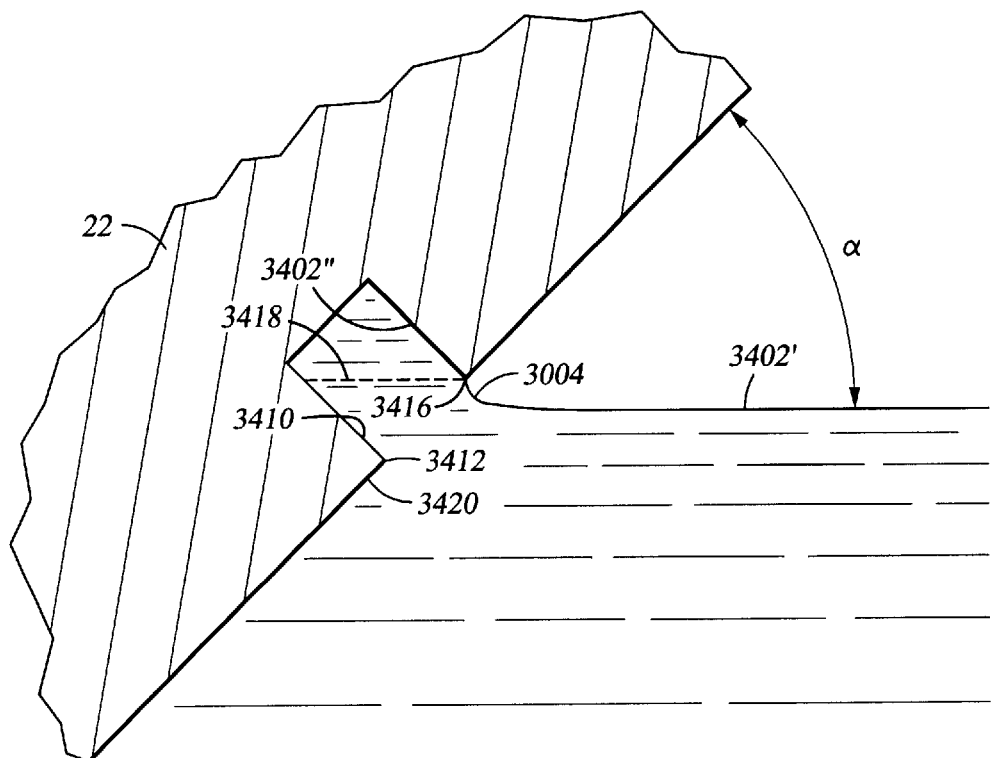
FIG. 35 shows the lowering of the substrate into the electrolyte solution as shown in FIG. 34, in which the level of the electrolyte solution is above to the level of the feature.

FIGS. 34 and 35 shows a progression of steps as a substrate, held by a substrate holder assembly, is immersed into the electrolyte solution at an angle α from horizontal. These figures illustrate how features are more completely filled by electrolyte solution, and the air bubbles within the features are more completely removed from the features. The substrate 22 is lowered into the electrolyte solution as shown in FIG. 25 by the downward displacement of the lift guide 2466 along the mounting slide 2460. To explain the mechanism by which the substrate 22 is immersed into the electrolyte solution, the fluid-level of the electrolyte solution is considered to be moving upward relative to the substrate in a direction indicated by arrow 3406 from the level 3402 shown in FIG. 34 to the level 3402' shown in FIG. 35. An exemplary feature 3410, such as a via, a trench, an electric contact, etc. is formed in the surface of the substrate 22. The width of such features in modern semiconductor processing is typically measured in the microns.

The "flow" of the electrolyte solution across the substrate 22, when the tilt angle α of the substrate is greater than 0 degrees, is enhanced by the travel of the meniscus 3004 across the seed layer on the substrate 22. The meniscus 3004 is the convex upper surface of the liquid that contacts the surface of an adjacent solid material. The meniscus is caused by surface tension. For instance, a meniscus is formed in a glass containing water as the water surface touches the glass in which it is contained. The meniscus 3004 enhances the displacement of air bubbles from within the features as the substrate is immersed in the electrolyte solution. Increasing the tilt angle α will also allow the meniscus to be more effective in displacing air bubbles and air pockets from within feature 3410 on the substrate by utilizing the displacing action of the meniscus provided by surface tension. The surface tension associated with the meniscus acts to draw the electrolyte solution along the field, and therefore displace air bubbles or pockets contained on a field surface 3410 of the substrate when the tilt angle α of the substrate is angled from horizontal as the electrolyte solution rises from level 3402 as indicated by arrow 34.

As the level of the electrolyte solution rises from level 3402 in FIG. 34 to a level 3402' shown in FIG. 35, the meniscus 3004 rises above the lower level 3412 of the feature. Surface tension is an important mechanism that is used to fill feature 3410 with electrolyte solution. Without surface tension, as the level of the electrolyte solution rises to a highest opening point 3416 of feature 3410, the level of the electrolyte solution would horizontally extend as shown by dotted line 3418. Without surface tension, an air bubble would be formed in the space above the dotted line 3418. In actuality, surface tension draws electrolyte solution into the features as the meniscus moves upwardly past the opening of the feature. The molecular fluid attraction associated with surface tension "draws" the electrolyte solution into, and completely fills, the feature to the upper limits indicated by 3402". In so doing, the electrolyte meniscus displaces any air that would otherwise be trapped within the feature. The electrolyte solution is drawn into the feature more quickly as the tilt angle α, ranging from 0 to 90 degrees, increases. The reason that air is displaced more quickly by the electrolyte solution is that the volume of trapped air, i.e. above line 3418, decreases as the tilt angle α is increased, and most particularly as α exceeds 45 degrees.

More time is required for the electrolyte solution to displace the air bubbles contained in the features if the substrate is immersed at a lesser tilt angle α than a greater tilt angle, e.g., less than 45 degrees from horizontal compared to greater than 45 degrees. For example, the electric contact element of the substrate holder assembly and the substrate together form an inverted concave area. The area of trapped air in this inverted-concave area decreases as the angle of the substrate increases. As the substrate in the substrate holder assembly approaches, but is not equal to, horizontal, the substrate holder assembly has to be angularly tilted by the substrate holder system 14 at a slower angular rate to effectively remove the air bridges and air bubbles. This slower angular tilt rate is necessary to adequately fill the feature with electrolyte solution. The actual angular tilt rate of the substrate holder system is a function of such considerations as the chemical components of the electrolyte solution, the surface of the substrate, the configuration and surface of the substrate and the substrate holder assembly.

The substrate holder assembly 2450 functions to position the substrate seed layer relative to the electrolyte solution during start-up, processing, and removal of the substrate. The operation of the substrate holder system 14, including the application of a vacuum to pressure reservoir 2740 to extend or retract the thrust plate 66, the operation and angular velocity of the motor 2706, the position of the pivot joint 2459 that controls the tilt of the substrate, and other such mechanical displacements are controlled by the controller 222. One embodiment of the progression of the substrate holder system 14 during the metal deposition process is shown in FIGS. 28A to 28H. One embodiment of method 2900 shown in FIG. 29 is performed by the controller 222 to perform the progression shown in FIGS. 28A to 28H.

Figure 28A:
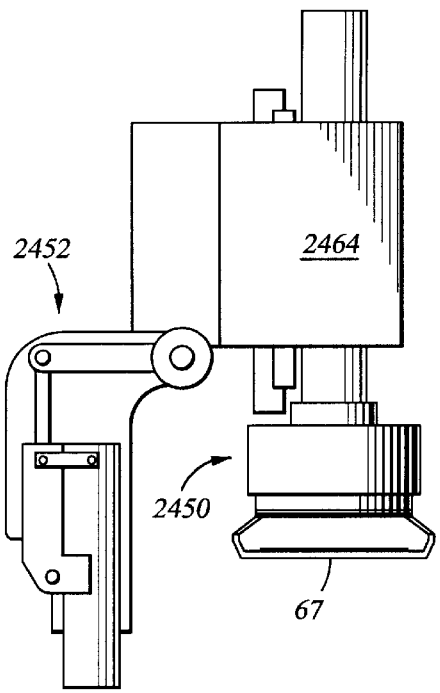
FIGS. 28A to 28H, is a progression of side views of the substrate holder system during immersion of a seed layer on a substrate into the electrolyte solution contained in the electrolyte cell.
Figure 28B:
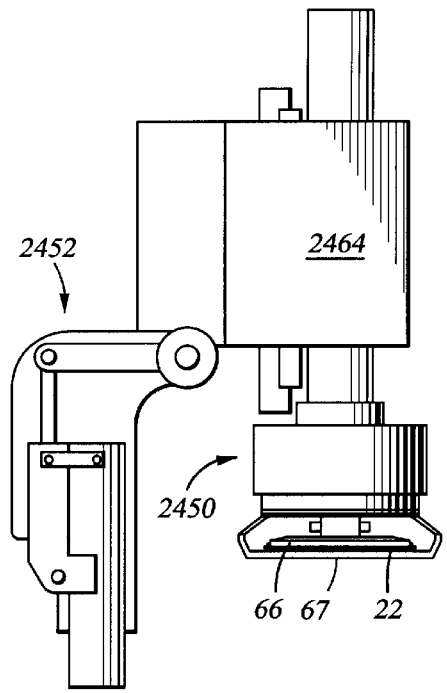
Figure 28C:
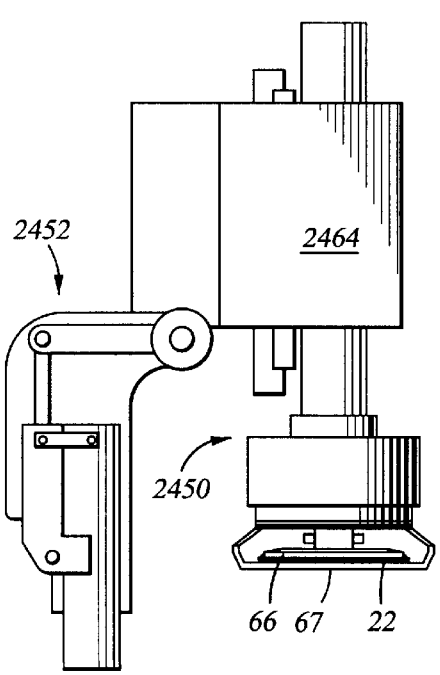
Figure 28D:
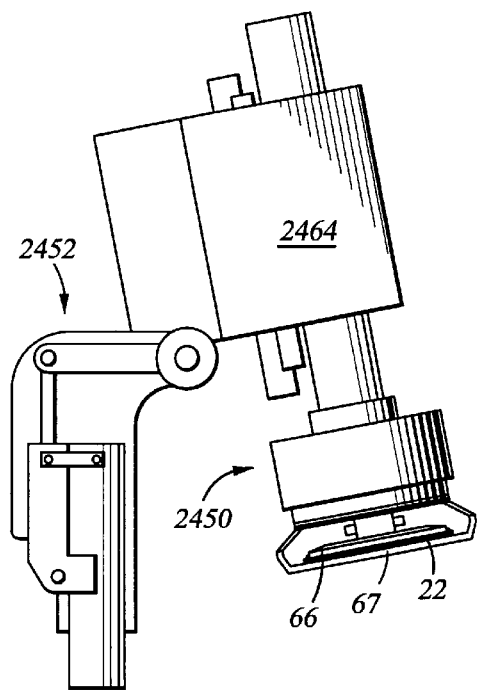
Figure 28E:
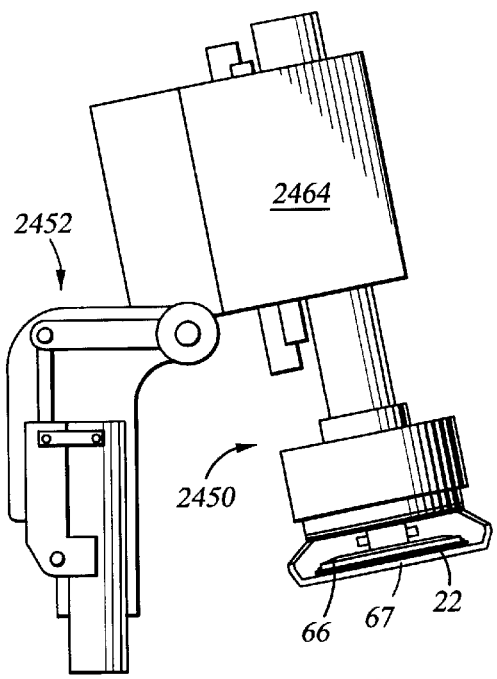
Figure 28F:
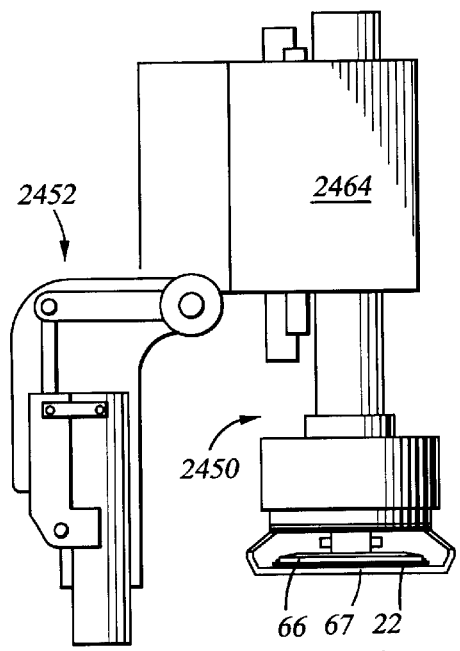
Figure 28G:
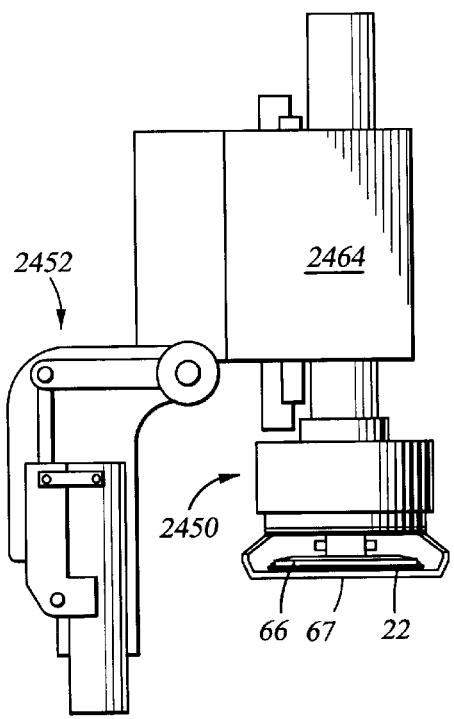
Figure 28H:
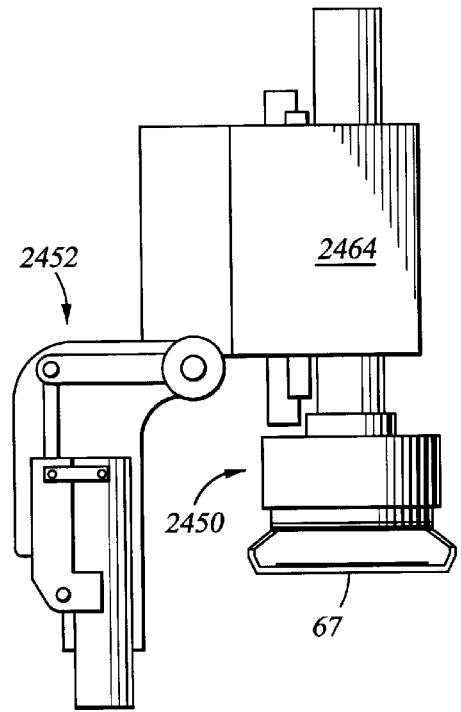
Figure 29:
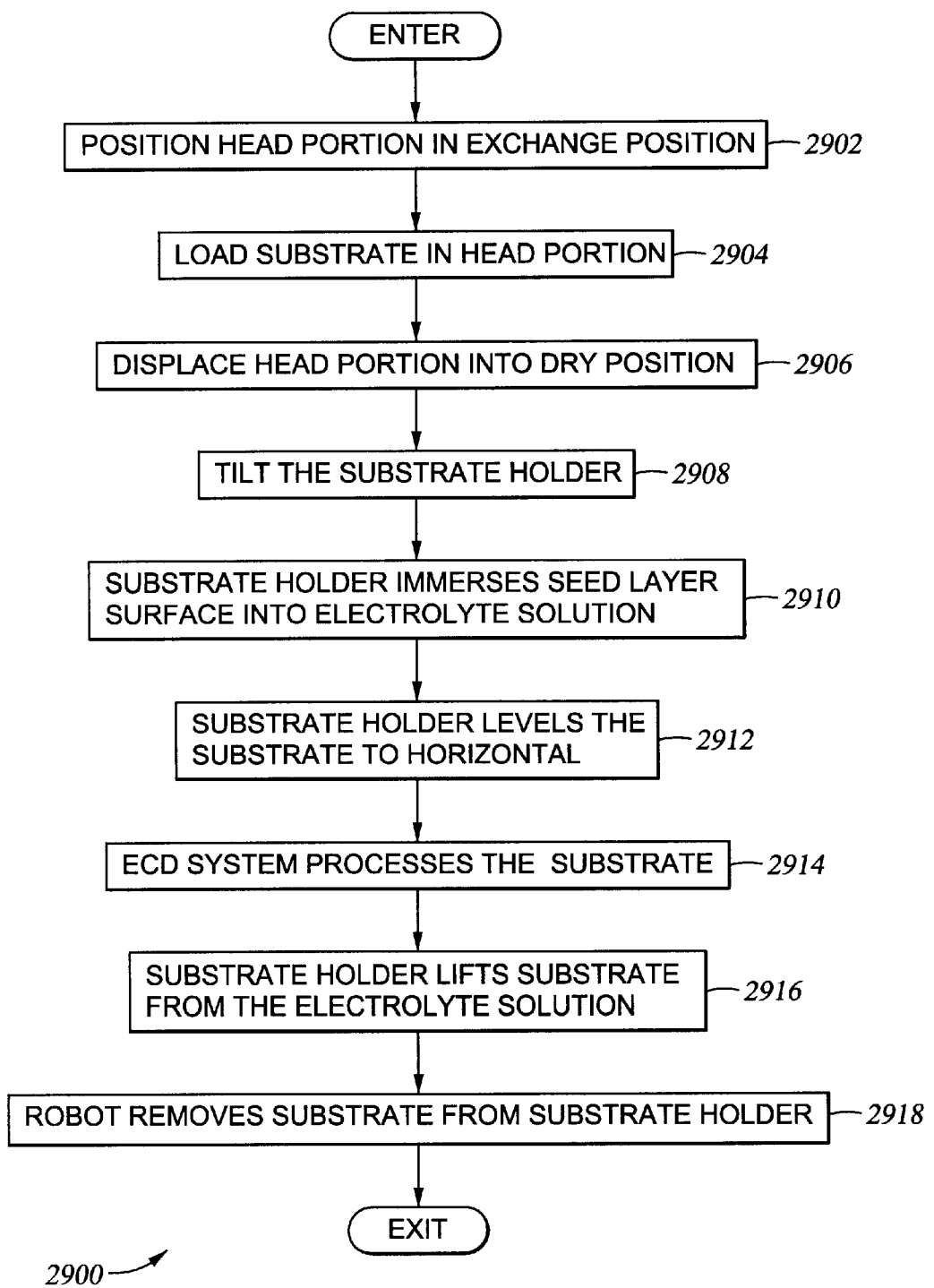
FIG. 29 is one embodiment of a method performed by the controller of FIG. 27 in performing the progression shown in FIG. 28.

The progression of the substrate holder system 14 shown in FIGS. 28A to 28H is to be read in conjunction with the method 2900 shown in FIG. 29. During the progression of FIGS. 28A to 28H, generally a substrate is inserted into the substrate holder assembly, the substrate is immersed into the electrolyte solution, the substrate is processed, the substrate is removed from the electrolyte solution, and the substrate is removed from the substrate holder assembly.

FIG. 28A, and block 2902 in FIG. 29, show the substrate holder system 14 being positioned in an exchange position in which the thrust plate 66 of the substrate holder assembly is retracted into a raised position by the creation of a vacuum in the pressure reservoir 2740 shown in FIG. 27. The substrate holder system 14 is positioned in its exchange position to allow a robot blade, not shown, that is holding a substrate 22 to insert a substrate between the electric contact element 67 and the thrust plate 66.

As shown in FIG. 28B, and block 2904 in FIG. 29, a robot displaces the substrate 22 between the thrust plate 66 and the electric contact element 67 as the substrate 22 is loaded on the contact element. The thrust plate 66 is then lowered to exert a bias against the backside to secure the substrate 22, and provide a sufficient electric contact between the plating surface and the contact element. The thrust plate is lowered with such force to secure, but not damage, the substrate 22. The lowering of the thrust plate is accomplished by decreasing the vacuum applied within the pressure reservoir 2740 shown in FIG. 27 to allow the spring bellow connector 2729 to return downwardly to its pre-set position. During the remaining substrate 22 processing, the thrust plate remains in the lowered biased position until the thrust plate in the substrate holder assembly is moved to the exchange position as indicated by FIG. 28G. In those embodiments of substrate holder system 14 that the substrate can be rotated, the substrate holder system starts angular rotation of the substrate in FIG. 28B about a vertical axis passing through the substrate, and continues through FIG. 28G. The velocity of angular rotation may vary through the progression depending upon whether the substrate is being immersed in the electrolyte solution, the substrate is being processed, or the substrate is being removed from the electrolyte solution, or the substrate is being rotated for drying of the substrate by centrifugal force.

FIG. 28C, and block 2906 of FIG. 29, shows the substrate holder assembly 2450 being moved to a dry position as a result of actuation of the head lift portion 2708 in which the lift guide 2466 is translated downward relative to the mounting slide 2460. In the drying position, the substrate holder assembly supports the substrate 22 above the electrolyte solution contained in the electrolyte solution cell 12. The substrate 22 is positioned in the drying position prior to its immersion into the electrolyte solution, and after the substrate has been removed from the electrolyte solution. Positioning the substrate 22 in the drying position is part of a routine such that the substrate 22 can be quickly immersed into the electrolyte solution.

FIG. 28D, and block 2908 in FIG. 29, shows the substrate holder assembly 2450, the rotating actuator 2464, and the head lift portion 2708 all being tilted as a unit by the head assembly frame about the pivot joint 2459. A cantilever arm actuator 2457 that can controllably actuate the shaft 2453 and the connected cantilever arm 2456 to effect tilting of the head assembly frame 2410, that holds the substrate, about the pivot joint 2459. The tilting of the seed layer on the substrate is provided to enhance the immersion of the seed layer into the electrolyte solution, as shown in FIG. 28E.

FIG. 28E, and block 2910 of FIG. 29, shows the immersion of the substrate 22, contained in the head portion 2450, into the electrolyte solution from the dry position. The shaft 2468 is rotated during the immersion of the substrate. During this shaft rotation, the lift guide 2466 is translated downwardly along the mounting slide 2460 to cause downward motion of the head assembly 2410. Concurrently, the head assembly 2410 is rotated downwardly about the pivot joint 2459 to cause tilting of the substrate. The tilting of the substrate 22 so that the substrate is angled from horizontal minimizes the occurrences of air bubbles and air bridges trapped underneath the substrate/substrate holder within the electrolyte solution. This limitation of air bubbles results from the enhanced action of the meniscus 3004 in limiting the number of air bubbles trapped as substrate 22 is lowered into the electrolyte solution, and also lets the air bubbles escape more easily across the tilted substrate face. In addition, spinning of the substrate during immersion minimizes the chance that an air bubble will become attached to an location on the seed layer.

Figure 30:
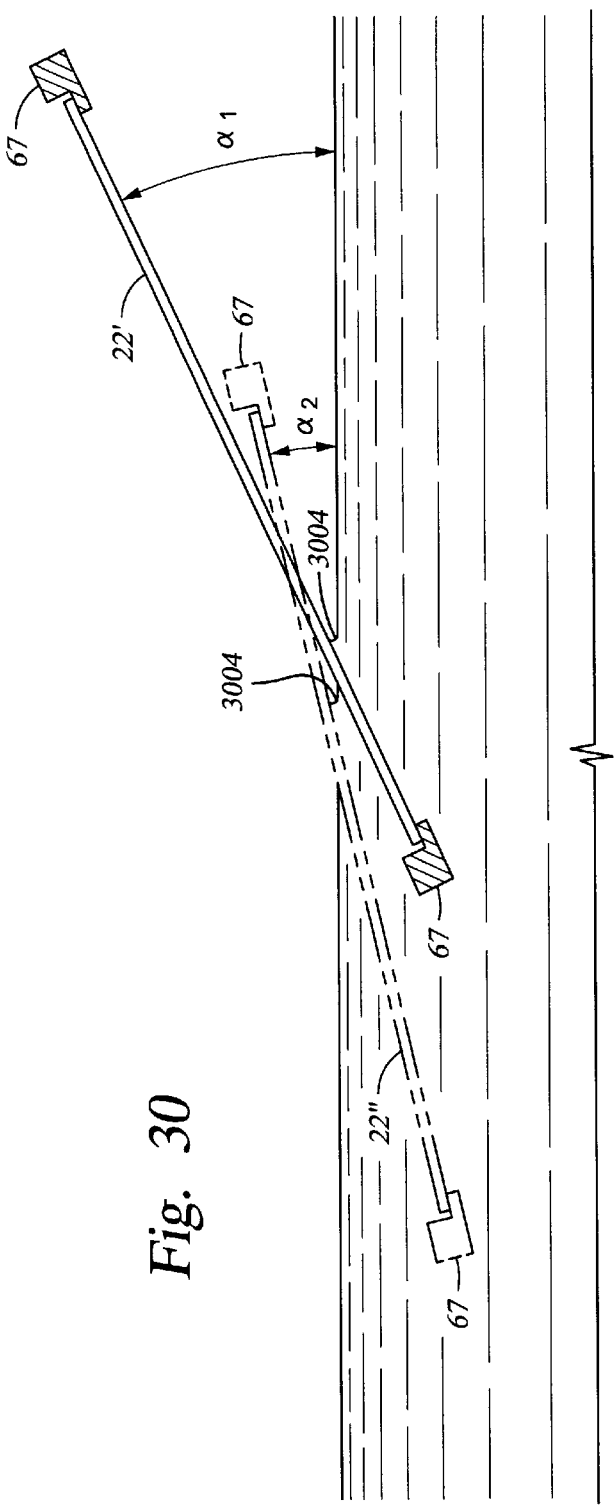
FIG. 30 is a side view of a progression of substrates being inserted into the electrolyte solution.
Figure 31:
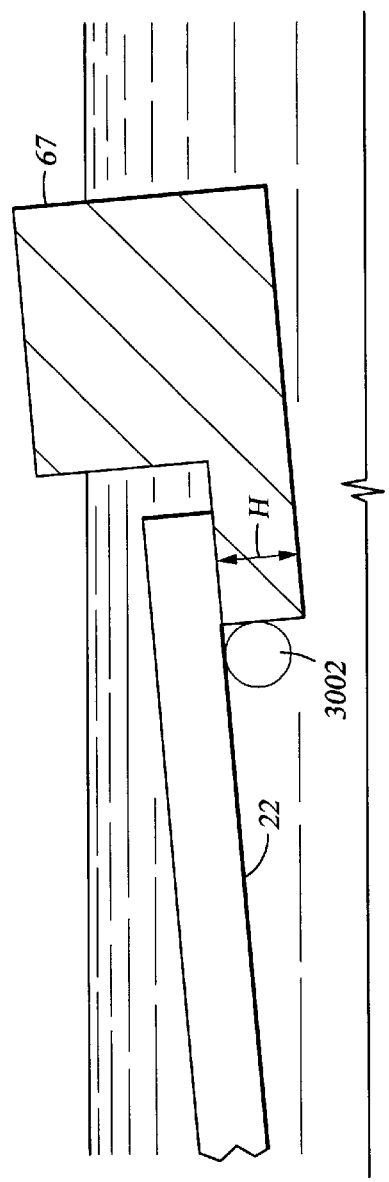
FIG. 31 is a side view of an immersed substrate having air bubbles trapped between the substrate and the substrate holder assembly.
Figure 32:
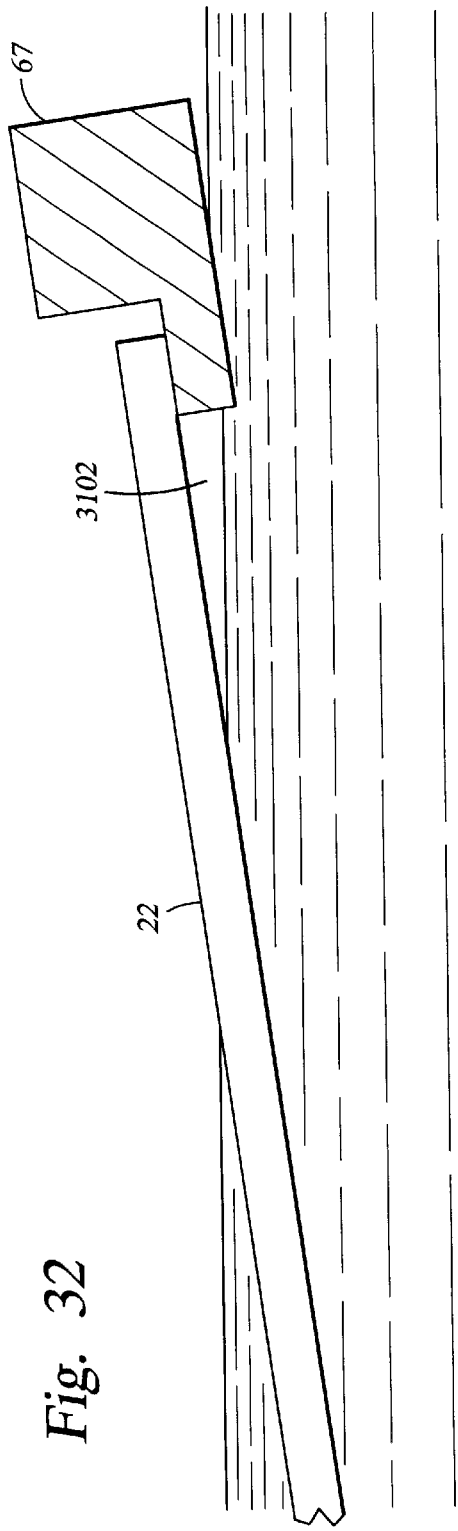
FIG. 32 is a side view of an immersed substrate having an air bridge forming between the substrate and the substrate holder assembly.
Figure 33:
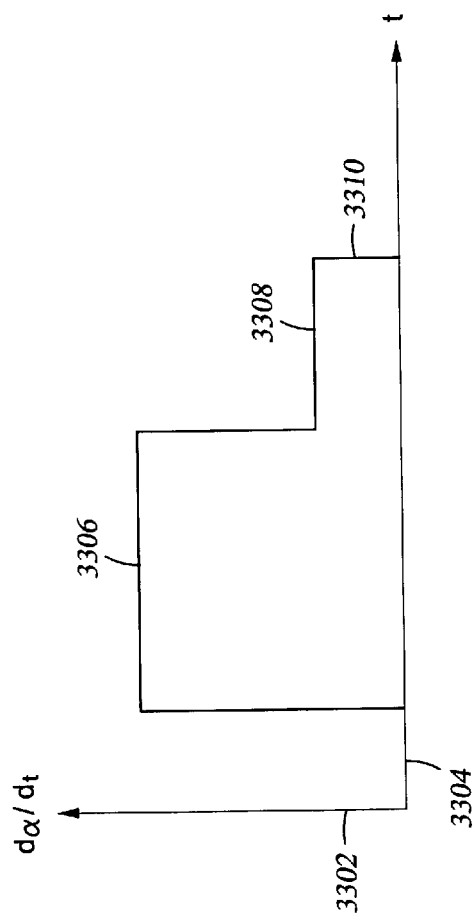
FIG. 33 is a graph showing immersion of a substrate indicating the rate of change of the angle of the substrate as the ordinate versus time as the abscissa.

FIG. 30 shows how the tilt angle α changes as a substrate is being immersed into an electrolyte solution by the substrate holder system 14 between two positions 22 and 22". The electric contact element 67 in FIGS. 30, 31, 32 represent a portion of electric contact element that actually contacts the substrate. Other portions of the electric contact element, similar to as shown in FIG. 27, are not shown for simplicity of display. Substrate 22' is angled at an angle $\alpha_1$ while the substrate 22" is angled at angle $\alpha_2$ from horizontal. The substrate also moves to the left, as the substrate is more completely immersed in the electrolyte solution, between the positions shown as 22' and 22" in the embodiment in FIG. 31, as also reflected in the positions shown in FIGS. 28E and 28F. This lateral motion results from the lateral displacement of the substrate holder assembly 2450 as the rotatably head assembly 2410, shown in the embodiment of FIG. 25, pivots about the pivot joint 2459. Angle $\alpha_1$ is greater than the angle $\alpha_2$, indicating that the substrate holder system rotates the substrate to an angle closer to horizontal as the substrate is immersed deeper into the electrolyte solution. As the substrate 22 is lowered into the electrolyte solution, meniscus 3004 formed between the electrolyte solution and the substrate flows along the substrate seed layer.

FIG. 31 shows the vertical height H of the electric contact element 22. The greater the height H for a given combination of substrate, electric contact element, and electrolyte solution, generally results in a larger the volume of air being trapped under a given substrate if the substrate is immersed in a horizontal or tilted attitude. Therefore, it is desired to limit the height H to reduce the amount and volume of air bubbles trapped in the electrolyte solution under the substrate during immersion.

It is possible to form air bubbles and air bridges between the substrate and the electric contact element 67 upon immersion in the electrolyte solution. The bubble 3002 in FIG. 31 is created when the substrate 22 is immersed within the electrolyte solution too rapidly. Alternatively, when the substrate 22 is immersed within the electrolyte solution at too slow a rate, as illustrated in FIG. 32, then air bridge 3102 forms between the substrate 22 and the electric contact element 67. When substrate 22 is immersed in the electrolyte solution at the suitable rate, neither a bubble 3002 nor an air bridge 3102 is formed between the substrate 22 and the electric contact element 67 within the electrolyte solution.

Graph 33 plots an ordinate 3302 dα/dt that represent the rate that the substrate tilt angle α is changed as a function of time after initial immersion of the substrate on the abscissa 3304. As the substrate approaches immersion, the tilt angle α of the substrate is typically 45 degrees, or on some embodiments, approaches 90 degrees. The substrate tilt angle α is controlled by the amount that cantilever arm actuator 2457 pivots head assembly 2410 about pivot joint 2459. The value of dα/dt represented by 3306 shows the rapid rate at which the substrate tilt angle α changes toward the horizontal as the periphery of the substrate is initially immersed into the electrolyte solution. As immersion continues, the rate of tilt angle α change is reduced as represented by the value of 3308. Since the substrate is closer to horizontal, the substrate is to be immersed into the electrolyte solution at a slower rate of dα/dt to enable the electrolyte solution to displace the air from the features. During this period, the meniscus 3004, i.e. where the electrolyte solution contacts the substrate, slowly sweeps the seed layer on the substrate face, and displaces the air from the features within the substrate face. This sweeping action by the meniscus minimizes either the formation of air bubbles 3002 or air bridges 3102 between the substrate 22 and the electric contact element 67, and limits the formation of air bubbles within the features on the substrate seed layer. The preferred dα/dt rate is a function of such factors as the tilt angle α, the composition of the electrolyte solution, and the surfaces of the substrate 22 and the electric contact element 67. After full immersion of the substrate face, the rate of tilt angle c change becomes zero as represented by 3310 since the substrate is fully immersed and horizontal, and the substrate is in a position to be electroplated. The majority of metal film is deposited on the substrate seed layer during portion 3310. It is important to limit the effect of, and the creation of, air bubbles 3002 or air bridges 3102 during portion 3310.

As shown in FIG. 28F and block 2912 of FIG. 29, the rotating actuator 2464, and the head lift portion 2708 are all angled as a unit by the head assembly frame about the pivot joint 2459 into the process position. When the head portion is in the process position, the substrate 22 is held in a substantially horizontal position within the electrolyte solution. When the head portion 2450 tilts the substrate horizontally into the process position, the entire plating surface of the substrate 22 is immersed in the electrolyte solution.

When the head portion 2450 is processed in the process position shown in block 2914 of FIG. 29, the head portion 2450 supports the substrate 22 in a position where the plating surface is immersed in the electrolyte solution contained in the electrolyte cell. Portions of the head portion 2450 including the contact housing 2765, the thrust plate 66, the electric contact element 67 are rotated between about 0 and about 200 RPM, preferably about 20 to about 40 RPM. The rotation of the substrate 22 provides for a uniform deposition of the metal ions across the plating surface. The rotation of substrate 22 and the rotating portions of head portion 2450 do not create too much turbulence in the electrolyte solution as would be created by excessive angular rotation within the electrolyte solution. The metal ions produced by the reaction between the electrolyte solution and the anode 16 is deposited on the plating surface of the substrate 22 when the substrate holder system 14 is in the process position.

As shown in FIG. 28G and block 2916 of FIG. 29, the head portion 2450 is then displaced by the substrate holder system 14 into the dry position after the processing is performed on the substrate 22. To provide for the displacement between the process position shown in FIG. 28F and the dry position shown in FIG. 28G, lift guide 2466 is translationally displaced upwardly relative to the mounting slide 2460. Additionally, the head assembly 2410 is rotated upwardly about the pivot joint 2459. When the head portion 2450 is in the dry position, the substrate is rotated between about 600 and about 2500 RPM, preferably about 2000 RPM. This rotation effects drying of the substrate 22 by centrifugal action. Alternatively, the substrate 22 can be transported to a separate spin-rinse-dry unit as shown in the embodiment of FIG. 4.

As shown in FIG. 28H and block 2918 of FIG. 29, the head portion 2450 is then raised into the exchange position by the lift guide 2466 being translationally displaced upwardly relative to the mounting slide 2460. When the head portion is in the exchange position, the thrust plate 66 is raised by an amount that is sufficient for a robot to remove the substrate 22 from the substrate holder assembly. Following the raising of the thrust pad, a first robot blade, not shown, is typically inserted between the substrate 22 and the thrust plate to remove a first processed substrate. Another robot blade inserts a new substrate to be processed on to the electric contact element. The thrust pad is then lowered to secure the substrate in position within the substrate holder assembly. The metal deposition process depicted in FIGS. 28A to 28H is then performed on the new substrate.

Figure 36:
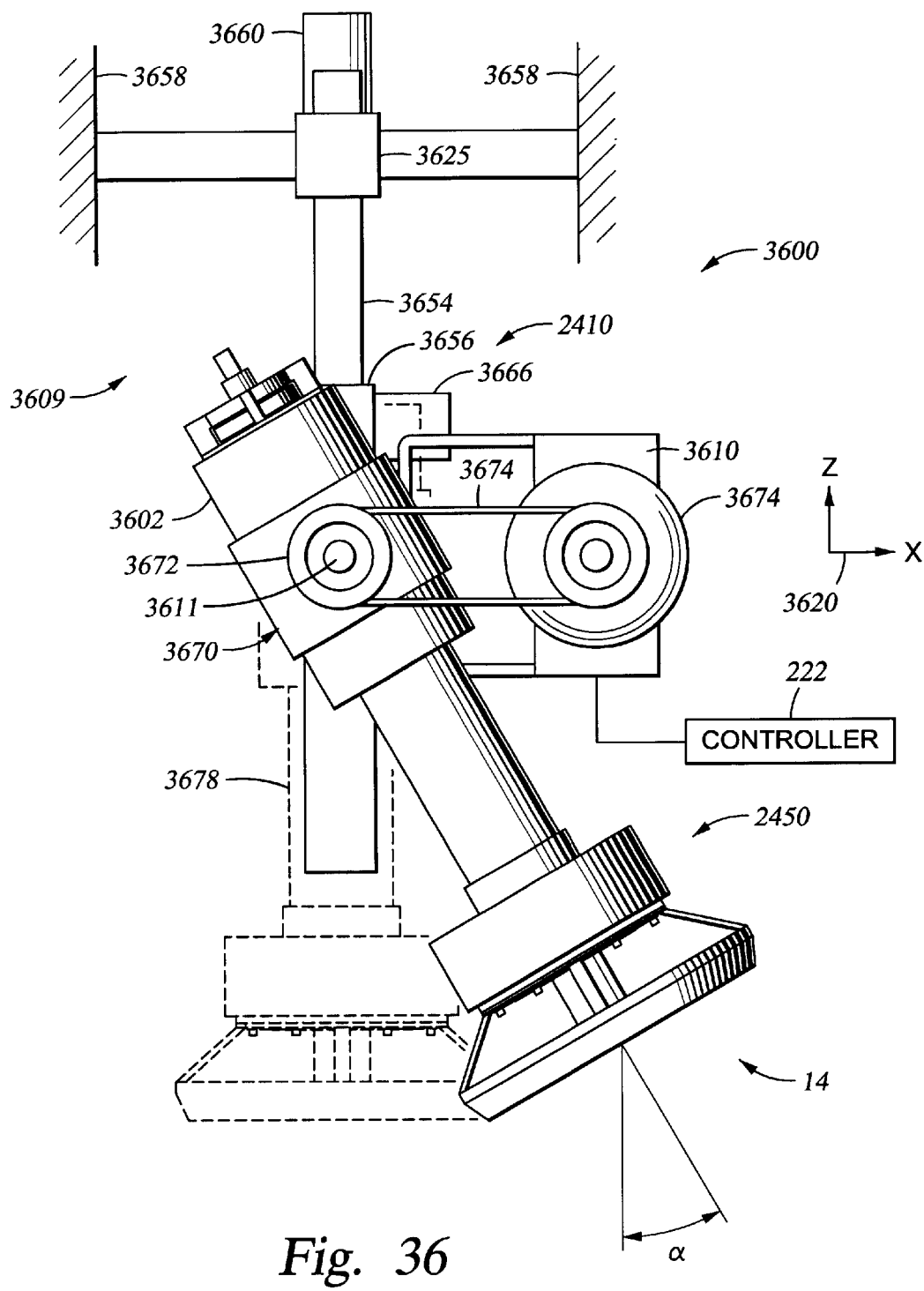
FIG. 36 shows another embodiment of substrate holder system.

While the above provides one embodiment of a substrate holder system 14 that can be used to tilt the substrate from horizontal during immersion of the substrate into the electrolyte solution, any device that can secure the substrate in a tilted position upon immersion can be used. For example, FIG. 36 shows another embodiment of substrate holder system 14 that comprises a support mount 3609, a support 3610, a pivot joint 3611, the rotatable head actuator 2410, and a controllable adjustable member 3602. In one embodiment, the rotatable head actuator 2410 is configured as described in FIG. 27.

The support mount 3609 comprises a lateral track 3650, a lateral follower 3652, a vertical track 3654, and a vertical follower 3656. The lateral track 3650 is rigidly secured at one, or both ends to a physically grounded surface 3658. The lateral follower 3652 is constrained to follow the lateral track 3650 by a tight-fitting connection, a plurality of wheel followers, an air cushion, or another similar sliding connection. An actuator 3660, that is controlled by the controller 222 shown in FIG. 3, controllably displaces the lateral follower 3652 along the lateral track 3650.

The vertical track 3654 is rigidly affixed to the lateral follower 3652 by welding, bolts, rivits, or other known connectors such that the vertical track 3654 follows the lateral motion of the lateral follower 3652. The vertical follower 3656 is constrained to follow the vertical track 3654 by a tight-fitting connection, a plurality of wheel followers, an air cushion, or another similar sliding connection. An actuator 3666, that is controlled by the controller 222, controllably displaces the vertical follower 3656 along the vertical track 3650.

The head assembly 2410 is pivotally connected to the vertical follower 3656 by the pivot joint 3611. The pivot joint 3611 is actuated by a pivot actuator 3670 that includes a pivot joint follower wheel 3672, a pivot joint drive wheel 3674, and a coupling belt 3676. The coupling belt 3676 transfers rotational motive force from the pivot joint drive wheel 3674 to the pivot joint follower wheel 3672 to rotate the head assembly between the tilted position shown in solid in FIG. 27, and the upright position shown by dotted lines 3678. The pivot joint drive wheel 3674 is driven by an actuator such as a rotary stepper motor, a drive motor, or any known type of rotational motor.

The support mount 3609 is thus able to displace the head assembly 2410 in three directions. First, displacing the lateral follower 3652 relative to the lateral track 3650 displaces the head assembly 2410 in the X-direction shown in the coordinate axis 3620. Second, displacing the vertical follower 3656 relative to the vertical track 3654 displaces the head assembly 2410 in the Z-direction shown in the coordinate axis 3620. Third, pivoting the pivot joint follower wheel 3672 tilts the head assembly in a direction indicated by arrow 3680.

In another embodiment, the pivot actuator 3670 can be provided by a piston or linear drive member extending between an offset link connected, not shown, to the pivot joint 3611 and the support 3610. In this configuration, the linear actuation of the piston or linear drive member is converted into rotational motion of the head assembly 2410 about pivot joint 3611 by the offset of the offset link.

The support mount 3609 can raise, lower, or laterally displace the head actuator 2410 while being maintained in a horizontal orientation. A robot device, not shown, can also be used to provide motion to the support 3610 in the X-direction and the Z-direction as shown by coordinate axis 3620.

To immerse the head assembly 2410 into the electrolyte solution in the process cell, the substrate is tilted at the tilt angle a by the pivot actuator 3670. The support may be translated laterally in the X direction to align the head assembly with the process cell by the translation of the robot device that translates the support 3610. The support 3610 is then displaced downward by the actuation of the actuator 3666 on the vertical follower 3656 of the support mount 3609 to immerse the substrate into the electrolyte solution contained in the process cell. The coordinated motion of the pivot actuator 3670 and the actuator 3666 is controlled by the controller 222 in a manner to limit any portion of the head assembly 2410 from contacting any portion of the process cell. The head assembly 2410 is then moved into the horizontal level position ($\alpha$=0) by displacement of the pivot actuator 3670 under the control of the controller 222. During the leveling of the head assembly, the head assembly may have to be concurrently aligned with the process cell by the actuator 3666 displacing the head assembly 2410 in the X direction. The head assembly is then removed from the process cell by displacement of the actuator 3666.

While the foregoing is directed to the preferred embodiment of the present invention, other and further embodiments of the invention may be devised without departing from the basic scope thereof.

What is claimed is:

1. A method of immersing a plating surface formed on a substrate into electrolyte solution, the method comprising:

positioning the substrate at an angle from horizontal above the electrolyte solution;

vertically displacing the substrate to immerse the plating surface into the electrolyte solution while maintaining the substrate at an angle from horizontal; and positioning the substrate substantially horizontal prior to plating.

2. The method of claim 1, wherein said substrate is rotated during immersion to limit the contact of air bubbles with any one location on the substrate.

3. The method of claim 1, wherein the angle from horizontal is altered toward horizontal during said vertical displacing.

4. A computer readable medium containing a software routine that, when executed by a processor, performs a method comprising:

positioning a substrate at an angle from horizontal above an electrolyte solution; and vertically displacing a plating surface formed on the substrate into the electrolyte solution while maintaining the substrate at an angle from horizontal.

5. The computer readable medium of claim 4, wherein the method further comprises rotating the substrate to limit the contact of air bubbles with any one location on the substrate.

6. The computer readable medium of claim 4, wherein the angle from horizontal is altered toward horizontal during said vertical displacing.

7. A method of immersing a plating surface formed on a substrate into electrolyte solution, the method comprising:

positioning the substrate at an angle from horizontal above the electrolyte solution;

maintaining electrolyte solution within an electrolyte solution cell; and vertically displacing the substrate to immerse the plating surface into the electrolyte solution while maintaining the substrate at an angle from horizontal, wherein at least a portion of seed layer on the substrate contacts the electrolyte solution during said immersion.

8. The method of claim 7, wherein the angle from horizontal is altered toward horizontal during said vertical displacing.

9. An apparatus for electroplating comprising:

a cell;

a substrate holder assembly configured to hold a substrate either in a substantially horizontal position or a tilted position; and an actuator that is configured to displace the substrate holder assembly in the x-direction, the z-direction, and tilt the substrate holder.

10. The apparatus of claim 9, wherein the actuator is configured to vertically displace the substrate into the cell wherein the substrate is tilted in a tilted position.

11. The apparatus of claim 10, wherein the actuator is configured to tilt the substrate from its tilted position to a substantially horizontal position after the substrate has been vertically displaced into the cell.

12. The apparatus of claim 11, wherein the cell is an electrolyte cell, wherein the electrolyte cell contains electrolyte solution, and wherein the substrate is immersed from its tilted position to its level position as the substrate is immersed into the electrolyte solution.

13. The apparatus of claim 9, wherein the cell is an electrolyte cell, wherein the electrolyte cell contains electrolyte solution.

14. The apparatus of claim 13, wherein air bubbles are contained in said electrolyte solution, wherein said air bubbles are limited from maintaining contact with any one location on said substrate as the substrate is vertically immersed into the electrolyte cell.

15. A method of driving a meniscus formed by electrolyte solution across a surface of a substrate comprising enhancing the interaction between the electrolyte solution meniscus and the surface as the substrate is immersed into the electrolyte solution.

16. The method of claim 15, further comprising increasing the angle at which the meniscus intersects the surface of the substrate.

17. The method of claim 16, wherein the surface of the substrate that the meniscus intersects is a field.

18. The method of claim 16, wherein the surface of the substrate that the meniscus intersects is a feature.

19. The method of claim 15, wherein the enhancing the interaction between the meniscus and the surface comprises increasing the force that removes air from the surface of the substrate.

20. The method of claim 19, wherein the surface of the substrate that the meniscus intersects is a field.

21. The method of claim 19, wherein the surface of the substrate that the meniscus intersects is a feature.

22. An apparatus for electroplating, comprising:

a plating cell configured to contain an electrolyte therein;

a substrate holder assembly configured to hold a substrate having a plating surface; and a controller programmed to control immersion of the plating surface into the electrolyte by positioning the substrate at an angle from horizontal above the electrolyte and vertically displacing the plating surface into the electrolyte while maintaining the substrate at an angle from horizontal.

23. The apparatus of claim 22, wherein the substrate is rotated to limit the contact of air bubbles with any one location on the substrate.

24. The apparatus of claim 22, wherein the angle from horizontal is altered toward horizontal during vertical displacement.

25. An apparatus for electroplating comprising:

a cell;

a substrate holder assembly configured to hold a substrate in one of a substantially horizontal position and a tilted position; and an actuator configured to displace the substrate holder assembly in one of an x-direction and a z-direction, and to vertically displace the substrate into the cell in the tilted position.

26. The apparatus of claim 25, wherein the cell is an electrolyte cell containing an electrolyte solution, and wherein the actuator is configured to displace the substrate from the tilted position to the substantially horizontal position as the substrate is being immersed into the electrolyte solution.

27. A method of immersing a substrate into an electrolyte solution, the method comprising:

positioning the substrate at an angle from horizontal above the electrolyte solution; and vertically displacing the substrate to immerse a production surface of the substrate into the electrolyte solution while maintaining the substrate at the angle from horizontal.

28. The method of claim 27, wherein the angle from horizontal is altered toward horizontal during the vertically displacement step.

* * * * *

UNITED STATES PATENT AND TRADEMARK OFFICE
CERTIFICATE OF CORRECTION

PATENT NO. : 6,582,578 B1
DATED : June 24, 2003
INVENTOR(S) : Dordi et al.

It is certified that error appears in the above-identified patent and that said Letters Patent is hereby corrected as shown below:

Column 1,
Line 16, please change "CHEMACAL" to -- CHEMICAL --.

Column 5,
Line 37, please change "a 30 sidewall" to -- a sidewall --.
Line 57, please change "fluid 10 through" to -- fluid through --.

Signed and Sealed this

Thirtieth Day of December, 2003

JAMES E. ROGAN
*Director of the United States Patent and Trademark Office*